United States Patent [19]
Takahashi

[11] Patent Number: 6,040,599
[45] Date of Patent: *Mar. 21, 2000

[54] INSULATED TRENCH SEMICONDUCTOR DEVICE WITH PARTICULAR LAYER STRUCTURE

[75] Inventor: Hideki Takahashi, Tokyo, Japan

[73] Assignee: Mitsubishi Denki Kabushiki Kaisha, Tokyo, Japan

[*] Notice: This patent is subject to a terminal disclaimer.

[21] Appl. No.: 08/721,576

[22] Filed: Sep. 25, 1996

[30] Foreign Application Priority Data

Mar. 12, 1996 [JP] Japan ................................ 8-054656

[51] Int. Cl.⁷ .................... H01L 29/76; H01L 27/108; H01L 29/74
[52] U.S. Cl. .................... 257/330; 257/311; 257/139
[58] Field of Search .................... 257/139, 143, 257/144, 153, 330, 331, 332, 311

[56] References Cited

U.S. PATENT DOCUMENTS

| | | | |
|---|---|---|---|
| 5,072,266 | 12/1991 | Bulucea et al. | 257/139 |
| 5,177,572 | 1/1993 | Murakami | 257/330 |
| 5,304,821 | 4/1994 | Hagino | 257/133 |
| 5,326,993 | 7/1994 | Iwamuro | 257/139 |
| 5,488,236 | 1/1996 | Baliga et al. | 257/132 |
| 5,554,862 | 9/1996 | Omura et al. | 257/138 |
| 5,751,024 | 5/1998 | Takahashi | 257/139 |

FOREIGN PATENT DOCUMENTS

| | | |
|---|---|---|
| 0 702 235 | 3/1996 | European Pat. Off. . |
| 0 720 235 | 7/1996 | European Pat. Off. . |
| 0 732 749 | 9/1996 | European Pat. Off. . |
| 2-3288 | 1/1990 | Japan ................ 257/139 |
| 3-6866 | 1/1991 | Japan ................ 257/143 |
| 5-243561 | 9/1993 | Japan . |
| 2 243 952 | 11/1991 | United Kingdom . |
| WO 92/14269 | 8/1992 | WIPO . |
| WO 97/07547 | 2/1997 | WIPO . |

*Primary Examiner*—Tom Thomas
*Assistant Examiner*—Ori Nadav
*Attorney, Agent, or Firm*—Oblon, Spivak, McClelland, Maier & Neustadt, P.C.

[57] ABSTRACT

It is an object to compatibly realize a decrease in an on-state voltage and an increase in a current capable of turn-off. An N layer (43) having an impurity concentration higher than that of an N⁻ layer (42) is formed between the N⁻ layer (42) and a P base layer (44). In the exposed surface of the P base layer (44) connected to an emitter electrode (51), a P⁺ layer (91) having an impurity concentration higher than that of the P base layer (44) is formed. The formation of the N layer (43) allows the carrier distribution in the N⁻ layer (42) to be close to the carrier distribution of a diode, so that the on-state voltage is decreased while maintaining high the current value capable of turn-off. Furthermore, the P⁺ layer (91) allows holes to easily go through form the P base layer (44) to the emitter electrode (51), which increases the current value capable of turn-off.

15 Claims, 38 Drawing Sheets

F I G. 30
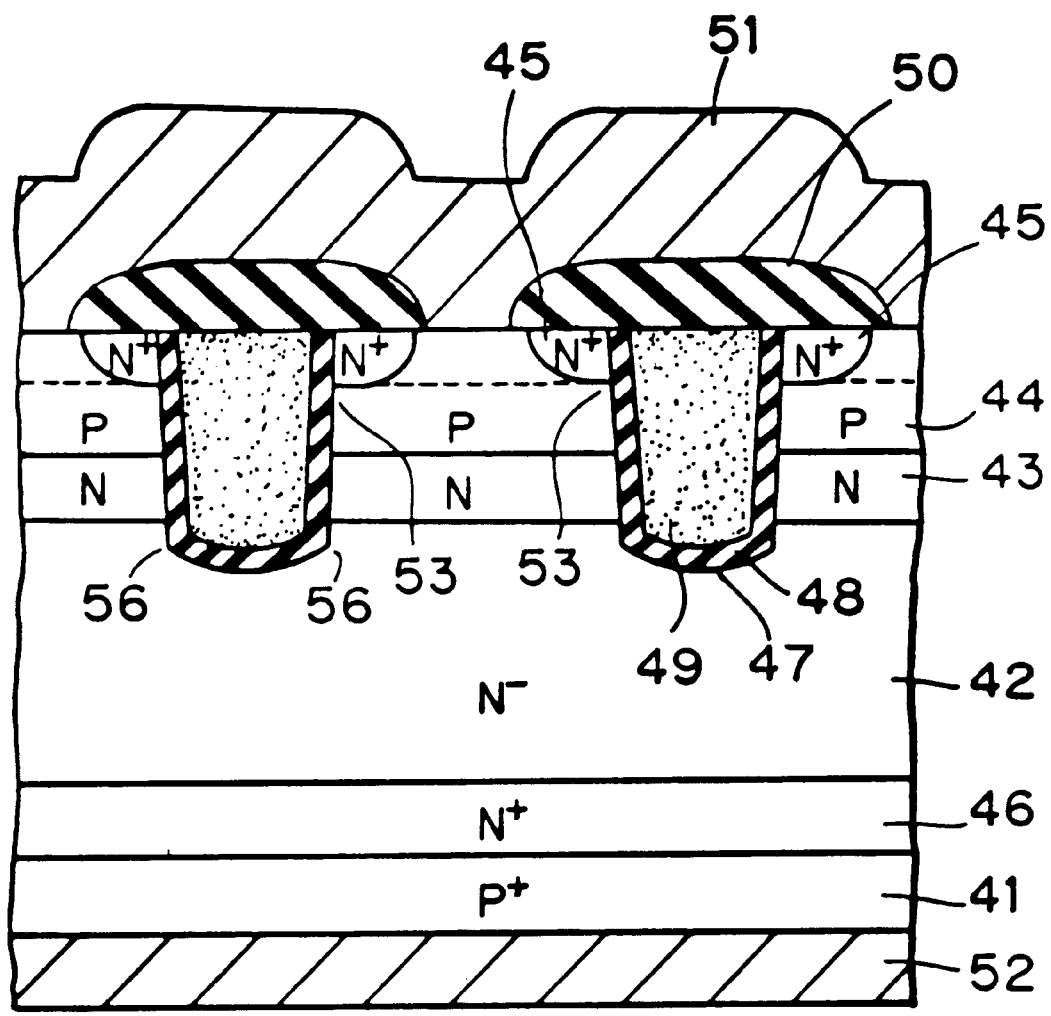

6,040,599

1

INSULATED TRENCH SEMICONDUCTOR DEVICE WITH PARTICULAR LAYER STRUCTURE

BACKGROUND OF THE INVENTION

1. Field of the Invention

The present invention relates to an insulated gate semiconductor device and a method of manufacturing the same, and particularly to a device structure with a low on-state voltage for an insulated gate bipolar transistor having trench MOS gate and a method of manufacturing the same.

2. Description of the Background Art

FIG. 47 is a sectional view of a conventional insulated gate semiconductor device. An insulated gate bipolar transistor (referred to as an IGBT, hereinafter) with trench gate structure (an IGBT with the trench gate structure is referred to as a U-type IGBT) will be described herein by way of example.

Recently, IGBTs are used in voltage resonance circuits, which are high-frequency inverters for achieving energy saving and reduction in size and weight of household electric appliances, in intelligent power modules for performing variable speed control of three-phase motors in the fields of general-purpose inverters, AC servos, air conditioners, and the like, and the use thereof are becoming common. While the switching characteristics, the saturation voltage, and the SOA (Safe Operating Area) are in the trade-off relation in the IGBTs, which are key devices thereof, devices with good switching characteristics, low saturation voltage and large SOA are required.

In FIG. 47, reference character 1 denotes a $P^+$ collector layer, 2 denotes an $N^-$ layer, 3 denotes a P base layer, 4 denotes an $N^+$ emitter region, 5 denotes a trench, 6 denotes a gate insulating film, 7 denotes a gate electrode, 8 denotes an interlayer insulating film, 9 denotes an $N^+$ buffer layer, 10 denotes an emitter electrode, 11 denotes a collector electrode and 12 denotes a channel region.

Next, operation of the IGBT will be described. When a certain collector voltage $V_{CE}$ is applied between the emitter electrode 10 and the collector electrode 11 and a certain gate voltage $V_{GE}$ is applied between the emitter electrode 10 and the gate electrode 7, that is, when the gate is turned on, the channel region 12 is inverted to N type and a channel is formed. Then electrons are injected into the $N^-$ layer 2 through this channel from the emitter electrode 10.

These injected electrons forwardly biases the $P^+$ collector layer 1 and the $N^-$ layers 2 and holes are injected from the collector electrode 11 through the $P^+$ collector layer 1 and the $N^+$ buffer layer 9 into the $N^-$ layer 2. As a result, the resistance of the $N^-$ layer 2 considerably decreases due to conductivity modulation and the current capacity of the IGBT increases. The voltage drop between collector and emitter of the IGBT at this time is an on-state voltage ($V_{CE(SAT)}$).

Next, to turn the IGBT from the on state to the off state, the gate voltage $V_{GE}$ applied between the emitter electrode 10 and the gate electrode 7 is brought to 0V or reverse bias, that is, the gate is turned off, then the channel region 12 inverted into the N type returns to the P type and injection of electrons from the emitter electrode 10 stops. Subsequently the electrons and holes accumulated in the $N^-$ layer 2 go through to the collector electrode 11 and the emitter electrode 10, respectively, or they are recombined and disappear.

Generally, the on-state voltages of the IGBTs are mostly determined by substantial resistance of the $N^-$ layer 2

2 necessary to keep the breakdown voltage. Factors for the substantial resistance include the electron supplying capability of MOSFET forming the IGBT. The structure of the U-type IGBT in which a narrow and deep trench is formed in the chip surface and an MOSFET is formed on its side wall makes the unit cell interval as small as possible to increase the electron supplying capability of the MOSFET.

FIG. 48 is a circuit diagram showing an equivalent circuit of the IGBT. In FIG. 48, reference character 15 denotes a bipolar transistor and 16 denotes an MOSFET. Generally, the IGBT is represented by the equivalent circuit of FIG. 48. However, since $h_{fe}$ of the bipolar transistor 15 formed of the $P^+$ collector layer 1, the N layer including the $N^+$ buffer layer 9 and the $N^-$ layer 2 and the P base layer of the IGBT is small, the IGBT can be regarded as a combination of the MOSFET and a diode 17.

FIG. 49 is a circuit diagram showing an equivalent circuit of the IGBT when the $h_{fe}$ of the bipolar transistor 15 is considered to be small. In FIG. 49, reference character 17 denotes a diode and 18 denotes an MOSFET. FIG. 50 is a graph showing carrier concentration distribution of the $N^-$ layer of a PIN diode in an on state.

In FIG. 49, since the MOSFET 18 can be regarded as a mere switching element, the $N^-$ layer of the PIN diode 17 of the IGBT should have such carrier concentration distribution of the $N^-$ layer of the PIN diode as shown in FIG. 50, but it does not.

FIG. 51 is a graph showing the carrier concentration distribution of the $N^-$ layer 2 of the conventional IGBT in an on state. While the carrier concentration of the $N^-$ layer of the PIN diode in an on state is uniform between the end on the anode side of the $N^-$ layer and the end on the cathode side as shown in FIG. 50, the carrier concentration of the $N^-$ layer 2 in an on state of the conventional IGBT gradually decreases from the end on the collector side of the $N^-$ layer 2 toward the end on the emitter side, as shown in FIG. 51. Accordingly, the on-state voltage of the conventional IGBT is higher than that of the diode.

Especially, in IGBTs with high breakdown voltage, the breakdown voltage is ensured by increasing the thickness of the $N^-$ layer 2. The gradient of the carrier concentration of the $N^-$ layer 2 decreasing from the collector side end to the emitter side end is not affected by the thickness of the $N^-$ layer 2 if the carrier life time is the same, so that the difference in height of the carrier concentration between the collector side end and the emitter side end increases as the thickness of the $N^-$ layer 2 becomes larger, therefore the difference in on-state voltage from the diode becomes larger as the IGBT has a higher breakdown voltage.

Various devices are proposed to eliminate such difference between the on-state voltage of the IGBT and the on-state voltage of the diode which is regarded as an extreme value of the on-state voltage of the IGBT. Such devices include the MCT (MOS CONTROLLED THYRISTOR), and the IEGT (INJECTION ENHANCED GATE BIPOLAR TRANSISTOR).

FIG. 52 is a sectional view showing the structure of the MCT. In FIG. 52, reference character 21 denotes an $N^+$ cathode region, 22 denotes an N region, 23 denotes a $P^+$ region, 24 denotes a channel region for gate-on and 25 denotes a channel region for gate-off, i.e., an off-channel region. Other reference characters denote the same parts as those in FIG. 47. It is known that the $N^-$ layer 2 in the MCT generally has the carrier concentration distribution in an on state similar to that of the diode. Hence, the MCT has its on-state voltage lower than that of the IGBT of the conventional structure.

At the time of turning off, however, the P-channel MOS formed of the P base layer 3, the N region 22 and the P+ region 23 forms a channel by inversion of the off-channel region 25, through which channel holes flow. Therefore, considering that the resistance of the off-channel region 25 is generally high, this produces the problem that the current value capable of off can not be taken large. Furthermore, an N-channel MOS for ON and a P-channel MOS for OFF must be formed in the threefold diffusion, which results in complicated process leading to a higher price of the device.

Examples of IEGTs include that disclosed in Japanese Patent laying-Open No.5-243561. For example, the IEGT shown in FIG. 101 of Japanese Patent Laying-Open No.5-243561 has structure in which an N emitter region and a P base region of part of cells of a U-type IGBT are covered with an insulating layer to eliminate contact between the N emitter region and the P base region, and the emitter electrode.

While operation of the IEGT is basically the same as the U-type IGBT, the hole current going through to the P base region in an on state is limited and holes are accumulated in the surface of the N-type base layer because of the formation of the cells having no contact between the N emitter region and the P base region and the emitter electrode, so that the carrier concentration distribution of the N-type base layer results in one similar to that of the diode, and the on-state voltage of the IEGT becomes lower than that of the U-type IGBT.

In an off state, it also basically operates similarly to the U-type IGBT, but holes accumulated in the N-type base layer go through to the emitter electrode through a smaller number of cells because a smaller number of cells operate as compared with the U-type IGBT.

This movement of holes becomes a base current of a parasitic bipolar transistor formed of the N-type base layer, the P base region and the emitter region, and when it exceeds the built-in potential (generally 0.6 V), the parasitic bipolar transistor turns on. Hence, it may be necessary to make the off-capable current value (maximum current value which can be turned off) smaller in the IEGT, in which part of cells of U-type IGBT are removed, than in the ordinary U-type IGBT so that the parasitic bipolar transistor will not turn on.

SUMMARY OF THE INVENTION

According to a first aspect of the present invention, an insulated gate semiconductor device comprises: a first semiconductor layer of a first conductivity type having first and second main surfaces; a second semiconductor layer of a second conductivity type provided on the first main surface of the first semiconductor layer; a third semiconductor layer of the second conductivity type provided in close contact on a surface of the second semiconductor layer and having an impurity concentration higher than the impurity concentration of the second semiconductor layer; a fourth semiconductor layer of the first conductivity type provided in close contact on a surface of the third semiconductor layer; a fifth semiconductor layer of the second conductivity type selectively provided in a surface of the fourth semiconductor layer; a trench having an opening in a surface of the fifth semiconductor layer and having a depth extending through at least the fourth semiconductor layer from the surface of the fifth semiconductor layer; an insulating film provided on an inner wall of the trench; a control electrode provided in the trench to face the fourth semiconductor layer through the insulating film; a first main electrode provided on the surface of the fourth and fifth semiconductor layers; and a second main electrode provided on the second main surface of the first semiconductor layer.

Preferably, according to a second aspect of the present invention, the trench has a depth extending also through the third semiconductor layer to reach the second semiconductor layer.

Preferably, according to a third aspect of the present invention, the trench has a depth limited in the third semiconductor layer.

Preferably, according to a fourth aspect of the present invention, the second semiconductor layer extends through the first semiconductor layer to be partially exposed in the second main surface of the first semiconductor layer.

Preferably, according to a fifth aspect of the present invention, a sixth semiconductor layer of the second conductivity type with an impurity concentration higher than the impurity concentration of the second semiconductor layer is provided between the first semiconductor layer and the second semiconductor layer.

Preferably, according to a sixth aspect of the present invention, the sixth semiconductor layer extends through the first semiconductor layer to be partially exposed in the second main surface of the first semiconductor layer.

Preferably, according to a seventh aspect of the present invention, the trench is divided into a plurality of unit trenches arranged side by side, and the exposed surface of the fourth semiconductor layer is interposed between adjacent ones of the unit trenches.

Preferably, according to an eighth aspect of the present invention, an exposed surface of the fourth semiconductor layer is divided into a plurality of unit exposed surfaces by a part of the fifth semiconductor layer, the plurality of unit exposed surfaces being alternated with the part of the fifth semiconductor layer along the trench.

Preferably, according to a ninth aspect of the present invention, the first main electrode is connected to the fifth semiconductor layer only in the part.

Preferably, according to a tenth aspect of the present invention, the fifth semiconductor layer is provided like a plurality of belts parallel to each other in the surface of the fourth semiconductor layer, and the plurality of unit trenches are provided along a direction intersecting the belt-like fifth semiconductor layer.

Preferably, according to an eleventh aspect of the present invention, the fourth semiconductor layer has a seventh semiconductor layer of the first conductivity type at least in its exposed surface portion, and an impurity concentration in the seventh semiconductor layer is higher than the impurity concentration in the portion in the fourth semiconductor layer except in the seventh semiconductor layer.

Preferably, according to a twelfth aspect of the present invention, the insulated gate semiconductor device further comprises an eighth semiconductor layer of the first conductivity type formed to surround a bottom of the trench and having an impurity concentration higher than that in the second semiconductor layer.

Preferably, according to a thirteenth aspect of the present invention, the insulated gate semiconductor device further comprises an eighth semiconductor layer of the first conductivity type formed to surround a bottom of the trench and having an impurity concentration higher than that in the second semiconductor layer, wherein the eighth semiconductor layer is surrounded by the third semiconductor layer.

According to a fourteenth aspect of the present invention, a method of manufacturing an insulated gate semiconductor device comprises: a substrate forming step of forming a semiconductor substrate defining first and second main surfaces and having a first semiconductor layer of a first conductivity type and a second semiconductor layer of a second conductivity type, the first semiconductor layer being exposed in the first main surface and the second semiconductor layer being exposed in the second main surface; a first implantation step of implanting and diffusing an impurity of the second conductivity type into the second main surface of the semiconductor substrate to an impurity concentration higher than the impurity concentration of the second semiconductor layer to form a third semiconductor layer of the second conductivity type in a surface portion of the second semiconductor layer; a second implantation step of implanting and diffusing an impurity of the first conductivity type into a surface of the third semiconductor layer to form a fourth semiconductor layer of the first conductivity type in a surface portion of the third semiconductor layer; a third implantation step of forming on a surface of the fourth semiconductor layer a resist pattern selectively having an opening and implanting and diffusing an impurity of the second conductivity type using the resist pattern as a mask to selectively form a fifth semiconductor layer of the second conductivity type in the surface portion of the fourth semiconductor layer; a first removal step of forming on the surface of the fourth semiconductor layer and a surface of the fifth semiconductor layer a barrier film having an opening surrounding a part of the surface of the fifth semiconductor layer and selectively removing the semiconductor substrate using the barrier film as a mask to form a trench having a depth extending through at least the fourth semiconductor layer and then removing the barrier film; a first step of forming an insulating film on surfaces of the trench, the fourth semiconductor layer and the fifth semiconductor layer; a first deposition step of depositing a conductor on the insulating film to fill the trench; a second removal step of uniformly removing the applied conductor to an opening of the trench, leaving the conductor in the trench as a control electrode; a second deposition step of depositing an insulating latter on the surface of the insulating film and a surface of the conductor buried in the trench; a third removal step of forming on the surface of the insulating layer a resist pattern having an opening surrounding at least a part of the surface of the fourth semiconductor layer and a part of the surface of the fifth semiconductor layer and selectively removing the insulating layer and the insulating film using the resist pattern as a mask; a step of depositing a conductor on the surface of the fourth and fifth semiconductor layers exposed after the third removal step to form a first main electrode; and a step of depositing a conductor on the first main surface of the semiconductor substrate to form a second main electrode.

Preferably, according to a fifteenth aspect of the present invention, the trench is formed to a depth extending also through the third semiconductor layer in the first removal step.

Preferably, according to a sixteenth aspect of the present invention, the trench is formed to a depth limited in the third semiconductor layer in the first removal step.

Preferably, according to a seventeenth aspect of the present invention, the substrate forming step includes steps of preparing a semiconductor substrate body of the first conductivity type having two main surfaces, and depositing a semiconductor layer of the second conductivity type by epitaxial growth on one main surface of the semiconductor substrate body to form the second semiconductor layer.

Preferably, according to an eighteenth aspect of the present invention, the substrate forming step includes steps of preparing a semiconductor substrate body of the second conductivity type having two main surfaces, implanting an impurity of the first conductivity type into one main surface of the semiconductor substrate body, and diffusing the impurity implanted into the one main surface to form the first semiconductor layer of the first conductivity type.

Preferably, according to a nineteenth aspect of the present invention, the step of implanting the impurity of the first conductivity type includes steps of forming a resist pattern having a selectively formed opening on the one main surface of the semiconductor substrate body, and selectively implanting the impurity of the first conductivity type into the one main surface of the semiconductor substrate body using the resist pattern formed on the one main surface as a mask.

Preferably, according to a twentieth aspect of the present invention, the semiconductor substrate formed in the substrate forming step further includes a sixth semiconductor layer of the second conductivity type with a higher impurity concentration than that of the second semiconductor layer interposed between the first semiconductor layer and the second semiconductor layer.

Preferably, according to a twenty-first aspect of the present invention, the substrate forming step includes steps of preparing a semiconductor substrate body of the first conductivity type having two main surfaces, and sequentially forming the sixth semiconductor layer and the second semiconductor layer by epitaxial growth on the one main surface of the semiconductor substrate body.

Preferably, according to a twenty-second aspect of the present invention, the substrate forming step includes steps of preparing a semiconductor substrate body of the second conductivity type having two main surfaces, implanting and then diffusing an impurity of the second conductivity type into one main surface of the semiconductor substrate body to form the sixth semiconductor layer, and implanting and then diffusing an impurity of the first conductivity type into a surface of the sixth semiconductor layer to form the first semiconductor layer.

Preferably, according to a twenty-third aspect of the present invention, the step of forming the first semiconductor layer includes steps of forming a resist pattern having a selectively formed opening on the surface of the sixth semiconductor layer, selectively implanting the impurity of the first conductivity type into the surface of the sixth semiconductor layer using the resist pattern formed on the surface of the sixth semiconductor layer as a mask, and diffusing the impurity selectively implanted into the surface of the sixth semiconductor layer.

Preferably, according to a twenty-fourth aspect of the present invention, if impurity concentrations in the second semiconductor layer, the third semiconductor layer and the fourth semiconductor layer are taken as $C_2$, $C_3$, and $C_4$, respectively, the first implantation step and the second implantation step are performed so that $C_2<C_3<C_4$.

Preferably, according to a twenty-fifth aspect of the present invention, the method of manufacturing an insulated gate semiconductor device further comprises a fourth implantation step of implanting and diffusing an impurity of the first conductivity type into at least a part of the surface of the fourth semiconductor layer to form a seventh semiconductor layer having an impurity concentration higher than that of the fourth semiconductor layer in the surface portion of the fourth semiconductor layer.

Preferably, according to a twenty-sixth aspect of the present invention, in the fourth implantation step, a resist pattern having a selectively opened opening is formed on the surface of the fourth semiconductor layer, and then using this resist pattern as a mask, the impurity of the first conductivity type is implanted and diffused to selectively form the seventh semiconductor layer in the surface portion of the fourth semiconductor layer, and the opening of the resist pattern used in the third implantation step and the opening of the resist pattern used in the fourth implantation step selectively open so that the fifth and seventh semiconductor layers occupy different regions in the surface portion of the fourth semiconductor layer.

Preferably, according to a twenty-seventh aspect of the present invention, as compared with a dose of the impurity of the second conductivity type in the third implantation step, a dose of the impurity of the first conductivity type in the forth implantation step is so low as not to substantially affect the impurity of the second conductivity type.

Preferably, according to a twenty-eighth aspect of the present invention, the first removal step includes a step of, after forming the trench, implanting and then diffusing an impurity of the first conductivity type using the barrier film as a mask to form an eighth semiconductor layer of the first conductivity type of an impurity concentration higher than that of the second semiconductor layer in a bottom of the trench.

Preferably, according to a twenty-ninth aspect of the present invention, the method of manufacturing an insulated gate semiconductor device further comprises a step of, after the first removal step, implanting and then diffusing an impurity of the first conductivity type of such a dose as does not substantially affect the impurity concentration of the fifth semiconductor layer in the trench and the exposed surface of the fourth and fifth semiconductor layers to form an eighth semiconductor layer of the first conductivity type with an impurity concentration higher than that of the second semiconductor layer on a bottom of the trench, and at the same time, to form a ninth semiconductor layer with an impurity concentration higher than that of the fourth semiconductor layer in the exposed surface of the fourth semiconductor layer.

Preferably, according to a thirtieth aspect of the present invention, the method of manufacturing an insulated gate semiconductor device further comprises step of, after implantation of the impurity of the first conductivity type for forming the eighth semiconductor layer, forming an insulating film on an inner wall of the trench and then removing this insulating film.

According to the insulated gate semiconductor device of the first aspect, when the gate is on, carriers, e.g., holes, going through to the first main electrode via the third semiconductor layer are restricted by the third semiconductor layer and accumulated in the second semiconductor layer in the vicinity of the boundary between the second semiconductor layer and the third semiconductor layer, so that the carrier distribution of the second semiconductor layer becomes close to the carrier distribution of a diode. Hence, the on-state voltage decreases. When the gate turns from the on state to the off state, as electrons and holes accumulated in the second semiconductor layer move to the second main electrode and the first main electrode, respectively, the effect as a barrier on movement of holes via the third semiconductor layer is small because a high voltage is applied between the first main electrode and the second main electrode. Accordingly, the current value capable of off does not decrease despite of the low on-state voltage. Hence, an insulated gate semiconductor device with small power consumption, of small size and large capacity, and having high reliability is realized.

According to the insulated gate semiconductor device of the second aspect, since the trench has such a depth that it passes also through the third semiconductor layer to reach the second semiconductor layer, electric field concentration at the end of the trench is softened and the breakdown voltage is easy to ensure. Hence, it enables construction in the wide range from elements in a relatively low voltage class to elements in a high voltage class and it can be adapted to various required specifications.

According to the insulated gate semiconductor device of the third aspect, since the trench has its depth which stays in the third semiconductor layer, the third semiconductor layer with a high impurity concentration becomes thicker and the on-state voltage is further decreased. Accordingly, an insulated gate semiconductor device with small power consumption can be provided especially in the high breakdown voltage class.

According to the insulated gate semiconductor device of the fourth aspect, the second semiconductor layer extends through the first semiconductor layer and is partially exposed in the second main surface of the first semiconductor layer, and shorted with the second main electrode, so that electrons can easily move to the second main electrode at the time of turning off, which results in a higher switching speed.

According to the insulated gate semiconductor device of the fifth aspect, since the sixth semiconductor layer of the second conductivity type having an impurity concentration higher than the impurity concentration of the second semiconductor layer is formed between the first semiconductor layer and the second semiconductor layer, extension of a depletion layer is stopped by the sixth semiconductor layer in the off state. Hence, punch through is unlikely to occur and the breakdown voltage increases.

According to the insulated gate semiconductor device of the sixth aspect, the sixth semiconductor layer passes through the first semiconductor layer and is partially exposed in the second main surface of the first semiconductor layer so that it is shorted with the second main electrode. As a result, electrons can easily move to the second main electrode at the time of turning off, which results in a higher switching speed.

According to the insulated gate semiconductor device of the seventh aspect, the trench is divided into a plurality arranged side by side with the exposed surface of the fourth semiconductor layer interposed between adjacent trenches. Therefore, a channel region can be large when configuring a plurality of cells, allowing large capacity with small size.

According to the insulated gate semiconductor device of the eighth aspect, since the exposed surface of the fourth semiconductor layer is divided into a plurality by part of the fifth semiconductor layer and arranged alternately with the part of the fifth semiconductor layer along the trench, the contact region in which the first main electrode gets contact with the fourth semiconductor layer and the fifth semiconductor layer can be provided using the fifth semiconductor layer arranged between the fourth semiconductor layers. As a result, it is not necessary to consider misalignment of mask when forming the contact region, so that the cells can be miniaturized to enable higher density of cells, resulting is a lower on-state voltage. Also, the contact regions can be arranged with good balance in the entire element surface, resulting in uniform performance of cells in the entire element surface.

According to the insulated gate semiconductor device of the ninth aspect, since the first main electrode is connected to the fifth semiconductor layer only in the part of the fifth semiconductor layer dividing the exposed surface of the fourth semiconductor layer, the path of current flowing in the fifth semiconductor layer is long and a large voltage drop occurs. This makes distribution of current uniform in the entire device and the value of the current capable of turn-off increases. That is to say, RBSOA is improved.

According to the insulated gate semiconductor device of the tenth aspect, the fifth semiconductor layer is provided like a plurality of belts parallel to each other and the plurality of unit trenches are arranged along the direction intersecting the belt-like fifth semiconductor layer. Therefore, even if the position of the mask for forming contact regions where these fourth and fifth semiconductor layers and the first main electrode are connected is shifted to either one of adjacent unit trenches, connection can be made in a certain area. Accordingly, labor and cost for production of the device are reduced and cells can be miniaturized without considering margin for positional error of the mask pattern.

Furthermore, as the plurality of parallel belt-like fifth semiconductor layers intersect the trenches, the fourth semiconductor layer is in contact with the trenches. Hence, when the device changes from an on state to an off state, holes charged with current pass also through the portion in contact with the trenches in the fourth semiconductor layer to go through to the first main electrode. Consequently, the value of the current capable of turn-off is increased.

According to the insulated gate semiconductor device of the eleventh aspect, since the seventh semiconductor layer with a high impurity concentration is formed in the exposed surface of the fourth semiconductor layer, the first main electrode is connected to the fourth semiconductor layer through this seventh semiconductor layer. As a result, contact resistance between the first main electrode and the fourth semiconductor layer and the potential barrier are both low and holes can easily go through from the fourth semiconductor layer to the first main electrode. Hence, the value of the current capable of turn-off is increased.

According to the insulated gate semiconductor device of the twelfth aspect, the eighth semiconductor layer of the first conductivity type having an impurity concentration higher than in the second semiconductor layer is formed to surround the bottom of the trench, so that concentration of electric field at the bottom of the trench is softened. This increases the breakdown voltage of the device.

According to the insulated gate semiconductor device of the thirteenth aspect, the eighth semiconductor layer of the first conductivity type having an impurity concentration higher than in the second semiconductor layer is formed to surround the bottom of the trench, so that concentration of the electric field at the bottom of the trench is softened. This increases the breakdown voltage of the device. Furthermore, since the trench has its depth which stays in the third semiconductor layer, the thickness of the third semiconductor layer increases and the on-state voltage becomes lower. Especially, the eighth semiconductor layer allows the thickness of the third semiconductor layer to be set large without deterioration of the breakdown voltage, therefore the on-state voltage can be further reduced.

According to the method of manufacturing an insulated gate semiconductor device of the fourteenth aspect, the third semiconductor layer is formed by implanting and diffusing an impurity of the second conductivity type to an impurity concentration higher than the impurity concentration of the second semiconductor layer into the exposed surface of the second semiconductor layer of the semiconductor substrate, the fourth semiconductor layer of the first conductivity type is formed in the surface of the third semiconductor layer, the fifth semiconductor layer is selectively formed in the surface of the fourth semiconductor layer, the trench passing at least through the fourth semiconductor layer is formed in part of the surface of the fifth semiconductor layer, an insulating film is formed on the surface of the trench, and a conductor is applied on the insulating film and uniformly removed to the opening of the trench, leaving the conductor in the trench as a control electrode. Hence, an insulated gate semiconductor device with undecreased turn-off capable current value despite of its low on-state voltage can be produced at low cost without using complicated processes.

According to the method of manufacturing an insulated gate semiconductor device of the fifteenth aspect, since a trench passing through the third semiconductor layer is formed in a part of the surface of the fifth semiconductor layer, an insulated gate semiconductor device adaptable to various required specifications can be produced at low cost without using complicated processes.

According to the method of manufacturing an insulated gate semiconductor device of the sixteenth aspect, since a trench limited in the third semiconductor layer is formed in part of the surface of the fifth semiconductor layer, an insulated gate semiconductor device with a low on-state voltage and small power consumption can be manufactured at low cost in processes with short preparation time, especially in the high breakdown voltage class.

According to the method of manufacturing an insulated gate semiconductor device of the seventeenth aspect, in the step of forming the semiconductor substrate, the second semiconductor layer of the second conductivity type is formed by epitaxial growth on the surface of the semiconductor substrate of the first conductivity type, so that a device, especially having a relatively thin second semiconductor layer and having a low breakdown voltage, can be manufactured in a relatively short manufacturing time without using complicated processes.

According to the method of manufacturing an insulated gate semiconductor device of the eighteenth aspect, in the step of forming a semiconductor substrate, an impurity of the first conductivity type is implanted into the surface of the semiconductor substrate of the second conductivity type and then diffused to form the first semiconductor layer of the first conductivity type, so that the process of forming the semiconductor substrate can mainly include the diffusion process. This allows a device, especially a device of a high breakdown voltage with a relatively thick second semiconductor layer, to be produced at low cost.

According to the method of manufacturing an insulated gate semiconductor device of the nineteenth aspect, the resist pattern having a selectively formed opening is formed on one main surface of the semiconductor substrate and an impurity of the first conductivity type is implanted using this resist pattern as a mask, so that the exposed surface of the second semiconductor layer is simultaneously formed in the implantation and diffusion process for forming the first semiconductor layer. Accordingly, an insulated gate semiconductor device with high switching speed can be produced efficiently at low cost.

According to the method of manufacturing an insulated gate semiconductor device of the twentieth aspect, in the step of forming a semiconductor substrate, a semiconductor substrate is formed in which the second semiconductor layer of the second conductivity type with a low impurity concentration is formed on one main surface of the first semiconductor layer of the first conductivity type with the sixth semiconductor layer of the second conductivity type with a high impurity concentration therebetween, so that an insulating gate semiconductor device not liable to punch-through can be produced at low cost.

According to the method of manufacturing an insulated gate semiconductor device of the twenty-first aspect, since the sixth semiconductor layer and the second semiconductor layer are sequentially formed by epitaxial growth on one main surface of the semiconductor substrate of the first conductivity type, an insulated gate semiconductor device not liable to punch-through can be produced at low cost in processes with a short preparation time.

According to the method of manufacturing an insulated gate semiconductor device of the twenty-second aspect, an impurity of the second conductivity type is implanted and diffused into one main surface of the semiconductor substrate of the second conductivity type to form the sixth semiconductor layer and then an impurity of the first conductivity type is implanted and diffused in the surface of the sixth semiconductor layer to form the first semiconductor layer, so that an insulated gate semiconductor device not liable to punch-through can be produced at low cost in processes mainly including diffusion process.

According to the method of manufacturing an insulated gate semiconductor device of the twenty-third aspect, the resist pattern having a selectively formed opening is formed on the surface of the sixth semiconductor layer and an impurity of the first conductivity type is implanted using this resist pattern as a mask, so that the exposed surface of the sixth semiconductor layer is formed simultaneously in the implantation and diffusion process for forming the first semiconductor layer. Hence, an insulated gate semiconductor device with high switching speed and not liable to punch-through can be produced efficiently and at low cost.

According to the method of manufacturing an insulated gate semiconductor device of the twenty-fourth aspect, if impurity concentrations of the second semiconductor layer, the third semiconductor layer and the fourth semiconductor layer are taken as $C_2$, $C_3$, and $C_4$, respectively, the first implantation step and the second implantation step are performed in such a way that $C_2<C_3<C_4$, so that the time required for the diffusion process is shortened. Hence, the insulated gate semiconductor device can be produced at low cost.

According to the method of manufacturing an insulated gate semiconductor device of the twenty-fifth aspect, since the seventh semiconductor layer with a high impurity concentration is formed in the surface portion of the fourth semiconductor layer by the fourth implantation step, the first main electrode is connected to the fourth semiconductor layer through the seventh semiconductor layer. That is to say, a device with a high turn-off capable current value can be produced only by adding the simple and low-cost implantation and diffusion process.

According to the method of manufacturing an insulated gate semiconductor device of the twenty-sixth aspect, the seventh semiconductor layer is selectively formed in a region different from the fifth semiconductor layer in the surface portion of the fourth semiconductor layer by using the resist pattern. That is to say, the fifth semiconductor layer and the seventh semiconductor layer are formed without mutual interference. Accordingly, functions of both the fifth semiconductor layer and the seventh semiconductor layer are sufficiently achieved.

According to the method of manufacturing an insulated gate semiconductor device of the twenty-seventh aspect, in the fourth implantation step, the implantation of the impurity is applied to such an extent that it does not substantially affect the fifth semiconductor layer, so that the seventh semiconductor layer with a high impurity concentration is selectively formed in the region different from the fifth semiconductor layer in the surface portion of the fourth semiconductor layer. Accordingly, the functions of both the fifth semiconductor layer and the seventh semiconductor layer are sufficiently displayed. Furthermore, mask pattern is not required to form the seventh semiconductor layer, so that the manufacturing process is more simple.

According to the method of manufacturing an insulated gate semiconductor device of the twenty-eighth aspect, the eighth semiconductor layer of the first conductivity type with a higher impurity concentration than that of the second semiconductor layer is formed at the bottom of the trench by implantation and diffusion of impurity using the barrier film as a mask. That is to say, a device with a high breakdown voltage can be produced only by adding a simple and low-cost implantation and diffusion process.

According to the method of manufacturing an insulated gate semiconductor device of the twenty-ninth aspect, the eighth semiconductor layer of the first conductivity type with a higher impurity concentration than that of the second semiconductor layer is formed at the bottom of the trench by implantation and diffusion of impurity. That is to say, a device with a high breakdown voltage can be produced only by adding a simple and low-cost implantation and diffusion process. Furthermore, since the ninth semiconductor layer is formed at the same time, the effect of improving the current value capable of turn-off is obtained at the same time. Moreover, since the eighth semiconductor layer and the ninth semiconductor layer are simultaneously formed in a single process, a device with the two characteristics improved at the same time can be produced efficiently.

According to the method of manufacturing an insulated gate semiconductor device of the thirtieth aspect, after the implantation of impurity for forming the eighth semiconductor layer, an insulating film is formed on the inner wall of the trench and then this insulating film is removed. Therefore, even if a semiconductor layer of the first conductivity type is unintentionally formed on the side wall of the trench, it is effectively removed. That is to say, a device having no possibility of bad effect on operation of the MOS region and having stable characteristics can be obtained by adding a simple process.

It is an object of the present invention to provide an insulated gate semiconductor device whose current value capable of turn-off is not decreased even if structure for decreasing the on-state voltage is adopted and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a fragmentary sectional view of the device of FIG. 29.

DESCRIPTION OF THE PREFERRED EMBODIMENTS

<First Preferred Embodiment>

Figure 1:
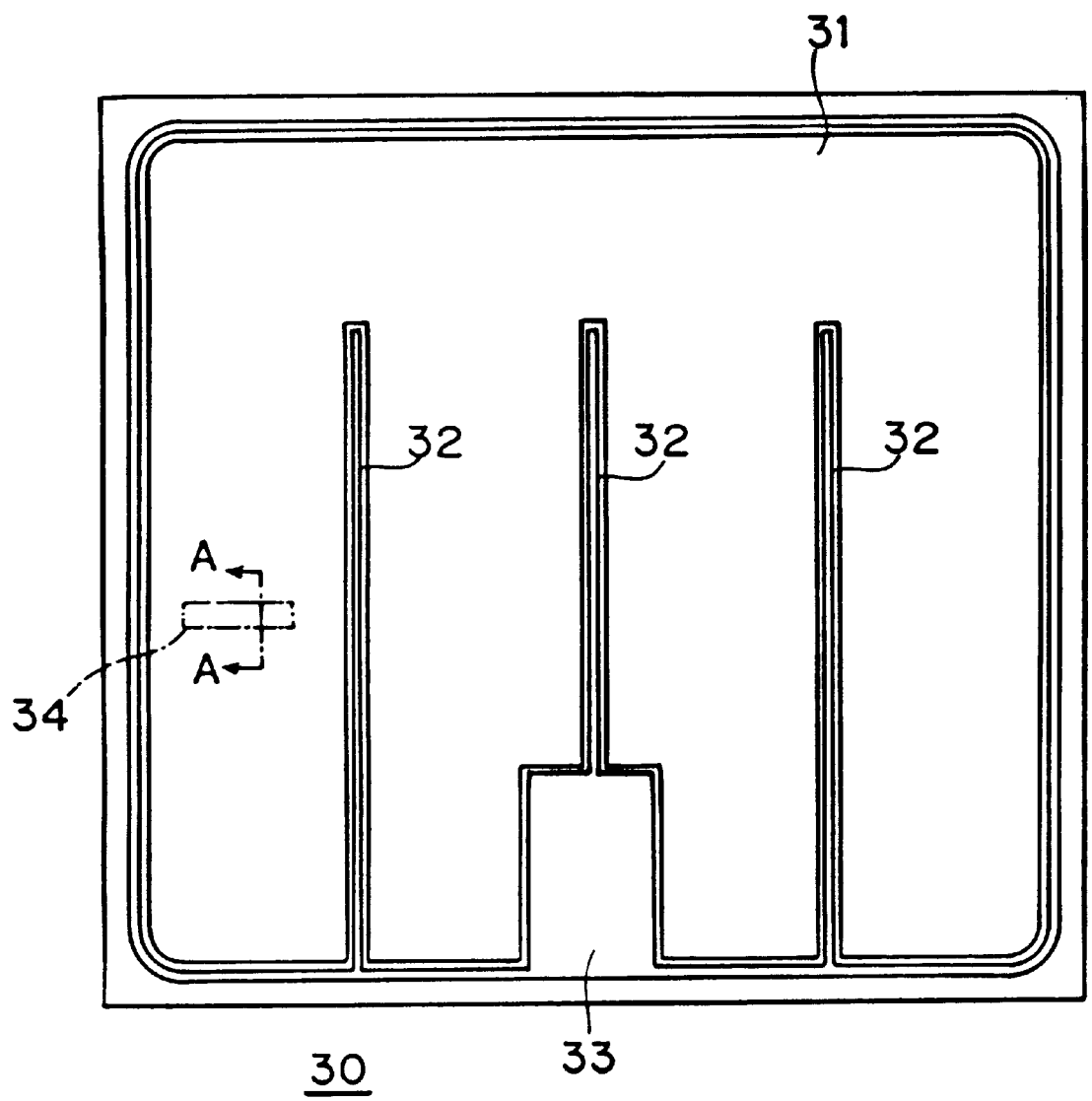
FIG. 1 is a plan of an insulated gate semiconductor device of a first preferred embodiment.
Figure 2:
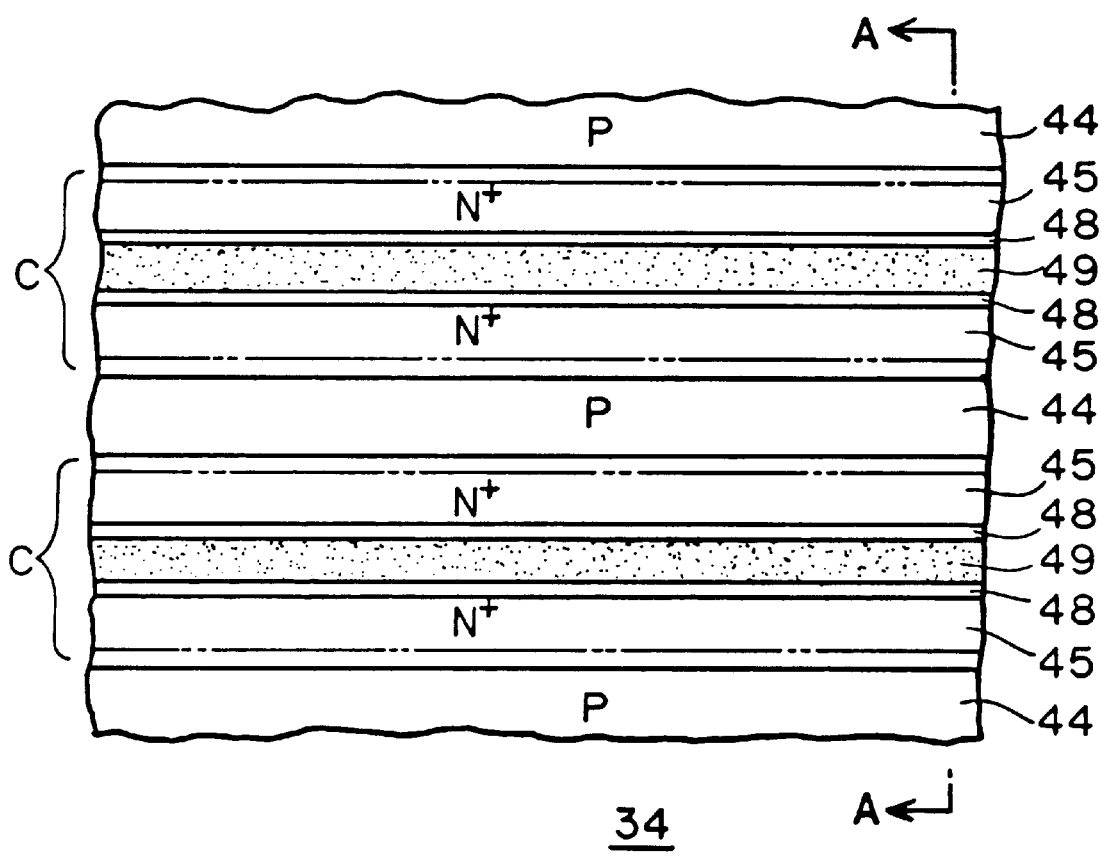
FIG. 2 is a fragmentary plan of part of cells of the device of FIG. 1.
Figure 3:
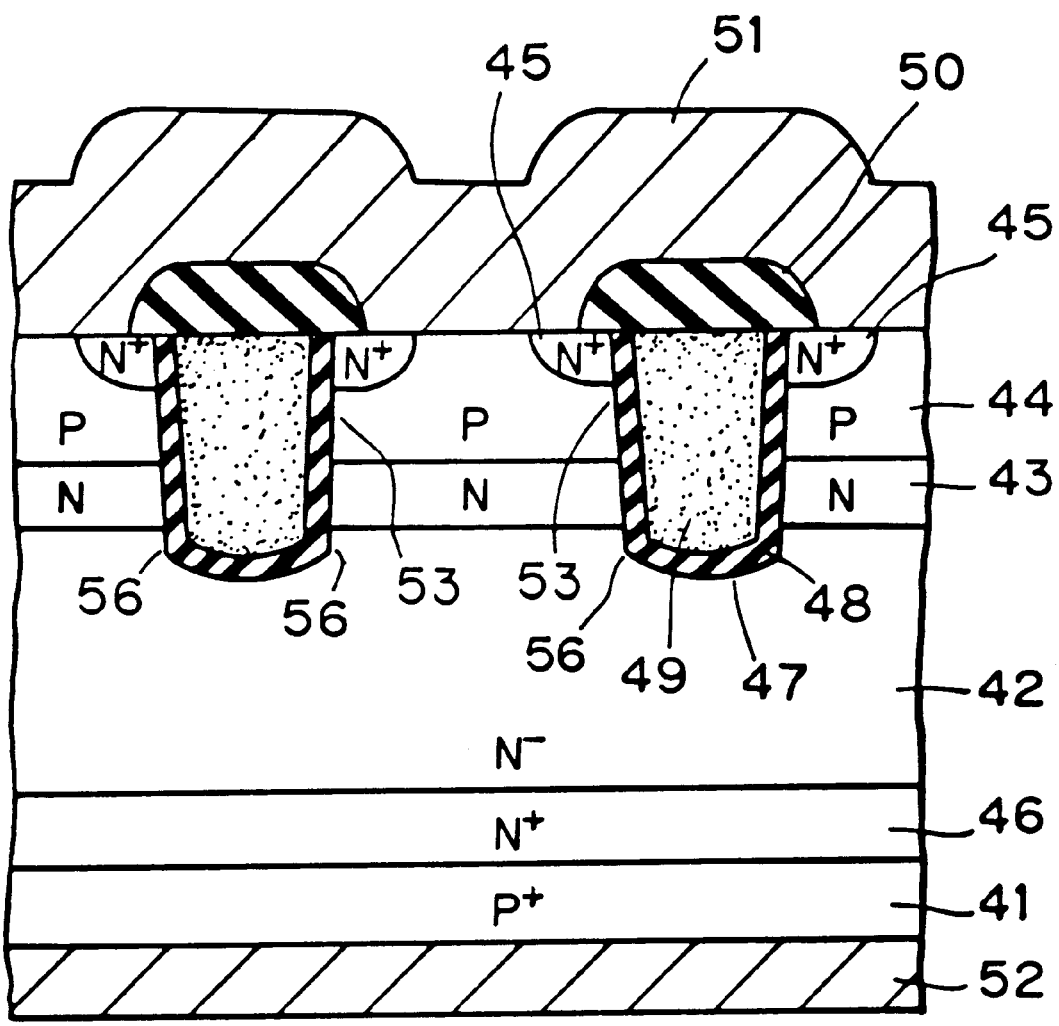
FIG. 3 is a fragmentary sectional view along the section A—A of the part of cells of the device of FIG. 1.

FIG. 1 is a plan view of an insulated gate semiconductor device according to a preferred embodiment of the present invention. The description will now be made on a U-type IGBT by way of example of an insulated gate semiconductor device. FIG. 2 is a fragmentary plan view of part of cells of the U-type IGBT shown in FIG. 1 and FIG. 3 is a fragmentary sectional view of the part of cells shown in FIG. 2 taken along the section A—A. FIG. 2 shows the device with the emitter electrode 51 and the interlayer insulating film 50 of FIG. 3 removed therefrom.

In FIG. 1, reference character 30 denotes a U-type IGBT, 31 denotes an emitter electrode as a first main electrode, 32 denotes a gate interconnection, 33 denotes a gate pad and 34 denotes a part of cells.

In FIG. 2 and FIG. 3, reference character 41 denotes a $P^+$ collector layer as a first semiconductor layer, 42 denotes an $N^-$ layer as a second semiconductor layer, 43 denotes an N layer as a third semiconductor layer, 44 denotes a P base layer as a fourth semiconductor layer, 45 denotes an $N^+$ emitter region as a fifth semiconductor layer, 46 denotes an $N^+$ buffer layer as a sixth semiconductor layer, 47 denotes a trench as a groove, 48 denotes a gate insulating film as an insulating film, 49 denotes a gate electrode as a control electrode, 50 denotes an interlayer insulating film and 51 denotes an emitter electrode as a first main electrode, which is a part of the emitter electrode 31 shown in FIG. 1. The reference character 52 denotes a collector electrode as a second main electrode, 53 denotes a channel region and 56 denotes an end corner of the trench 47. In FIG. 2, the regions C between the two-dot chain lines shown by the parentheses denote regions to be covered with the interlayer insulating film 50.

The gate insulating film 48 is usually a thermal oxide film $SiO_2$, and the gate electrode 49 is polysilicon doped with N-type impurities. The interlayer insulating film 50 is composed of silicate glass containing boron and phosphorus (referred to as BPSG, hereinafter), the emitter electrode 51, the gate interconnection 32 and the gate pad 33 are composed of Al which contains Si (referred to as Al—Si, hereinafter) and the collector electrode 52 is composed of an AlMoNiAu alloy, respectively.

The gate interconnection 32 is connected to the gate electrode 49 of a cell, which has functions of reducing the area of polysilicon in the route from the gate electrode 49 to the gate pad 33 to decrease electric resistance from the gate electrode 49 to the gate pad 33 and of making control operation of the element uniform in the entire element surface.

In the U-type IGBT of this preferred embodiment, the $N^+$ buffer layer 46 is provided on the surface of the $P^+$ collector layer 41 and the $N^-$ layer 42 is provided on the surface of the $N^+$ buffer layer 46. The N layer 43 is provided on the $N^-$ layer 42 and the P base layer 44 is provided thereon. The $N^+$ emitter regions 45 are disposed like belts at intervals in the surface of the P base layer 44, and trenches 47 extending from the surface of the $N^+$ emitter regions 45 through the P base layer 44 and the N layer 43 to reach the $N^-$ layer 42 are formed along the elongated direction of the belt-like form of the $N^+$ emitter regions 45.

The gate insulating film 48 is provided on the inner wall of the trench 47 and the gate electrode 49 is buried inside the trench 47 to the opening in the surface of the $N^+$ emitter region 45. Accordingly, the gate electrode 49 faces the surface of the P base layer 44 through the gate insulating film 48 inside the trench 47 and the surface of the P base layer 44 to which the gate electrode 49 faces serves as a channel region 53. Adjacent ones of the trenches 47 are provided with the $N^+$ emitter regions 45 adjacent the trenches 47 and the exposed surface of the P base layer 44 between the $N^+$ emitter regions 45 interposed therebetween.

The surface of the gate electrode 49 is covered with the interlayer insulating film 50. The interlayer insulating film 50 is covered with the emitter electrode 51. The emitter electrode 51 is provided on the surface of the element where the $N^+$ emitter regions 45 and the P base layer 44 are provided so that the $N^+$ emitter regions 45 and the P base layer 44 are shorted. On the surface of the element, the gate interconnection 32 connected to the gate electrodes 49 and the gate pad 33 are provided, which are insulated from the $N^+$ emitter regions 45 and the P base layer 44. The collector electrode 52 is provided on the other surface of the $P^+$ collector layer 41.

By way of example, dimensions of parts of an element in the breakdown voltage 2000 V class are as follows; the thickness from the element surface, i.e., from the exposed surface of the P base layer 44 or the surface of the $N^+$ emitter region 45, to the boundary between the $N^-$ layer 42 and the $N^+$ buffer layer 46 is about 200 $\mu$m, the impurity concentration of the $N^-$ layer 42 is $5 \times 10^{13} cm^{-3}$, the interval between trenches 47 is about 4 $\mu$m and the depth of the trench 47 from the $N^+$ emitter region 45 surface is about 8 $\mu$m. The depths of the junction surface between the bottom of the $N^+$ emitter region 45 and the P base layer 44, the junction surface between the P base layer 44 and the N layer 43, and the junction surface between the N layer 43 and the $N^-$ layer 42 are, from the surface of the $N^+$ emitter region 45 or the P base layer 44, about 1 $\mu$m, about 3 $\mu$m and about 7 $\mu$m, respectively. The thickness of the $N^+$ buffer layer 46 is about 10 $\mu$m and the thickness of the $P^+$ collector layer 41 is about 300 $\mu$m.

Next, operation will be described. When a certain collector voltage $V_{CE}$ is applied between the emitter electrode 51 and the collector electrode 52 and a certain gate voltage $V_{GE}$ is applied between the emitter electrode 51 and the gate electrode 49, that is, when the gate is turned on, the channel region 53 is inverted to the N type to form a channel. Electrons are injected through this channel from the emitter electrode 51 via the N layer 43 into the $N^-$ layer 42. These injected electrons forward bias the $P^+$ collector layer 41 and the $N^-$ layer 42 through the $N^+$ buffer layer 46 and holes are injected into the $N^-$ layer 42 from the collector electrode 52 through the $P^+$ collector layer 41 and the $N^+$ buffer layer 46. As a result, the resistance of the $N^-$ layer 42 significantly decreases due to conductivity modulation and the current capacity of the IGBT increases.

While the holes injected into the $N^-$ layer 42 go through to the emitter electrode 51, the N layer 43 is provided between the $N^-$ layer 42 and the P base layer 44, intersecting the moving path of the holes between the trenches 47. Hence, movement of the holes to the P base layer 44 is restricted by the N layer 43 and the holes are accumulated in the $N^-$ layer 42 in the vicinity of the boundary between the $N^-$ layer 42 and the N layer 43, and then the $N^-$ layer 42 has such carrier distribution as that of a diode shown in FIG. 50. Thus, unlike the conventional IGBT, the carrier distribution of the $N^-$ layer 42 does not decrease on the emitter side, so the IGBT of this preferred embodiment has a lower on-state voltage as compared with the conventional IGBT.

Next, when the IGBT turns from the on state to the off state, the gate voltage $V_{GE}$ applied between the emitter electrode 51 and the gate electrode 49 is brought to 0V or reverse bias, that is, the gate is turned off, then the channel region 53 inverted into N type returns to P type, injection of electrons from the emitter electrode 51 is stopped and injection of holes from the $P^+$ collector layer 41 into the $N^-$ layer 42 is also stopped. Then the electrons and holes accumulated in the $N^-$ layer 42 go through to the collector electrode 52 or to the emitter electrode 51, respectively, or they are recombined and disappear.

While the N layer 43 is provided intersecting the path of the holes going through to the emitter electrode 51, a high voltage, e.g., 2000 V in this preferred embodiment, is applied as a collector voltage in the off state, unlike in the on state. Accordingly, the N layer 43 with such thickness will not serve as a barrier, not affecting movement of the holes. Accordingly, the current value capable of OFF will not decrease, and it is ensured at the same extent as the conventional IGBT.

Figure 4:
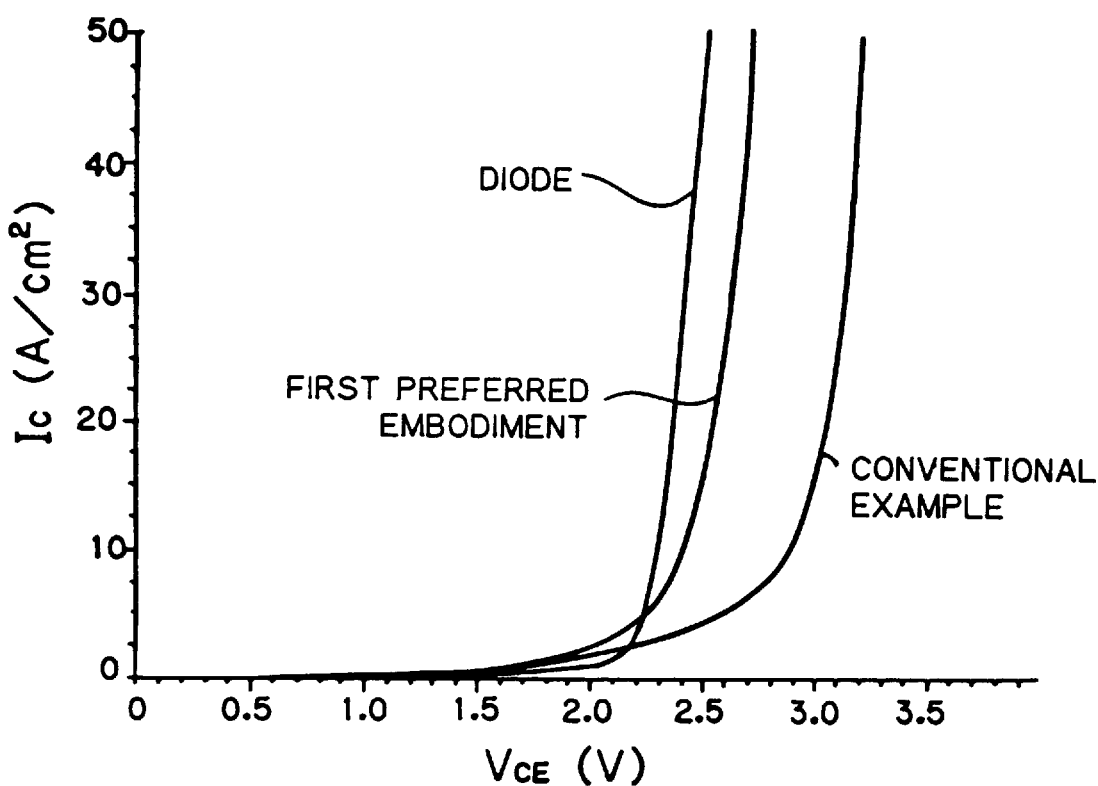
FIG. 4 is a graph showing the relation between the on-state voltage and the current.

FIG. 4 is a graph showing results of comparison by simulation of on-state voltages of the U-type IGBT of this preferred embodiment, the PIN diode and the conventional U-type IGBT.

In FIG. 4, reference character $V_{CE}$ is a collector voltage and $I_C$ is a collector current. For comparison, $V_f$ of the PIN diode, which is equivalent to the on-state voltage of the IGBT, was also calculated. In this PIN diode, a 1 $\mu$m thick $N^+$ layer was provided in the $N^-$ layer.

As can be seen from the graph of FIG. 4, at the current value 50 $A/cm^2$ as a rated current, the on-state voltage of the diode was 2.5 V, the on-state voltage of the IGBT with the N layer 43 of this preferred embodiment was 2.7 V and that of the conventional IGBT having no N layer 43 was 3.2 V, which shows that the $V_{CE(SAT)}$ of the IGBT provided with the N layer 43 was almost equal to the $V_f$ of the diode.

This way, according to this preferred embodiment, the simple structure in which the N layer 43 is provided between the N⁻ layer 42 and the P base layer 44 provides a U-type IGBT with undecreased off-capable current value and a decreased on-state voltage.

In this preferred embodiment, the end of the trench 47 slightly protrudes from the N layer 43. The breakdown voltage of the U-type IGBT is determined by the electric field distribution in the vicinity of the corner 56 of the end of the trench 47. Such structure of the trench 47 having its end slightly protruding from the N layer 43 enlarges a depletion layer in the transverse direction on application of the collector voltage to soften electric field concentration in the vicinity of the end corner 56 of the trench 47.

Particularly, while the effect of softening the electric field concentration in the vicinity of the end corner 56 of the trench 47 is not significant when the collector voltage is high as in this simulation conditions, it considerably affects when the collector voltage is relatively low as several hundred volts to ensure the breakdown voltage. Hence, making the end of the trench 47 slightly protrude from the N layer 43 provides a U-type IGBT with a breakdown voltage easy to ensure in the wide range of voltage classes from elements with relatively low voltage to elements with high voltage.

Next, an example of a method of manufacturing the U-type IGBT of this preferred embodiment will be described. FIG. 5 to FIG. 12 are fragmentary sectional views showing the element in the processes.

First, an N⁺ layer 61 and an N⁻ layer 62 are sequentially formed on a P⁺ silicon substrate 60 by epitaxial growth. Next, implant of N-type impurities is applied to the surface of the N⁻ layer 62 and the N-type impurities are diffused by annealing to form an N layer 63. Furthermore, P-type impurities are implanted into the surface of the N layer 63 and annealed to form a P base layer 64.

In this process, if impurity concentrations of the N⁻ layer 62, the N layer 63 and the P base layer 64 are taken as $C_2$, $C_3$, and $C_4$, respectively, applying implant and diffusion of the N-type impurities and P-type impurities so that $C_2<C_3<C_4$ facilitates implant of the P-type impurities and reduces the manufacturing time. (Refer to FIG. 5.)

Next, resist is deposited on the surface of the P base layer 64, which is formed into a resist pattern 65 having a plurality of parallel belt-like openings by photolithographic process, and using this resist pattern 65 as a mask, N-type impurities are implanted to a high concentration in the surface of the P base layer 64 and diffused by annealing to form the N⁺ emitter regions 66. (Refer to FIG. 6.)

Subsequently, an oxide film 67 as a barrier film is formed on the surface of the P base layer 64 and the N⁺ emitter regions 66, with which oxide film 67 a mask for silicon etching having belt-like openings at a width smaller than the N⁺ emitter reagin 66 is formed on the surface of the N⁺ emitter regions 66, and using this silicon etching mask as a mask, RIE (Reactive Ion Etching) is applied to form trenches 68 which extend from the N⁺ emitter region 66 surface to the N⁻ layer 62. (Refer to FIG. 7.) The oxide film 67 is then removed by etching.

Next, a thermal oxide film 69 is formed on the surface of the trenches 68, the P base layer 64 and the N⁺ emitter regions 66, and polysilicon 70 doped with N-type impurities is deposited on the oxide film 69 formed on the surface of the P base layer 64, the N⁺ emitter regions 66 and the trenches 68 to fill the trenches 68. (Refer to FIG. 8.)

Next, the deposited polysilicon 70 is etched back to the openings of the trenches 68, leaving the polysilicon 70 buried in the trenches 68. (Refer to FIG. 9.)

Next, BPSG 71 is deposited on the surface of the oxide film 69 on the surface of the P base layer 64 and the N⁺ emitter regions 66 and on the surface of the polysilicon 70 buried in the trenches 68. (Refer to FIG. 10)

Next, resist is deposited on the surface of the BPSG 71 to form a resist pattern 72 by photolithographic process which has zonal openings surrounding the surfaces of the P base layer 64 between adjacent trenches 68 and part of the N⁺ emitter regions 66 and parallel to the trenches 68, and using this resist pattern 72 as a mask, the BPSG 71 and the oxide film 69 are etched to form interlayer insulating films 71 on the surfaces of the polysilicon 70 buried in the trenches 68. (Refer to FIG. 11.)

Subsequently, Al—Si is deposited on the element surface where the P base layer 64, the N⁺ emitter regions 66 and the interlayer insulating films 71 are provided so that the P base layer 64 and the N⁺ emitter regions 66 exposed by the etching are shorted, and thus the emitter electrode 73, the gate interconnection connected to the polysilicon 70 in the trenches 68 and the gate pad are simultaneously formed. (Refer to FIG. 12.) Furthermore, a drain electrode is formed on the surface of the P⁺ substrate 60.

By adopting such manufacturing processes, the U-type IGBT of this preferred embodiment can be manufactured at low cost.

<Second Preferred Embodiment>

Figure 13:
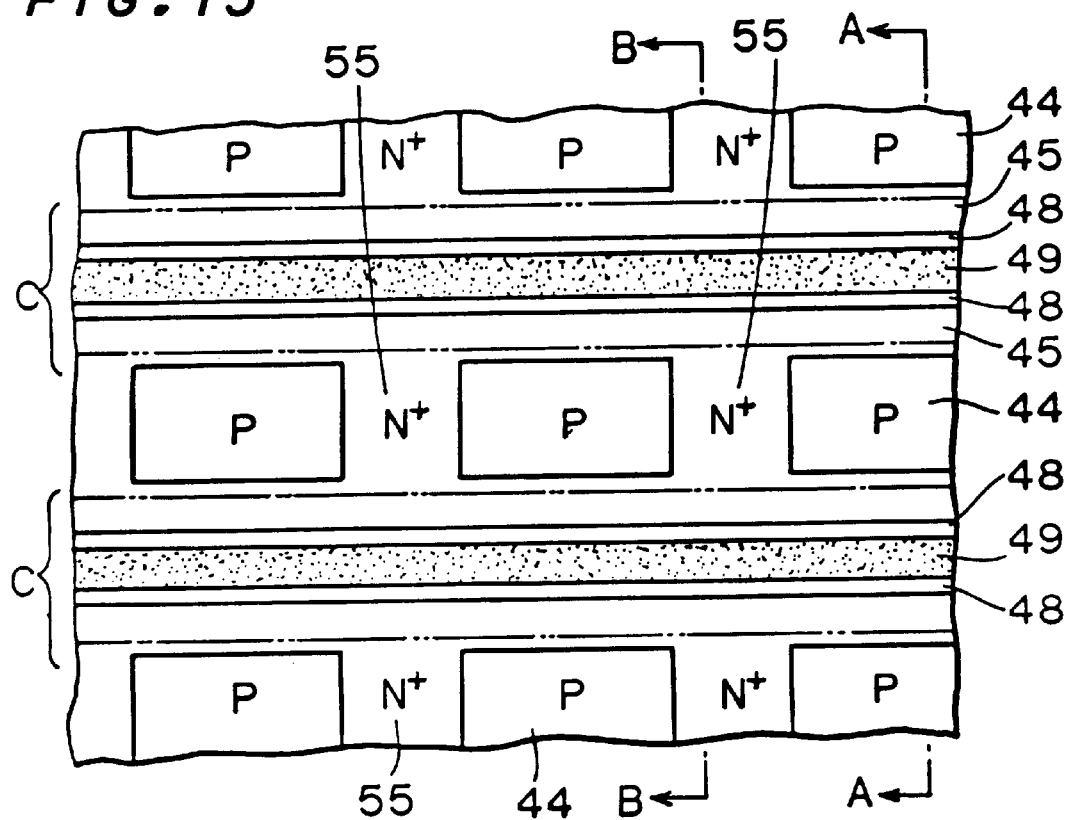
FIG. 13 is a fragmentary plan of an insulated gate semiconductor device of a second preferred embodiment.
Figure 14:
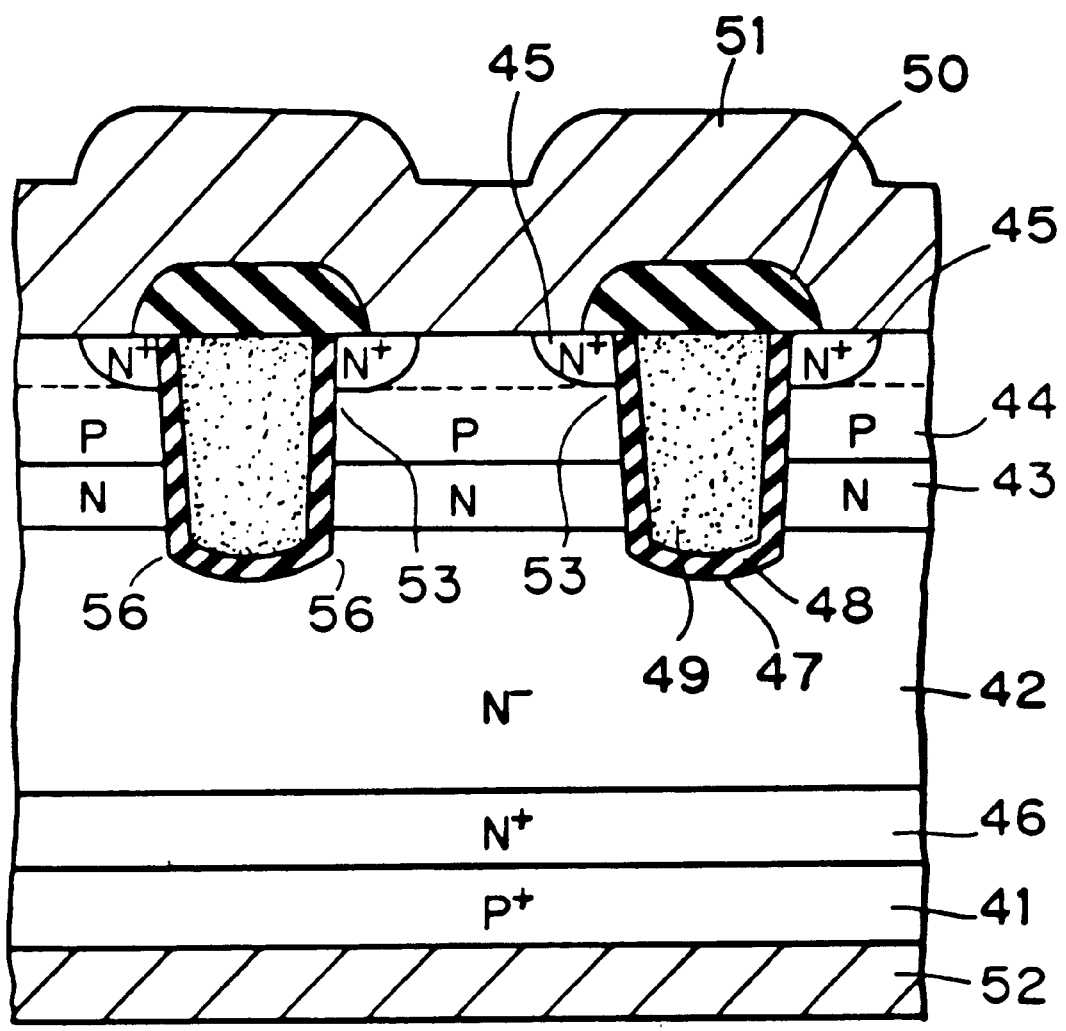
FIG. 14 is a fragmentary sectional view of the device of FIG. 13 taken along the section A—A.
Figure 15:
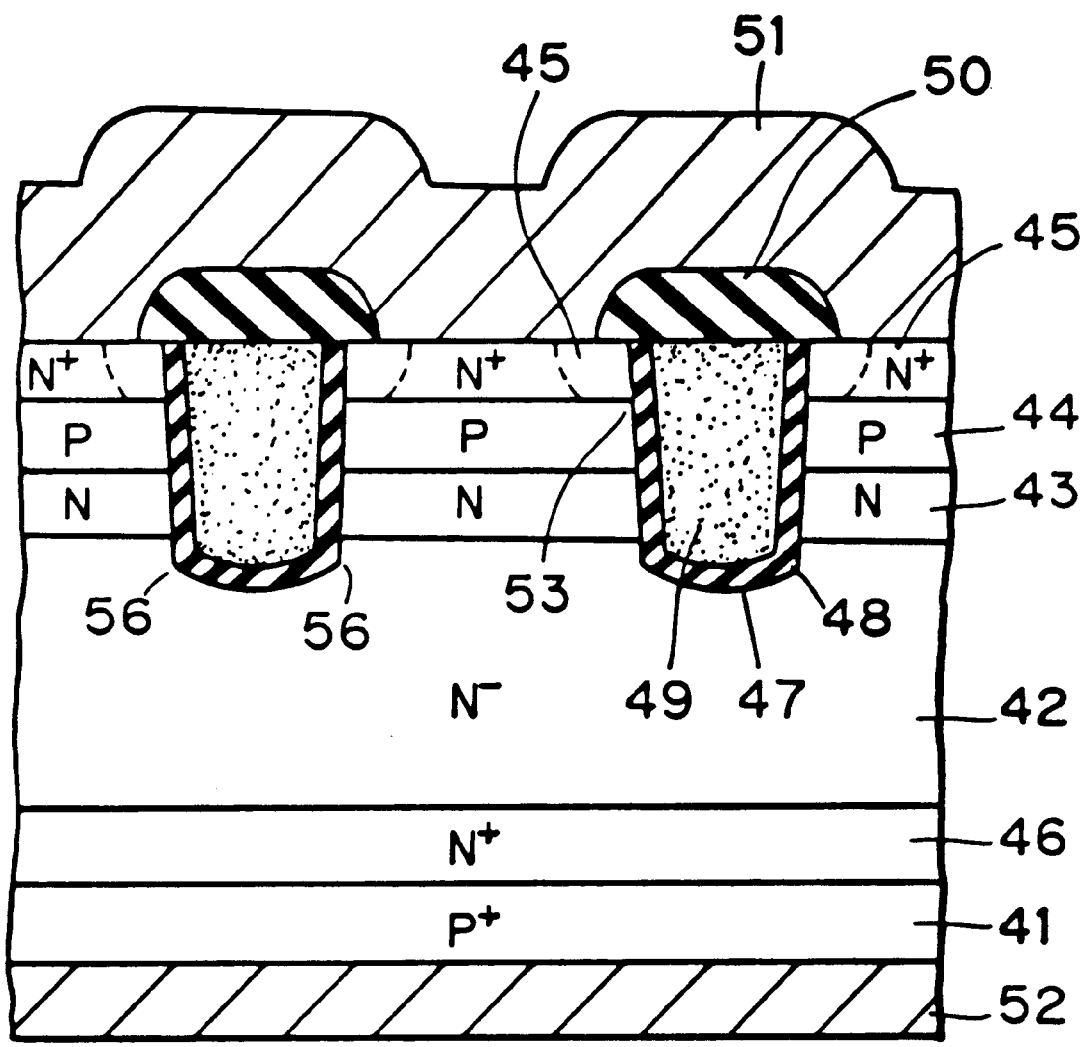
FIG. 15 is a fragmentary sectional view of the device of FIG. 13 taken along the section B—B.

FIG. 13 is a fragmentary plan view of a U-type IGBT of another preferred embodiment of the present invention, FIG. 14 is a fragmentary sectional view of a part of the cells shown in FIG. 13 taken along the section A—A, and FIG. 15 is a fragmentary sectional view of the part of cells shown in FIG. 13 taken along the section B—B. FIG. 13 is drawn with the emitter electrode 51 and the interlayer insulating film 50 removed therefrom. The regions C between the two-dot chain lines shown by the parentheses are regions to be covered by the interlayer insulating film 50.

In FIG. 13, FIG. 14 and FIG. 15, the plane configuration of the N⁺ emitter regions 15 45 formed between the trenches 47 is like a ladder in the U-type IGBT of this preferred embodiment. That is to say, with the N⁺ emitter regions 45 disposed in parallel like strips with the exposed surfaces of the P base region 44 interposed therebetween and the trenches having openings in the surface of the N⁺ emitter regions 45 extended along the elongated direction of the N⁺ emitter regions 45, the N⁺ emitter regions 45 between adjacent gate electrodes 49 are coupled by the coupling portions 55, with the exposed surfaces of the P base region 44 and the coupling portions 55 alternately disposed. The structure is the same as the U-type IGBT of the first preferred embodiment in other respects.

By forming the plane configuration of the N⁺ emitter regions 45 into a ladder in this way, a contact region where the emitter electrode 51 gets contact with the N⁺ emitter regions 45 and the P base region 44 can be taken in the coupling portions 55, which eliminates the need for considering misalignment of the mask when forming the contact regions. That is to say, it is not necessary to consider the margin for misalignment of the mask when forming the resist pattern 72 shown in FIG. 11 and the cell interval can be reduced, so that the cells can be miniaturized more as compared with the structure in which the N⁺ emitter regions 45 are formed simply along the gate electrodes 49 as shown in FIG. 2. It also allows the contact regions to be disposed in the entire element surface with good balance.

Accordingly, higher density of element can be realized and the on-state voltage can be reduced, and performance characteristics of the cells can be made uniform in the entire element.

<Third Preferred Embodiment>

Figure 16:
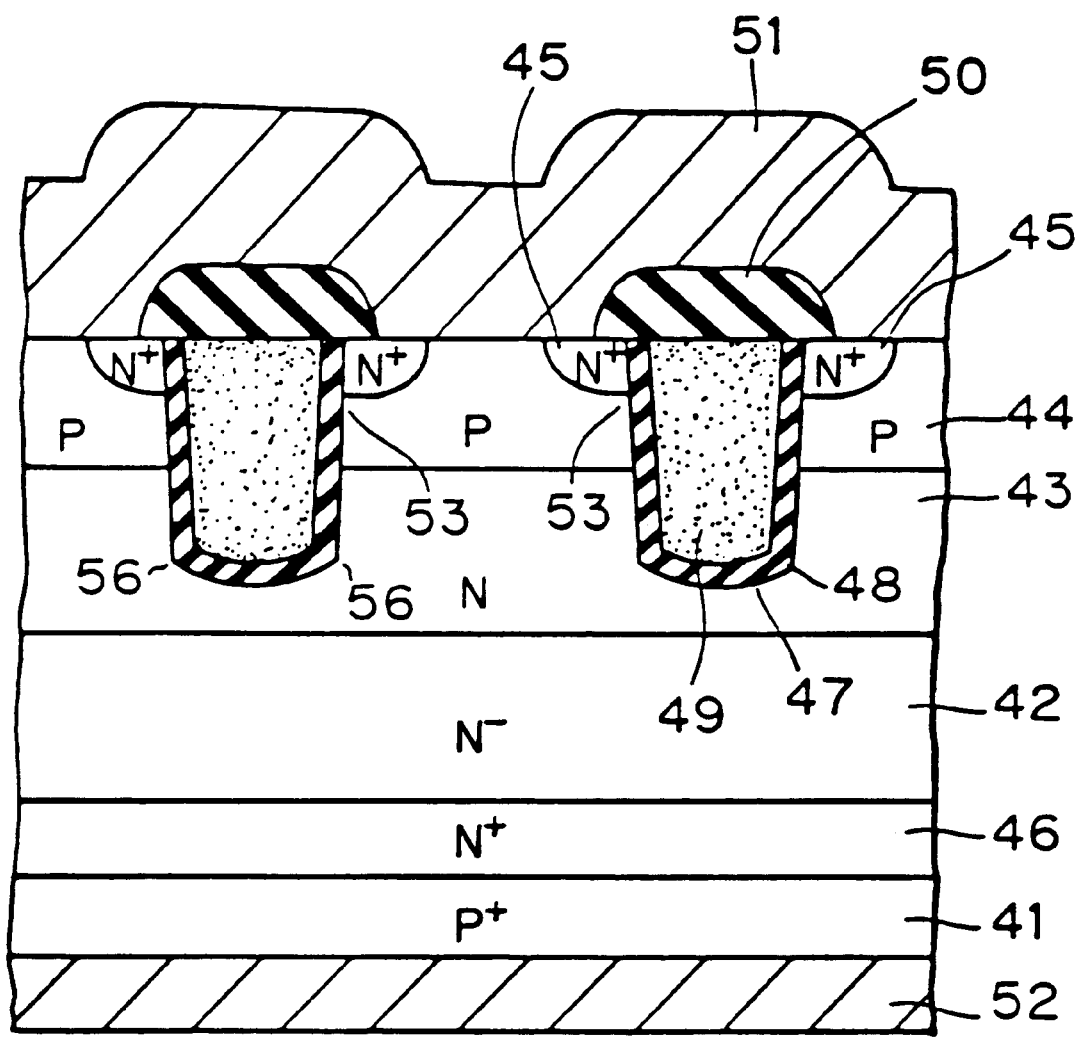
FIG. 16 is a fragmentary sectional view of an insulated gate semiconductor device of a third preferred embodiment.

FIG. 16 is a fragmentary sectional view of a U-type IGBT of still another preferred embodiment of the present invention. In FIG. 16, in this U-type IGBT of this preferred embodiment, the N layer 43 is made thicker so that the boundary between the N layer 43 and the N⁻ layer 42 is deeper than the end of the trench 47. The structure is the same as that of the first preferred embodiment in other respects.

Figure 50:
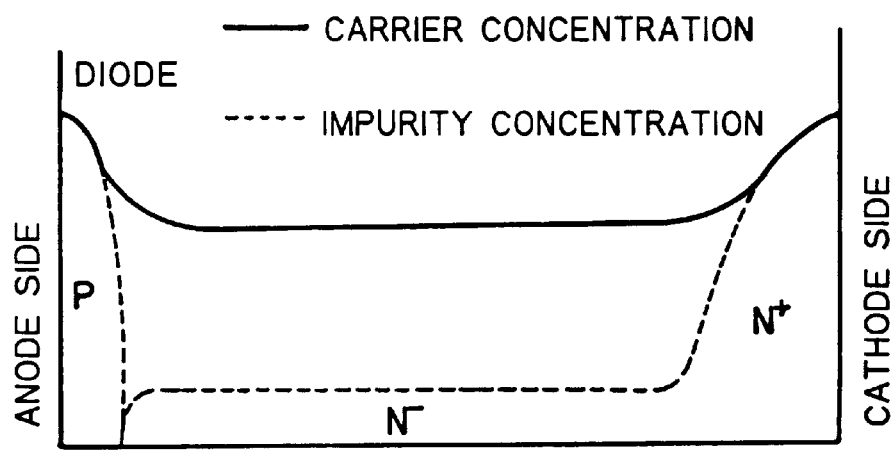
FIG. 50 is a graph showing the carrier concentration distribution of an $N^-$ layer of a PIN diode.
Figure 51:
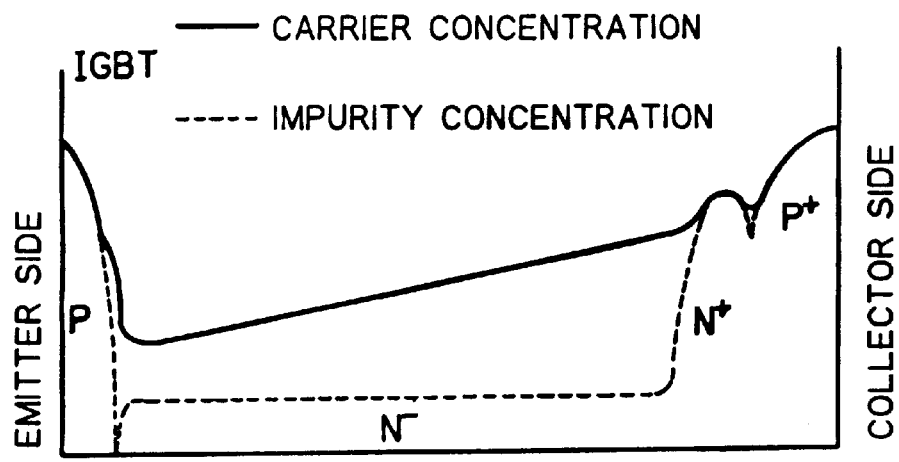
FIG. 51 is a graph showing the carrier concentration distribution of an $N^-$ layer of the conventional IGBT.
Figure 52:
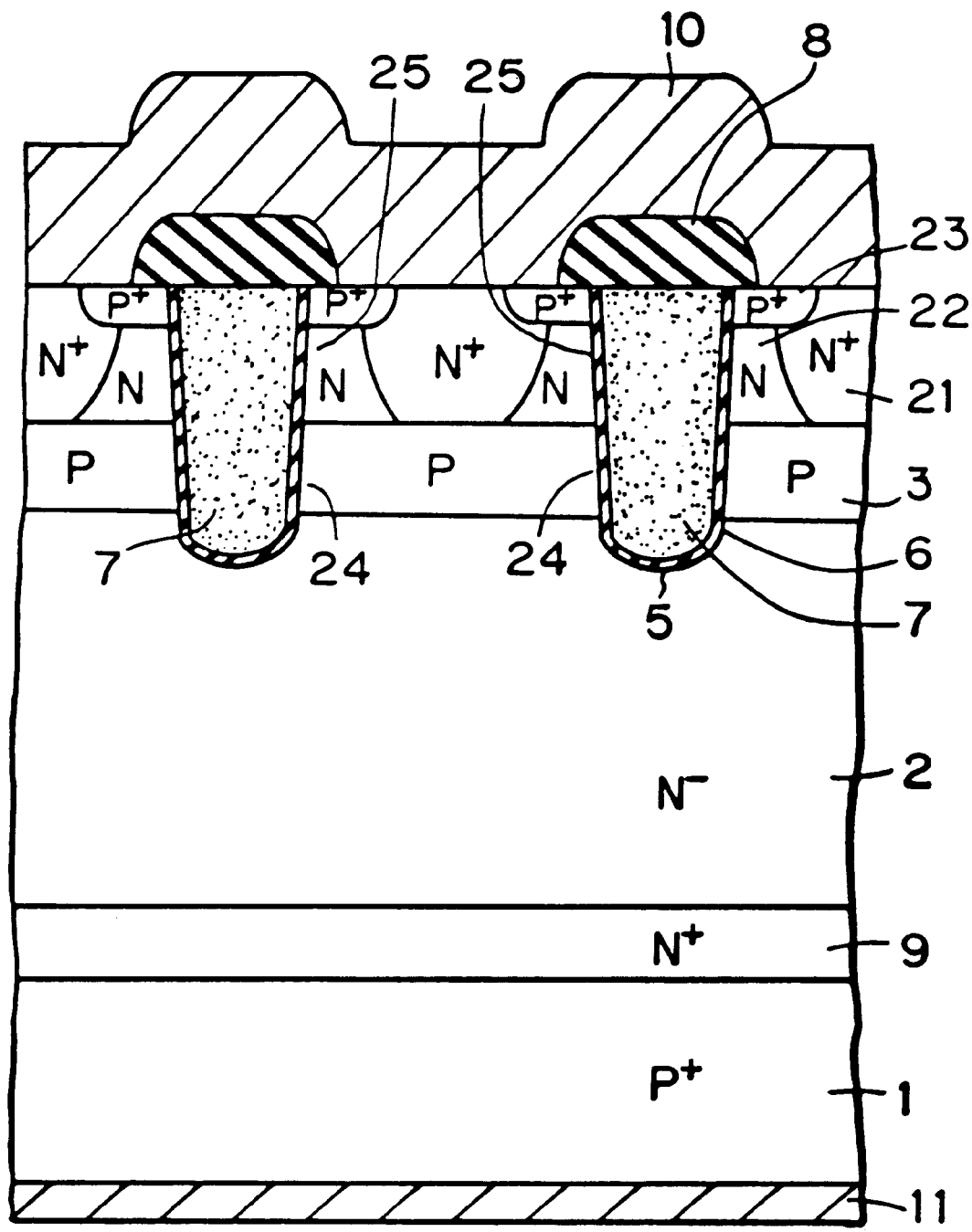
FIG. 52 is a fragmentary sectional view of a conventional insulated gate semiconductor device.

In this preferred embodiment, it is the same as the first preferred embodiment that, when holes injected into the N⁻ layer 42 in the on state go through to the emitter electrode 51, they are restricted by the N layer 43 in moving to the P base layer 44 and accumulated in the N⁻ layer 42 in the vicinity of the boundary between the N⁻ layer 42 and the N layer 43, with the result that the N⁻ layer 42 has carrier distribution similar to that of a diode shown in FIG. 50 and the on-state voltage becomes lower.

In this preferred embodiment, the on-state voltage is still lower because the N layer 43 with small resistance is thicker.

Figure 17:
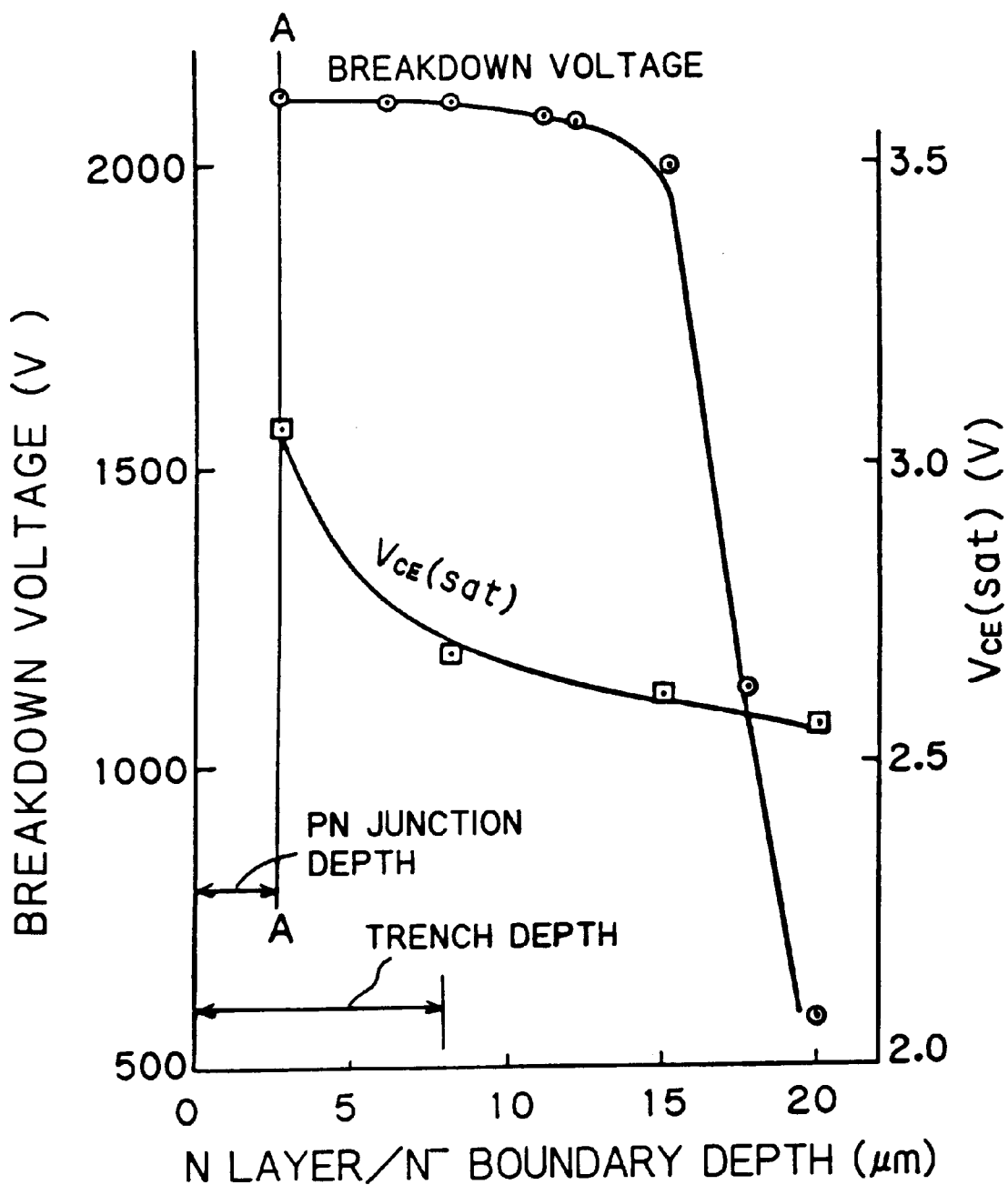
FIG. 17 is a graph showing the breakdown voltage and the on-state voltage of the device of FIG. 16.

FIG. 17 is a graph showing values of the breakdown voltage and the on-state voltage with respect to the depth of the boundary between the N⁻ layer 42 and the N layer 43. The horizontal axis shows the depth from the element surface, i.e., from the exposed surface of the P base layer 44 or from the surface of the N⁺ emitter region 45, to the boundary between the N⁻ layer 42 and the N layer 43, and the left vertical axis shows the breakdown voltage and the right vertical axis shows the on-state voltage $V_{CE(SAT)}$.

This simulation was conducted under the following conditions; the depth from the element surface, i.e., from the exposed surface of the P base layer 44 or from the surface of the N⁺ emitter region 45, to the boundary between the N⁻ layer 42 and the N⁺ buffer layer 46 was about 200 $\mu$m, the impurity concentration of this N⁻ layer 42 was $5\times10^{13}$cm⁻³, the interval between trenches 47 was about 4 $\mu$m and the depth of the trench 47 from the surface of the N⁺ emitter region 45 was about 8 $\mu$m.

In FIG. 17, A—A shows the depth of the boundary between the P base layer 44 and the N layer 43 from the element surface, and the values of the breakdown voltage and the on-state voltage on this line are values in the case where the boundary depth between the P base layer 44 and the N layer 43 and the boundary depth between the N⁻ layer 42 and the N layer 43 are the same, i.e., when the N layer 43 is not provided.

As can be seen from FIG. 17, the value of $V_{CB(SAT)}$ decreases with an increase in the thickness of the N layer 43 and the on-state voltage decreases in correspondence with the thickness of the N layer 43. The breakdown voltage, however, rapidly decreases when it exceeds a certain critical value of the thickness of the N layer 43. In this preferred embodiment, the breakdown voltage rapidly decreases when the boundary depth between the N⁻ layer 42 and the N layer 43 becomes about 8 $\mu$m deeper from the bottom of the trench 47. Hence, the on-state voltage can be decreased as low as possible by increasing the thickness of the N layer 43 as far as the breakdown voltage permits.

The case in which the N layer 43 is made in such a way that the boundary between the N layer 43 and the N⁻ layer 42 is deeper than the end of the trench 47 as in this preferred embodiment can be applied especially effectively to elements in the higher breakdown voltage class. That is to say, this is due to the fact that if the collector voltage in the off state is high, the electric field concentration in the vicinity of the end corner 56 of the trench 47 does not considerably affect the decrease in breakdown voltage even if the end of the trench 47 protrudes largely from the boundary between the P base layer 44 and the N layer 43.

Furthermore, as the breakdown voltage class is high, even if the N layer 43 becomes thicker in such a range that the breakdown voltage should not rapidly decrease, the N layer 43 does not work as a barrier to the movement of holes when it turns from the on state to the off state, so it does not affect the current drop when turning off. Accordingly, the structure of this preferred embodiment provides a U-type IGBT with a still lower on-state voltage.

Moreover, by making the N layer 43 thicker so that the boundary between the N layer 43 and the N⁻ layer 42 is deeper than the end of the trench 47 as in this preferred embodiment and forming the plane configuration of the N⁺ emitter regions 45 into the form like a ladder as in the second preferred embodiment, the cell density of the element can be made higher and performance characteristics of the element can be made uniform.

<Fourth Preferred Embodiment>

Figure 18:
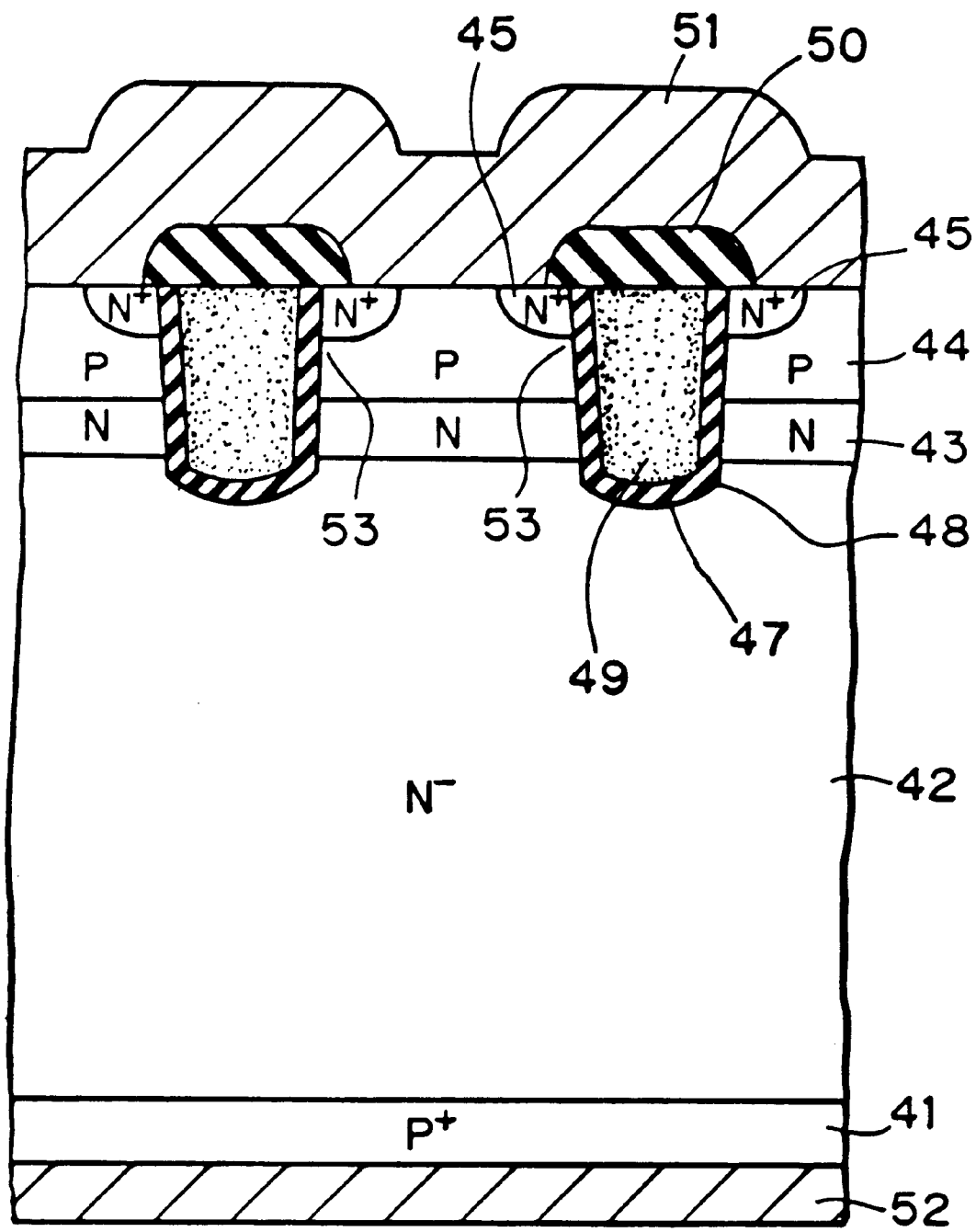
FIG. 18 is a fragmentary sectional view of an insulated gate semiconductor device of a fourth preferred embodiment.

FIG. 18 is a fragmentary sectional view of a U-type IGBT of still another preferred embodiment of the present invention. In FIG. 18, in this U-type IGBT, the N⁻ layer 42 is provided directly in contact with the P⁺ collector layer 41, the N⁻ layer 42 being thicker than a depletion layer which extends from the P base layer 44 when the collector voltage is applied.

In the case of elements in the high breakdown voltage class of 2000 V or more, the thickness of the N⁻ layer 42 for ensuring the breakdown voltage is rather large. Hence, it is not advantageous in cost to form the N⁻ layer 42 on the P⁺ substrate by epitaxial growth when manufacturing the element because the epitaxial growth requires a longer time. Accordingly, the manufacturing cost can be reduced by using an N⁻ silicon substrate.

Figure 19:
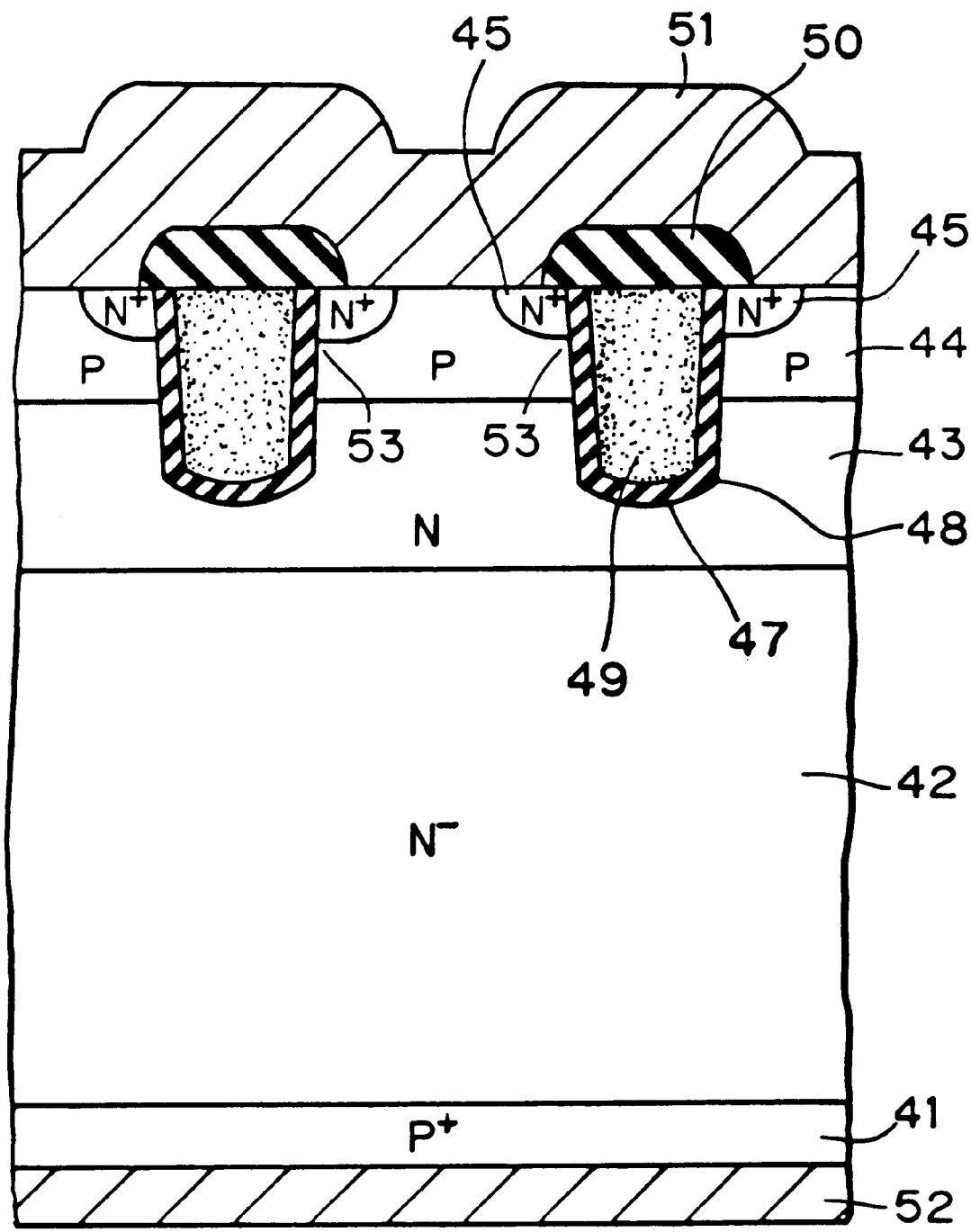
FIG. 19 is a fragmentary sectional view of a modified example of the device of FIG. 18.

FIG. 19 is a fragmentary sectional view of a modified example of the preferred embodiment of the insulated gate semiconductor device of FIG. 18. In the U-type IGBT of FIG. 19, the N⁻ layer 42 is provided directly in contact with the P⁺ collector layer 41, the N⁻ layer 42 being thicker than a depletion layer extending from the P base layer 44 on application of the collector voltage, and the N layer 43 is thicker so that the boundary between the N layer 43 and the N⁻ layer 42 is deeper than the end of the trench 47, which has the same effect as that of FIG. 18.

In this preferred embodiment, by forming the plane configuration of the N⁺ emitter regions 45 into a ladder as in the second preferred embodiment, the cell density of the element can be increased, the on-state voltage can be reduced, and he performance characteristics of the cells can be made uniform in the entire element.

Figure 20:
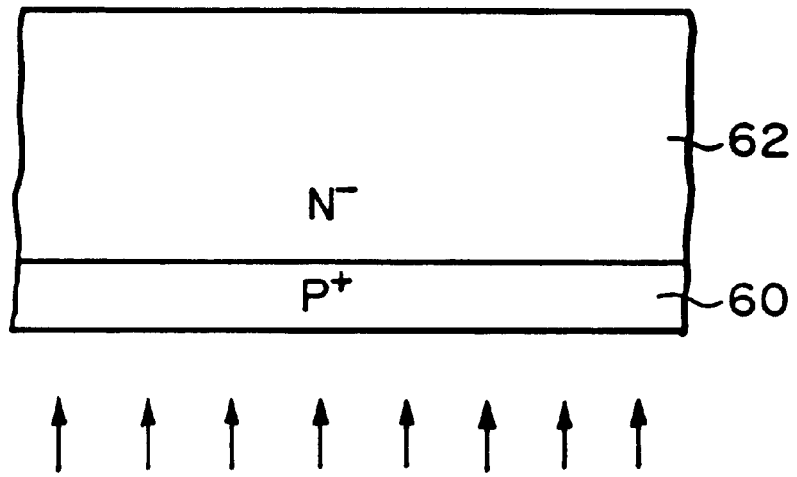
FIG. 20 is a manufacturing process diagram of the device of FIG. 18.

Next, an example of a method of manufacturing the U-type IGBT of this preferred embodiment will be described. FIG. 20 is a fragmentary sectional view showing the element in a manufacturing process of the method of manufacturing the U-type IGBT of this preferred embodiment. Here are shown parts different from those in the precesses in the manufacturing method shown in the first preferred embodiment.

First, P-type impurities are implanted into one main surface of an N⁻ silicon substrate 62 and diffused by annealing to form a P⁺ collector layer 60. (Refer to FIG. 20.)

Next, N-type impurities are implanted into the other main surface of the N⁻ silicon substrate 62 and diffused by annealing to form the N layer 63. Furthermore, P-type impurities are implanted into the surface of this N layer 63 and annealing is applied to form the P base layer 64. (Refer to FIG. 5.)

Figure 6:
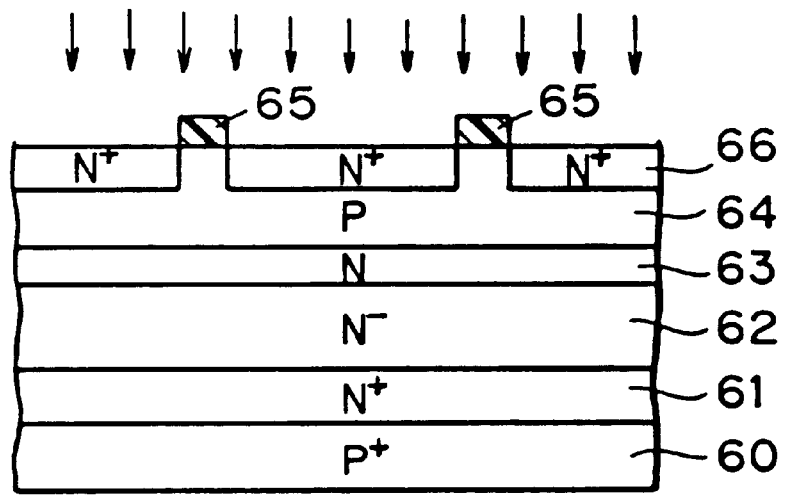
FIG. 6 is a manufacturing process diagram of the device of FIG. 1.

Following processes of and after forming the $N^+$ emitter regions 66 in the surface of the P base layer 64 are the same as the processes of and after FIG. 6 in the first preferred embodiment.

Figure 21:
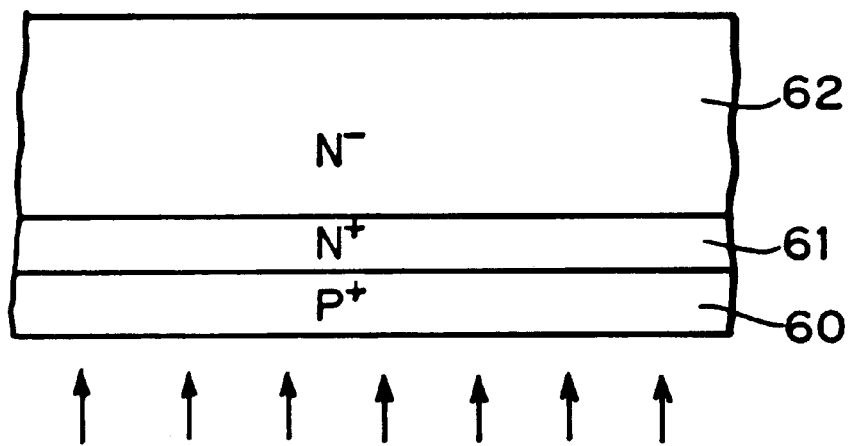
FIG. 21 is a manufacturing process diagram of the device of FIG. 18.

FIG. 21 is a fragmentary sectional view showing the element in a manufacturing process of a modified example of the U-type IGBT of this preferred embodiment. While the manufacturing method of FIG. 20 has shown the method in the case in which the $N^-$ layer 42 is formed directly in contact with the $P^+$ collector layer 41, the $N^+$ buffer layer 46 may be formed between the $P^+$ collector layer 41 and the $N^-$ layer 42. FIG. 21 shows the manufacturing method in this case.

In FIG. 21, first, N-type impurities are implanted into one main surface of the $N^-$ silicon substrate 62 and diffused by annealing to form the $N^+$ layer 61. P-type impurities are further implanted into the surface of the $N^+$ layer 61 and annealing is applied to form the $P^+$ layer 60. (Refer to FIG. 21.)

Next, N-type impurities are implanted into the other main surface of the $N^-$ silicon substrate 62 and diffused by annealing to form the N layer 63. Furthermore, P-type impurities are implanted into the surface of this N layer 63 and annealed to form the P base layer 64. (Refer to FIG. 5.)

The element manufacturing processes of and after forming the $N^+$ emitter regions 66 in the surface of the P base layer 64 are the same as the processes of and after FIG. 6 in the first preferred embodiment.

In the manufacturing process of this preferred embodiment, if the impurity concentrations of the $N^-$ layer 62, the N layer 63 and the P base layer 64 are respectively taken as $C_2$, $C_3$ and $C_4$, it is the same as the first preferred embodiment that implanting and diffusing the N-type impurities and P-type impurities so that $C_2 < C_3 < C_4$ facilitate implantation of the P-type impurities to reduce the manufacturing time.

This way, in this preferred embodiment, the manufacturing cost can be reduced by using an $N^-$ silicon substrate.

<Fifth Preferred Embodiment>

Figure 22:
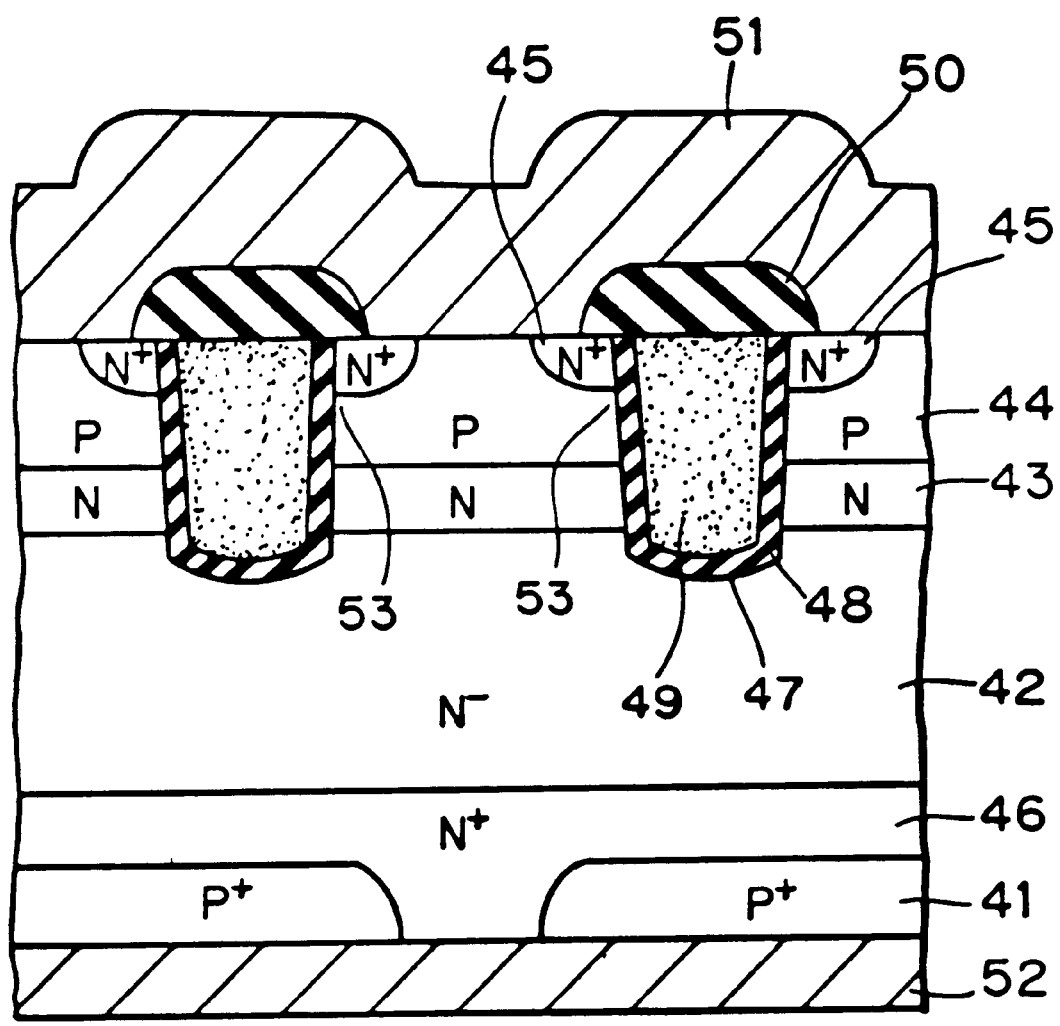
FIG. 22 is a fragmentary sectional view of an insulated gate semiconductor device of a fifth preferred embodiment.

FIG. 22 is a fragmentary sectional view of a U-type IGBT of still another preferred embodiment of the present invention. In FIG. 22, the $N^+$ buffer layer 46 extends through a part of the $P^+$ collector layer 41 to be exposed, and the exposed surface of the $N^+$ buffer layer 46 and the surface of the $P^+$ collector layer 41 are both in contact with the collector electrode 52 and shorted.

When the IGBT turns from the on state to the off state, injection of electrons from the emitter electrode 51 stops and injection of holes from the $P^+$ collector layer 41 to the $N^-$ layer 42 also stops, and then part of the electrons accumulated in the $N^-$ layer 42 go through to the collector electrode 52. At this time, if the exposed surface of the $N^+$ buffer layer 46 and the collector electrode 52 are shorted, the electrons can move to the collector electrode 52 quickly. The speed of the movement affects the speed of switching, and the speed of turning off the U-type IGBT can be increased.

Figure 23:
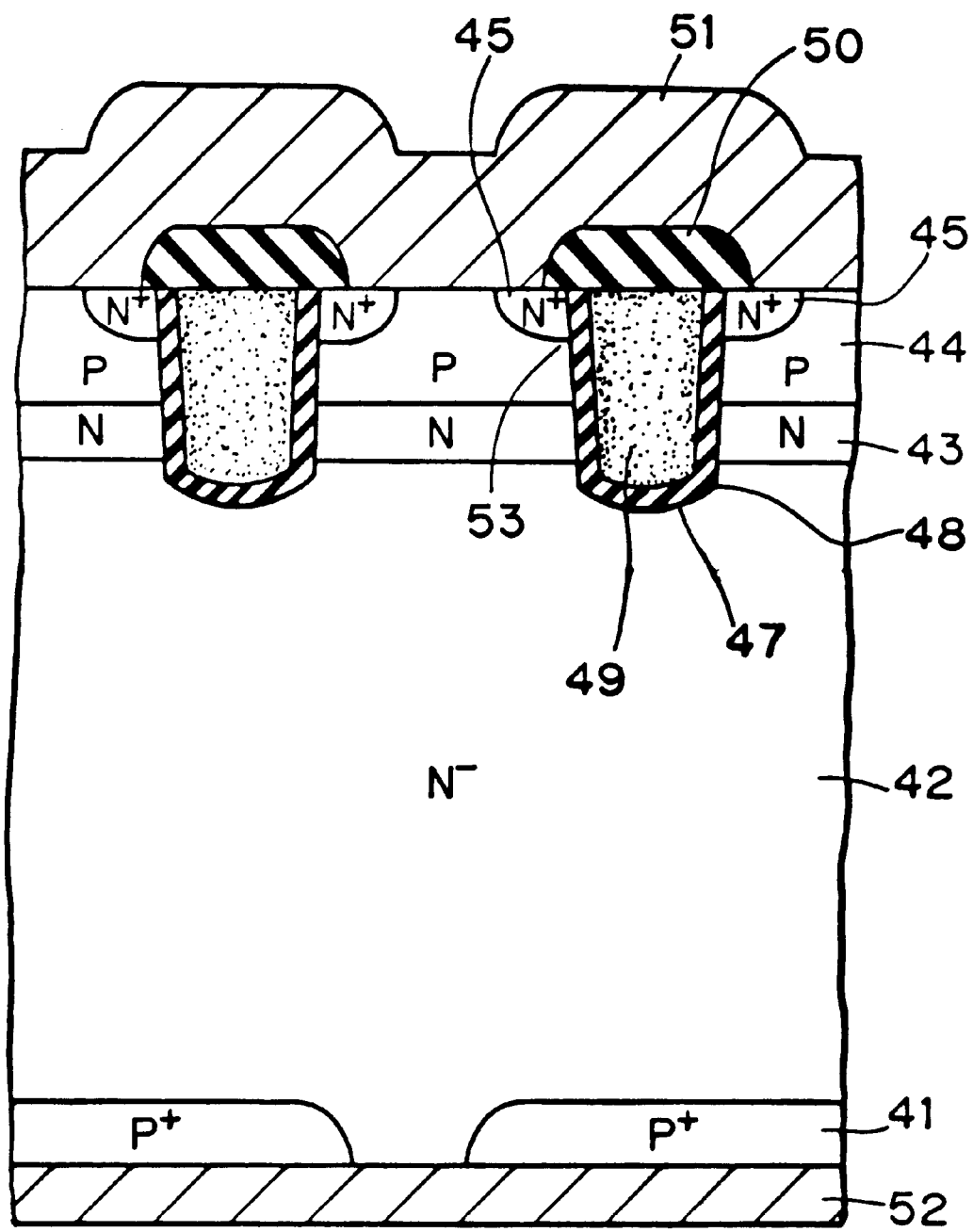
FIG. 23 is a fragmentary sectional view of a modified example of the device of FIG. 22.

FIG. 23 is a fragmentary sectional view of a U-type IGBT which is a modified example of this preferred embodiment. In this case, it is applied to the element with a rather thick $N^-$ layer 42 of the fourth preferred embodiment. In FIG. 23, the $N^-$ layer 42 extends through a part of the $P^+$ collector layer 41 and is exposed, and thus the exposed surface of the $N^-$ layer 42 and the surface of the $P^+$ collector layer 41 are both in contact with the collector electrode 52 and shorted.

In this case, like the preferred embodiment of FIG. 22, the electrons accumulated in the $N^-$ layer 42 can move to the collector electrode 52 quickly when the U-type IGBT turns off. This increases the turning-off speed of the U-type IGBT.

The U-type IGBT in which the $N^+$ buffer layer 46 or the $N^-$ layer 42 passes through part of the $P^+$ collector layer 41 to have an exposed surface as in this preferred embodiment can be manufactured at low cost by adopting the manufacturing method using an $N^-$ silicon substrate described in the fourth preferred embodiment.

Figure 24:
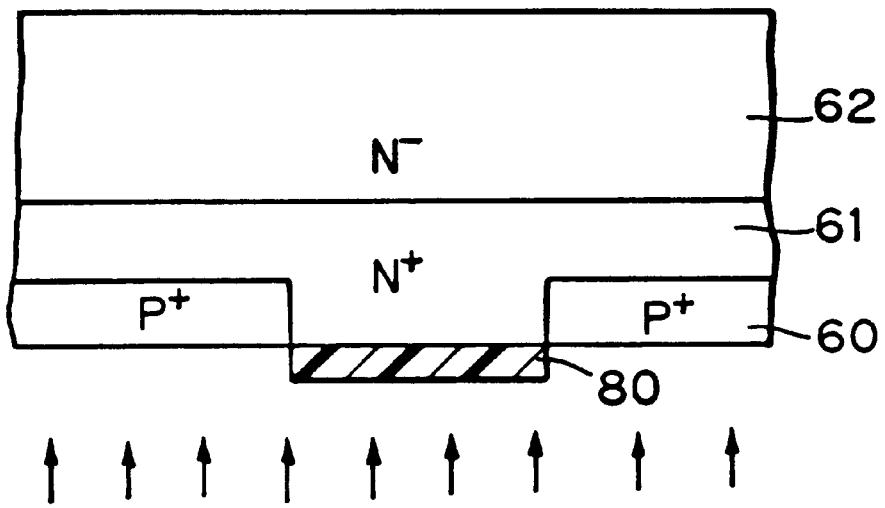
FIG. 24 is a manufacturing process diagram of the device of FIG. 22.

Next, an example of a manufacturing method of the U-type IGBT of this preferred embodiment will be described. FIG. 24 is a fragmentary sectional view of the element in the manufacturing process of the U-type IGBT of this preferred embodiment. Here are shown parts different from those in the processes of the manufacturing method shown in the fourth preferred embodiment.

In FIG. 24, first, N-type impurities are implanted into one main surface of the $N^-$ silicon substrate 62 and diffused by annealing to form the $N^+$ layer 61. Next, resist is deposited on the surface of the $N^+$ layer 61 and a resist pattern 80 having partial openings is formed by the photolithography process. Using this resist pattern 80 as a mask, P-type impurities are implanted to a high concentration into the surface of the $N^+$ layer 61 and diffused by annealing to selectively form the $P^+$ collector layer 60, leaving part of the surface of the $N^+$ layer 61 as an exposed surface.

Subsequently, processes of and after the process of forming the N layer 63 in the other main surface of the $N^-$ silicon substrate 62 are the same as those of the fourth preferred embodiment.

Figure 25:
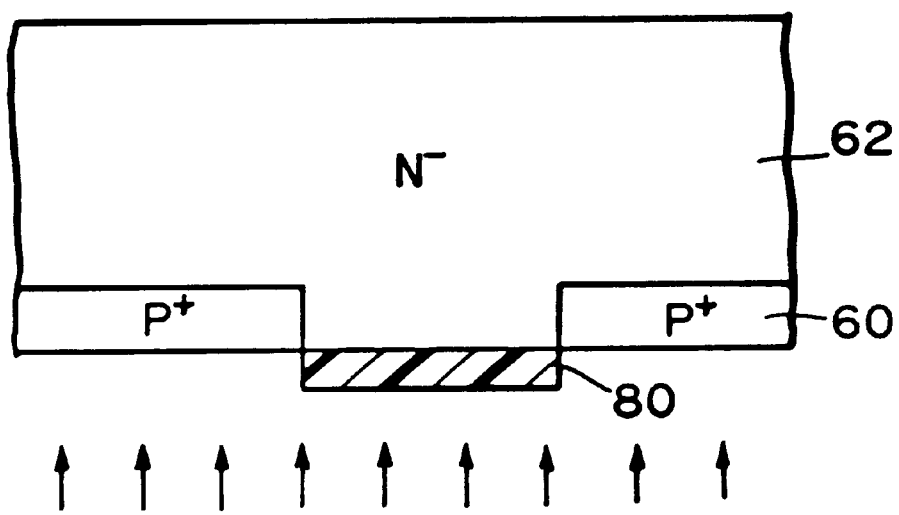
FIG. 25 is a manufacturing process diagram of the device of FIG. 23.

FIG. 25 is a fragmentary sectional view of the element in the manufacturing process of the modified example of the U-type IGBT of this preferred embodiment. In the manufacturing method of FIG. 25, the $P^+$ collector layer is directly formed in one main surface of the $N^-$ silicon substrate 62.

In FIG. 25, first, resist is deposited on one main surface of the $N^-$ silicon substrate 62 to form a resist pattern 80 having partial openings by photolithographic process. Using the resist pattern 80 as a mask, P-type impurities are heavily implanted into one main surface of the $N^-$ silicon substrate 62 and diffused by annealing to selectively form the $P^+$ collector layer 60 with the surface of the $N^-$ silicon substrate 62 partially left as an exposed surface.

After that, the processes of and after forming the N layer 63 in the other main surface of the $N^-$ silicon substrate 62 are the same as those in the fourth preferred embodiment.

By this manufacturing method, the U-type IGBT in which the $N^+$ buffer layer 46 or the $N^-$ layer 42 extends through part of the $P^+$ collector layer 41 to have an exposed surface can be manufactured at low cost.

<Sixth Preferred Embodiment>

Figure 26:
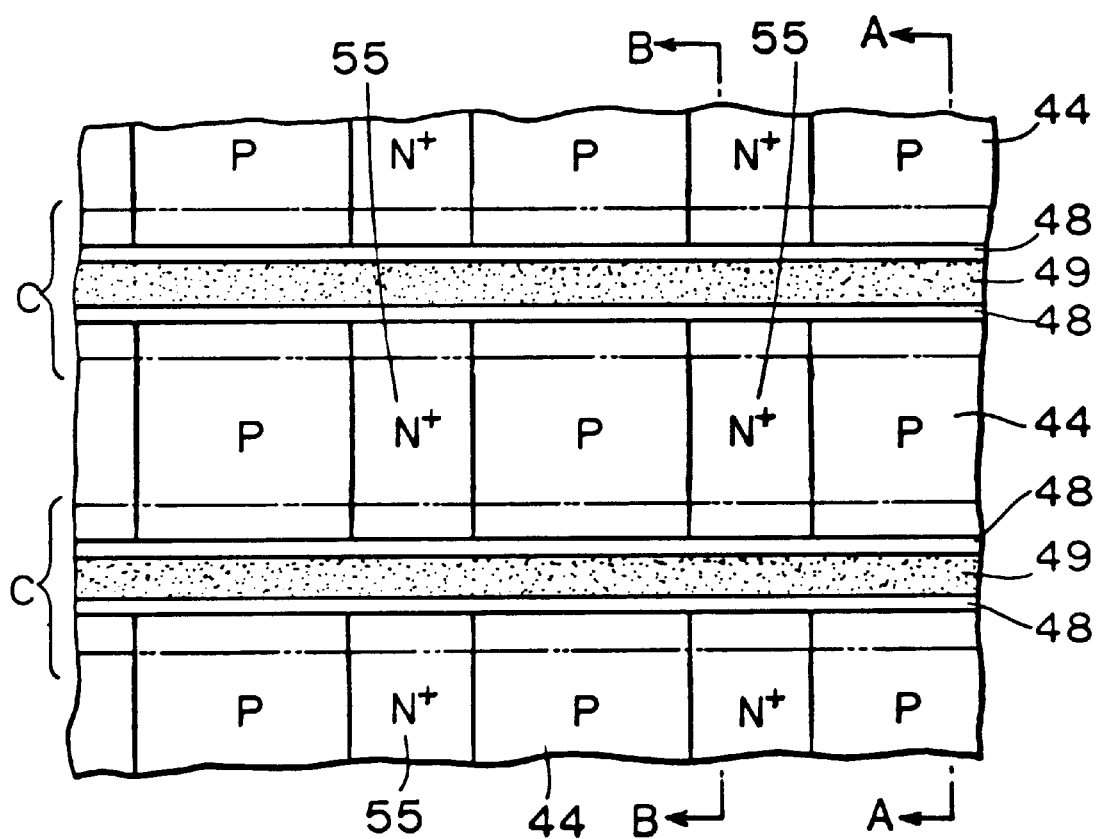
FIG. 26 is a fragmentary plan of an insulated gate semiconductor device of a sixth preferred embodiment.

FIG. 26 is a plan view of a U-type IGBT of still another preferred embodiment.

Figure 27:
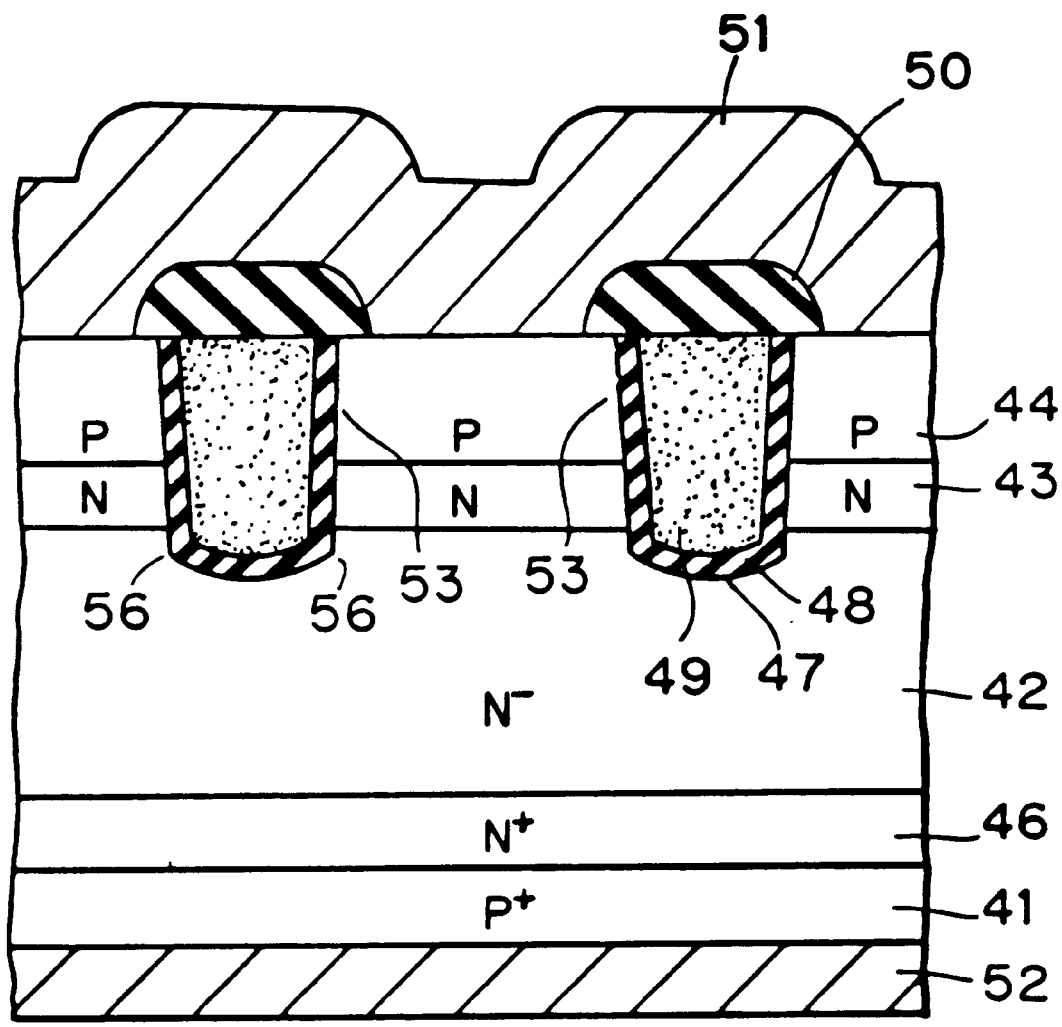
FIG. 27 is a fragmentary sectional view of the device of FIG. 26.
Figure 28:
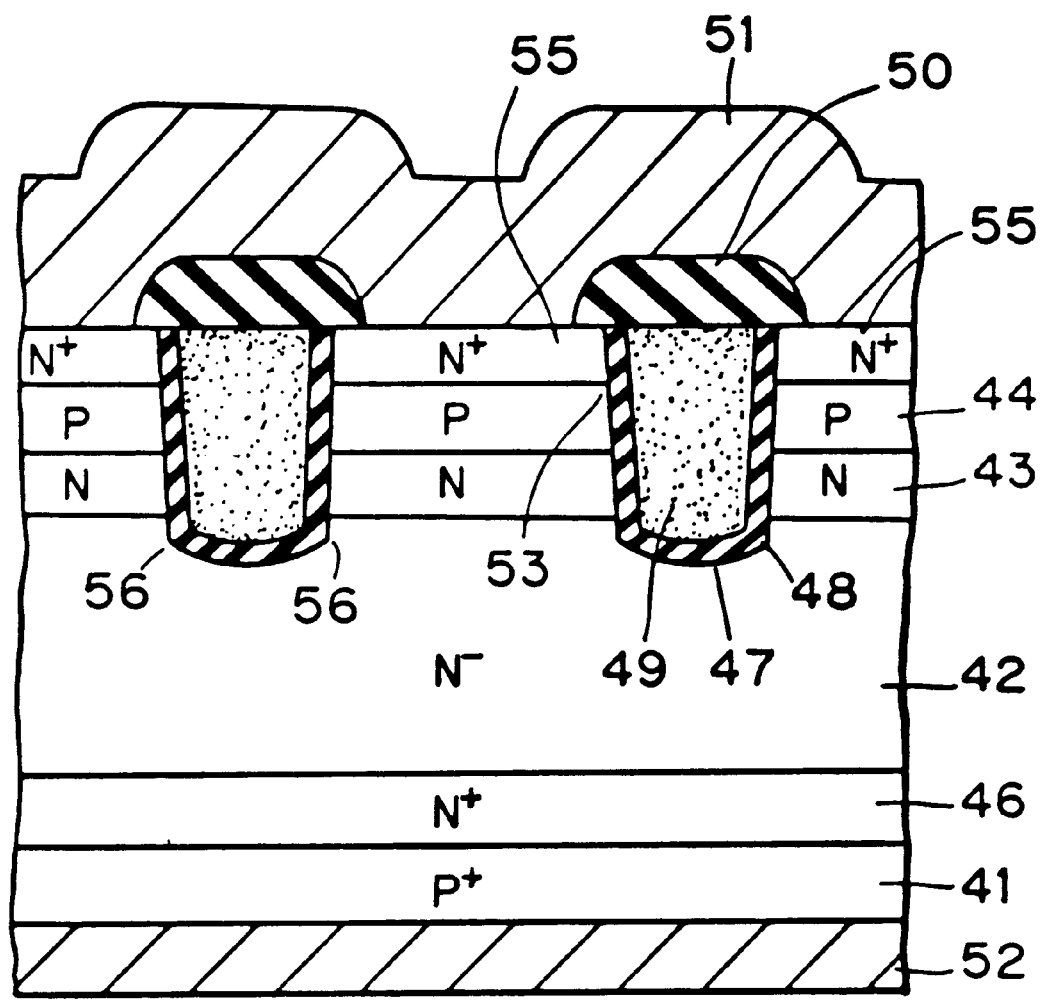
FIG. 28 is a fragmentary sectional view of the device of FIG. 26.

FIG. 27 and FIG. 28 are sectional views taken along the section A—A and the section B—B of FIG. 26, respectively. Like FIG. 13, FIG. 26 is also drawn with the emitter electrode 51 and the interlayer insulating film 50 removed therefrom. That is to say, FIG. 26 shows the upper main surface of the semiconductor substrate forming the U-type IGBT (the main surface on the side where the emitter electrode 51 is provided.) In FIG. 26, the regions C between the two-dot chain lines show regions to be covered with the interlayer insulating film 50.

As shown in these figures, the U-type IGBT characteristically differs from the device of the second preferred embodiment in that the $N^+$ emitter regions 45 (55) are formed like stripes perpendicular to the trenches 47. That is to say, the N+ emitter regions 45 are formed as if they had only the coupling portions 55. As a result, the P base layers 44 and the coupling portions 55 are exposed like alternately arranged belts in the top main surface of the semiconductor substrate.

In this device, the regions interposed between adjacent regions C in the top main surface of the semiconductor substrate, that is, the contact regions connected to the emitter electrode 51, cover both the P base layer 44 and the coupling portions 55 always in a certain area even if it shifts to either one of the adjacent two trenches 47. That is to say, the P base layer 44 and the N+ emitter regions 45 always in contact with the emitter electrode 51 in the certain area even if the mask pattern for forming the contact regions is shifted in position.

Accordingly, accuracy in positioning the mask pattern for forming the contact regions can be moderated. In addition, the mask pattern for forming the N− emitter regions 45 does not require positioning. As a result, the labor and cost required for production of the device are reduced. Furthermore, it is possible to reduce the interval between adjacent trenches 47, i.e., the cell interval, without considering margin for positional error of the mask pattern. That is to say, the advantage of facilitating miniaturization of cells is obtained.

Furthermore, when the device changes from the on state to the off state, since the P base layer 44 is in contact with the trench 47, holes charged with current can pass also through the portion of the P base layer 44 in contact with the trench 47 to the emitter electrode 51. That is to say, in this device, the width for current at the time of off is larger as compared with the devices of the first and second preferred embodiments. This provides the advantage that the current capable of turn-off is large. In other words, it is advantageous in that the RBSOA (Reverse Bias Safe Operation Area) of the device is high.

The N layer 43 affects RBSOA to reduce its magnitude, though only slightly. The device of this preferred embodiment enlarges the width for the current at the time of off to compensate for the slight minus effect of the N layer 43 on the RBSOA and provides further improvements.

Although FIG. 26 to FIG. 28 have shown an example in which the band-like N+ emitter regions 45 are formed perpendicular to the trenches 47, the same effects are produced if generally band-like N+ emitter regions 45 intersect the trenches 47 at a certain angle.

<Seventh Preferred Embodiment>

Figure 29:
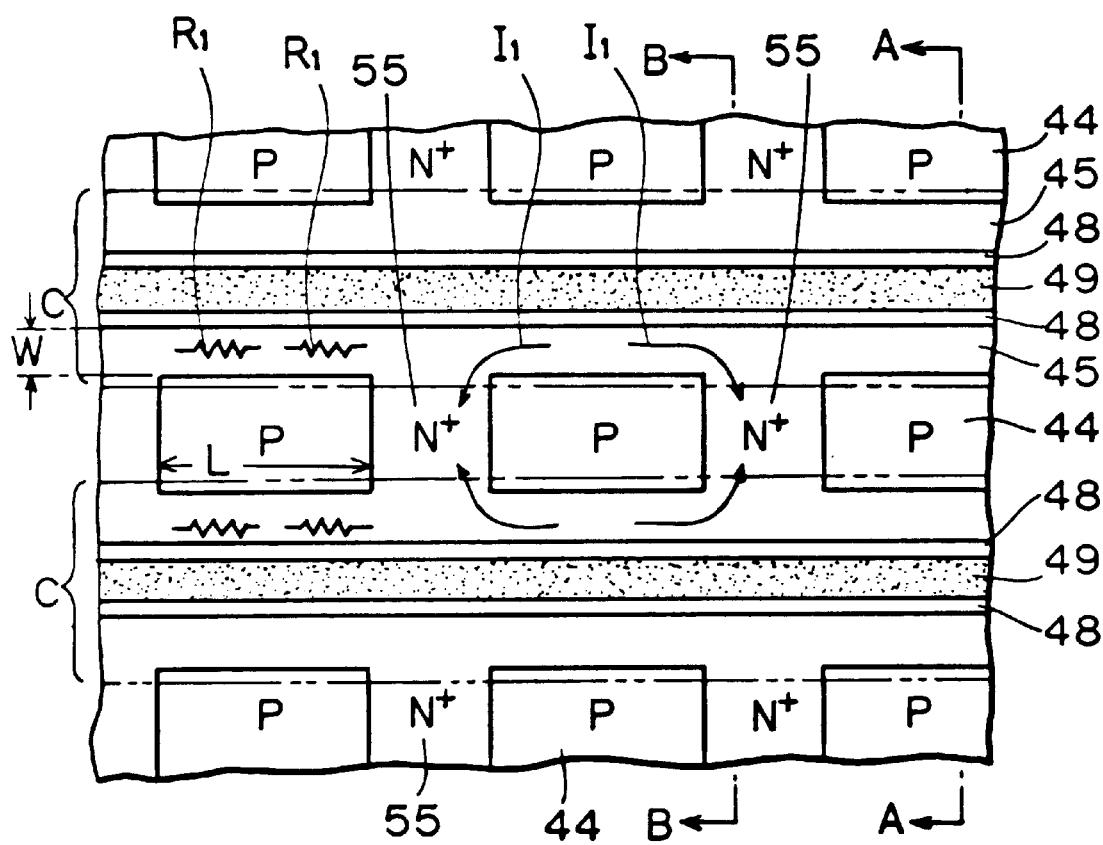
FIG. 29 is a fragmentary plan of an insulated gate semiconductor device of a seventh preferred embodiment.
Figure 31:
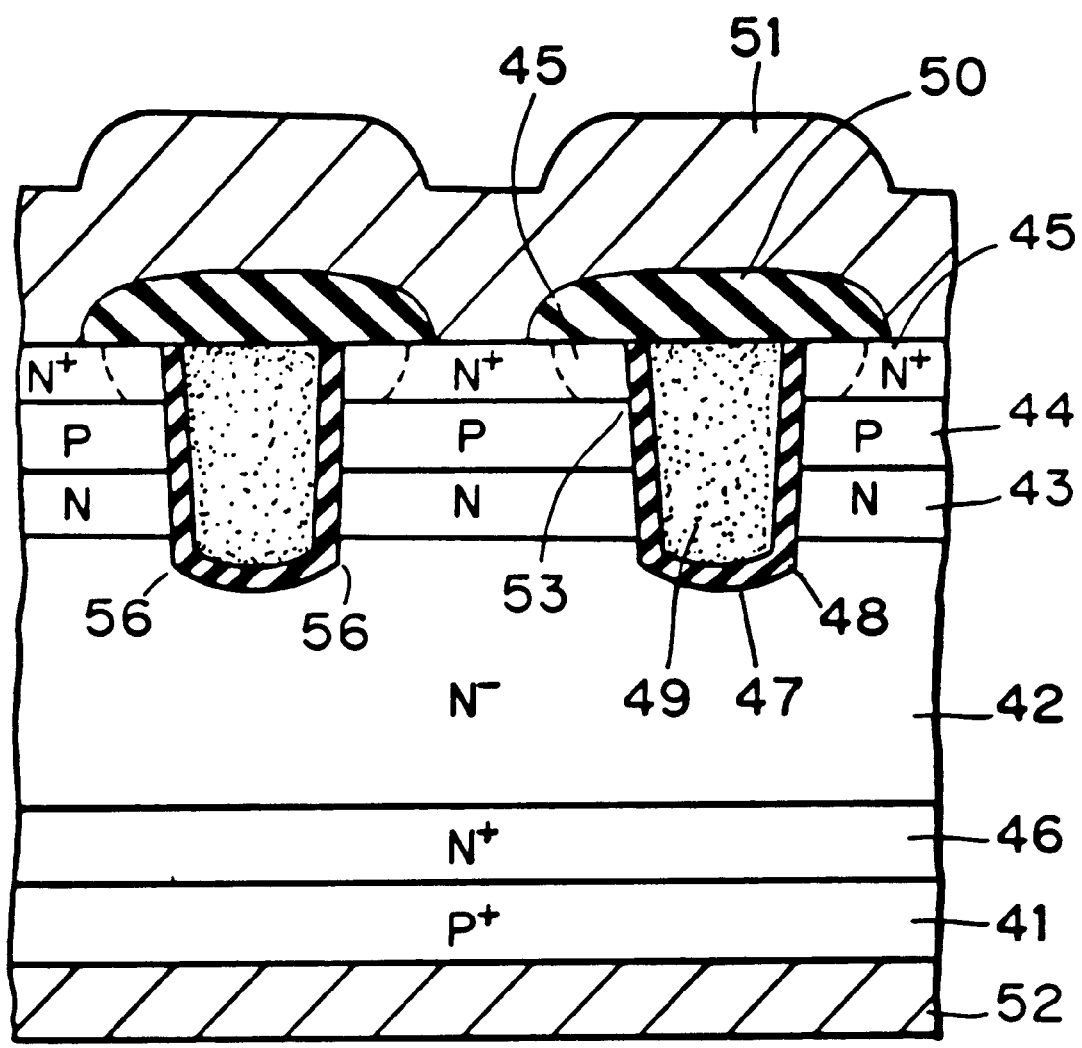
FIG. 31 is a fragmentary sectional view of the device of FIG. 29.

FIG. 29 is a plan view of a U-type IGBT of still another preferred embodiment. FIG. 30 and FIG. 31 are sectional views taken along the section A—A and the section B—B in FIG. 29, respectively. FIG. 29 shows the top main surface of a semiconductor substrate forming the U-type IGBT similarly to FIG. 26. In FIG. 29, the regions C between the two-dot chain lines show regions to be covered with the interlayer insulating film 50.

As shown in these figures, in this U-type IGBT, the P base layer 44 and the N+ emitter regions 45 are exposed in the top main surface of the semiconductor substrate in the same configuration as that in the device of the second preferred embodiment (FIG. 13). That is to say, the plane configuration of the N+ emitter regions 45 is ladder-shaped. However, unlike the device of the second preferred embodiment, the region C entirely covers the beltlike (zonal) portion along the trench 47 in the N+ emitter region 45, i.e., all of its portion except the coupling portions 55. In other words, the contact region interposed between adjacent regions C covers the N+ emitter region 45 only in the coupling portions 55.

Thus, connection between the emitter electrode 51 and the N+ emitter region 45 is made only in the coupling portions 55.

As a result, the current $I_1$ passing in the beltlike portion along the trench 47 in the N+ emitter region 45 flows in the direction along the trench 47 to reach the emitter electrode 51 via the coupling portion 55. That is to say, compared with the second preferred embodiment, the current $I_1$ flows in the N+ emitter region 45 for a longer distance to reach the emitter electrode 51. Accordingly, a larger voltage drop than that in the second preferred embodiment occurs in the N+ emitter region 45.

The magnitude of this voltage drop is defined by the magnitude of the lateral resistance $R_1$ in the direction along the trench 47 in the beltlike portion of the N+ emitter region 45. The magnitude of the lateral resistance $R_1$ becomes larger as the length L of the exposed surface of the P base layer 44 in the direction along the trench 47 becomes larger as compared with the width W of the beltlike portion of the N+ emitter region 45. By way of example, the length L is set to about 10–20 μm and the width W to about 1 μm. That is to say, the length L is far larger than the width W. In such a typical example, the lateral resistance $R_1$ is high and a considerable voltage drop is caused in the N+ emitter region 45.

The voltage drop increases as the current $I_1$ becomes larger. That is to say, a higher voltage drop takes place in a portion in which a larger current $I_1$ flows. This voltage drop further works to limit the current $I_1$. Accordingly, in the N+ emitter region 45, the current $I_1$ easily flows in the portion with a smaller current $I_1$ and a lower voltage drop, and conversely, the current $I_1$ does not flow readily in the portion with a larger current $I_1$ and a higher voltage drop.

In this way, the magnitude of the current $I_1$ flowing in the N+ emitter region 45 is made uniform over the entire device. That is to say, this device moderates or eliminates the unevenness in magnitude of current by utilizing the lateral resistance $R_1$. The magnitude of current is made uniform and then the current capable of turn-off becomes larger. That is to say, similarly to the device of the sixth preferred embodiment, this device also provides the advantage of improving RBSOA.

<Eighth Preferred Embodiment>

Figure 32:
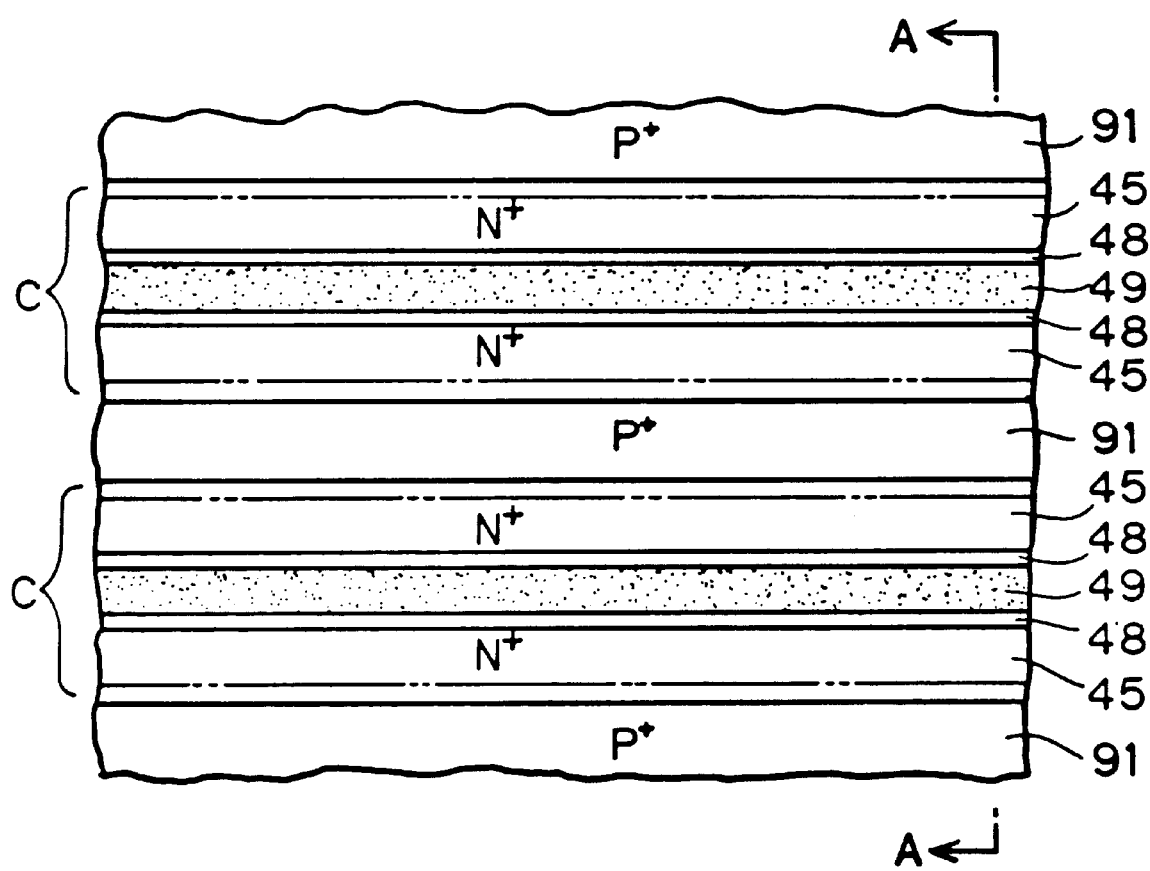
FIG. 32 is a fragmentary plan of an insulated gate semiconductor device of an eighth preferred embodiment.
Figure 33:
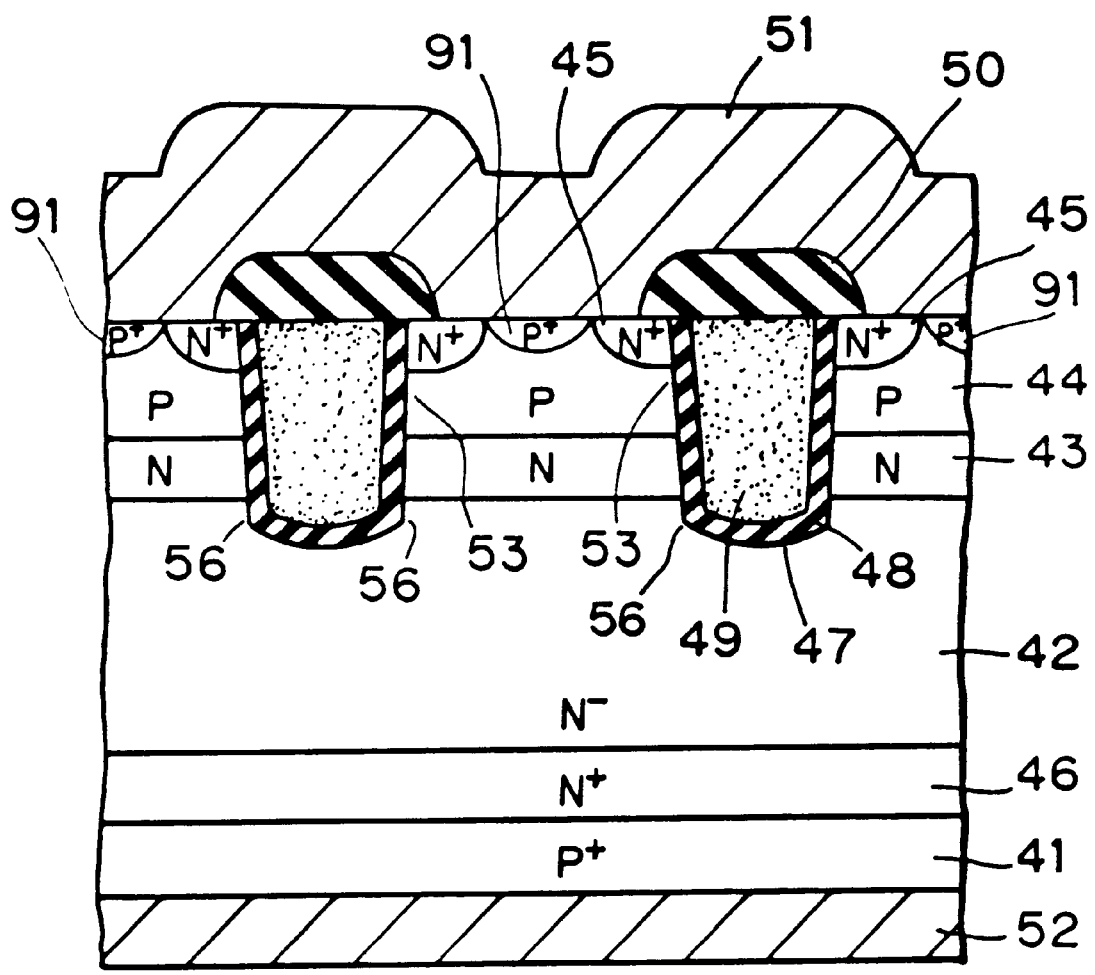
FIG. 33 is a fragmentary sectional view of the device of FIG. 32.

FIG. 32 is a plan view of a U-type IGBT of still another preferred embodiment. FIG. 33 is a sectional view in the section A—A in FIG. 32. FIG. 32, like FIG. 26, shows the top main surface of a semiconductor substrate forming the U-type IGBT. In FIG. 32, the regions C between the two-dot chain lines show regions to be covered with the interlayer insulating film 50.

As shown in these figures, the U-type IGBT is characteristically different from the device of the first preferred embodiment (FIG. 2 and FIG. 3) in that a P+ layer 91 containing P-type impurities to a higher concentration than that in the P base layer 4 is formed in the region of the P base layer 44 exposed in the top main surface of the semiconductor substrate, i.e., in the exposed surface of the P base layer 44.

The formation of the P+ layer 91 reduces the contact resistance between the P base layer 44 and the emitter electrode 51 and also reduces the potential barrier therebetween. Accordingly, holes invading the P base layer 44 can readily go through to the emitter electrode 51. As a result, the current can easily flow and the value of the current capable of turn-off increases. That is to say, like the devices of the sixth and seventh preferred embodiments, this device also provides the advantage of improving the RBSOA.

The concentration of P-type impurities contained in the P+ layer 91 is preferably set to a value close to the concentration of N-type impurities in the N+ emitter region 45.

Although FIG. 32 and FIG. 33 have shown an example in which the N+ emitter regions 45 are zonally formed and the P+ layer 91 is thus also formed zonally, the same effects are produced generally if the P+ layer 91 is formed in the exposed surface of the p base layer 44. For example, the P+ layer 91 may be formed in the exposed surface of the P base layer 44 of the device of the second preferred embodiment (FIG. 13).

Figure 34:
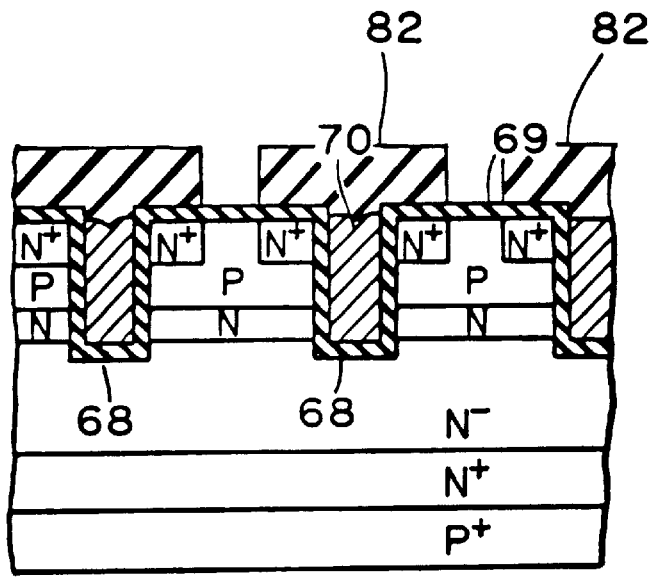
FIG. 34 is a manufacturing process diagram of the device of FIG. 32.
Figure 35:
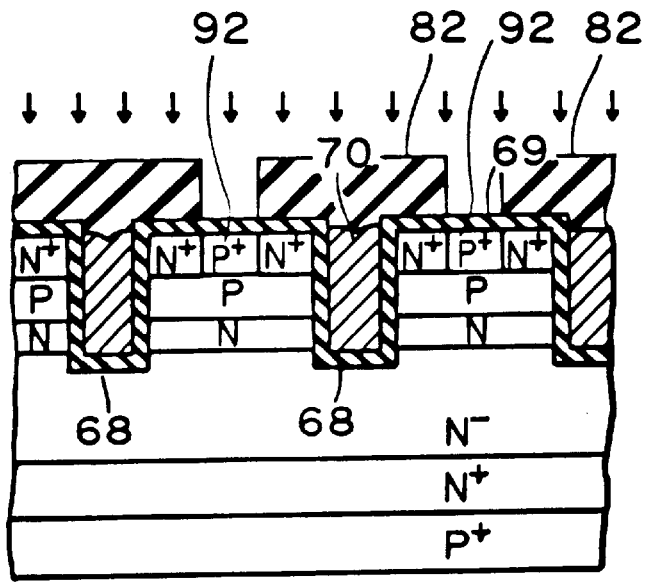
FIG. 35 is a manufacturing process diagram of the device of FIG. 32.

Next, a method of manufacturing the device of this preferred embodiment will be described. FIG. 34 and FIG. 35 are process diagrams showing an example of a method of manufacturing this device. In this example, the processes shown in FIG. 5 to FIG. 9 are performed first.

Subsequently, as shown in FIG. 34, a resist pattern 82 selectively opening in the exposed surfaces of the P base layer 64 arranged like a plurality of parallel belts is formed on the oxide film 69 and the polysilicon 70. Like the resist pattern 65 shown in FIG. 6, the resist pattern 82 is obtained by forming resist like a layer over the entire surface of the oxide film 69 and the polysilicon 70 and then selectively forming openings using photolithography.

Figure 10:
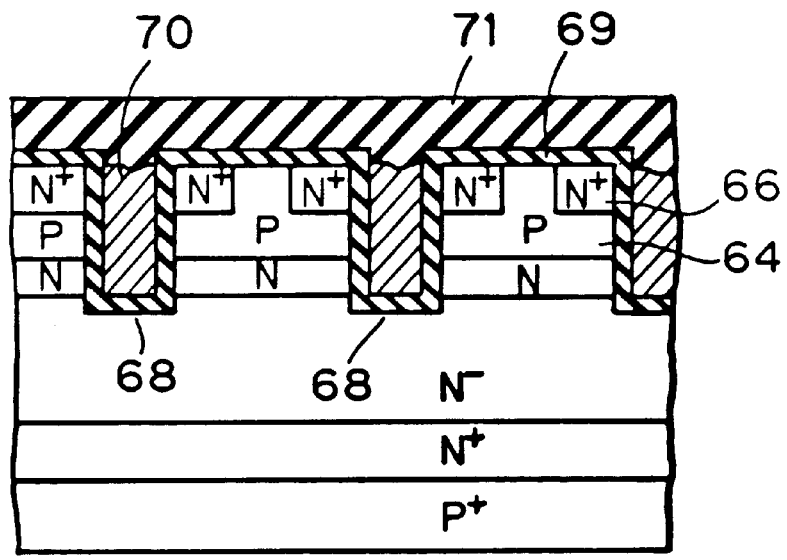
FIG. 10 is a manufacturing process diagram of the device of FIG. 1.
Figure 11:
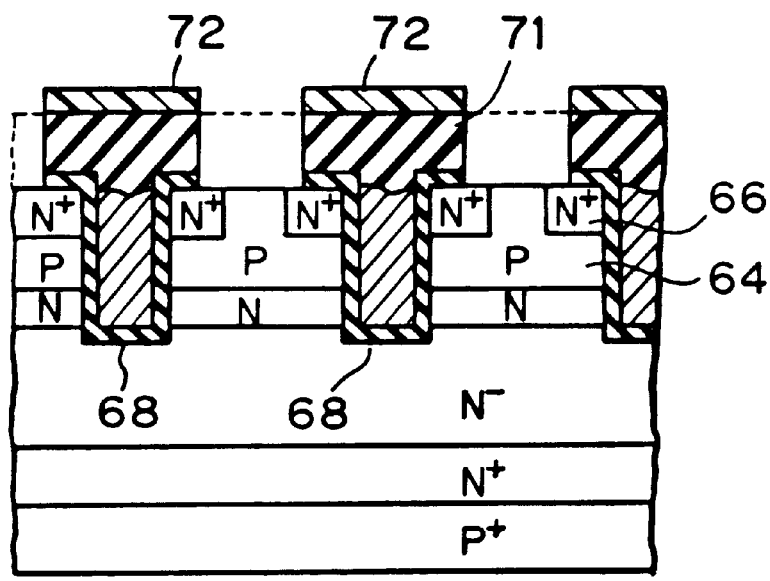
FIG. 11 is a manufacturing process diagram of the device of FIG. 1.
Figure 12:
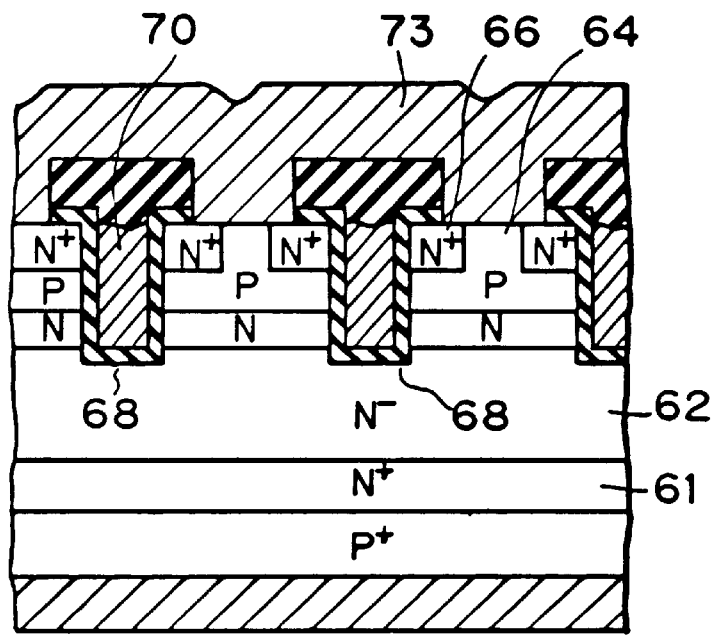
FIG. 12 is a manufacturing process diagram of the device of FIG. 1.

Next, as shown in the process diagram of FIG. 35, using the resist pattern 82 as a mask, P-type impurities are selectively implanted into the exposed surfaces of the P base layer 64 to form the P+ layers 92. Subsequently, after removing the resist pattern 82, annealing is applied to diffuse the implanted P-type impurities. Then, the processes of FIG. 10 to FIG. 12 are performed to obtain the device shown in FIG. 32 and FIG. 33.

Figure 5:
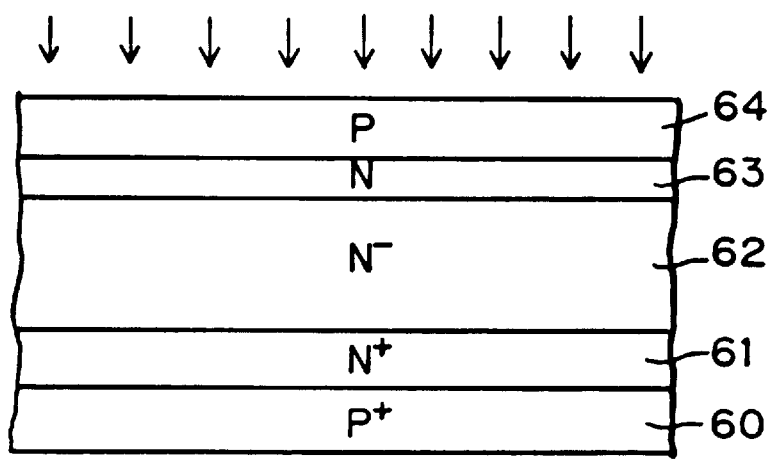
FIG. 5 is a manufacturing process diagram of the device of FIG. 1.
Figure 36:
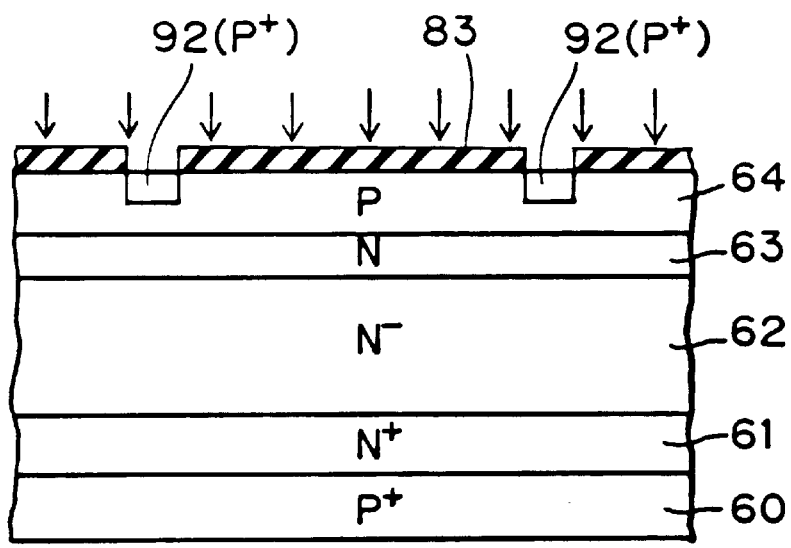
FIG. 36 is a manufacturing process diagram of the device of FIG. 32.
Figure 37:
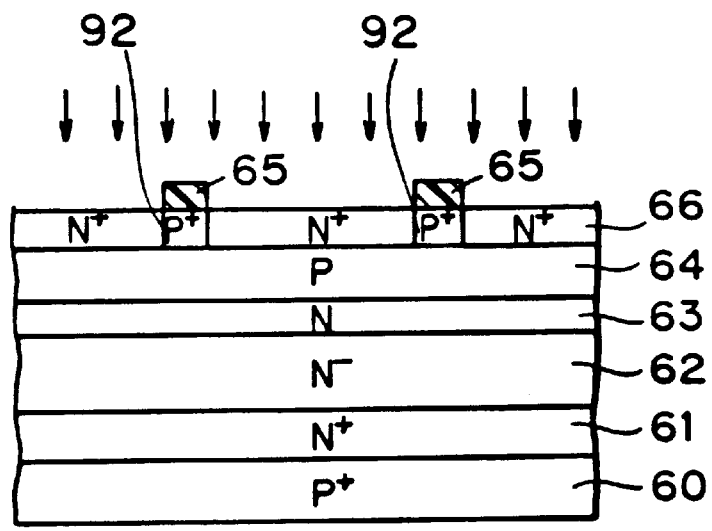
FIG. 37 is a manufacturing process diagram of the device of FIG. 32.

FIG. 36 and FIG. 37 are process diagrams showing another example suitable for manufacturing the device of this preferred embodiment. In this example, first, the process shown in FIG. 5 is performed. Then, as shown in FIG. 36, the resist pattern 83 selectively opening like belts arranged in parallel is formed on the surface of the P base layer 64. The resist pattern 83 is also formed in the same procedure as that for the resist pattern 65.

Next, using the resist pattern 83 as a mask, P-type impurities are selectively implanted into the surface of the P base layer 64 to form the P+ layers 92. Subsequently, after removing the resist pattern 83, annealing is applied to diffuse the implanted P-type impurities.

Next, as shown in FIG. 37, the resist pattern 65 is formed on the surface of the P base layer 64 to selectively cover the P+ layers 92. Then, using the resist pattern 65 as a mask, N-type impurities are selectively implanted into the surface of the P base layer 64 to form the N+ emitter regions 66. Then, after removing the resist pattern 65, annealing is applied to diffuse the implanted N-type impurities. Subsequently, the precesses in FIG. 7 to FIG. 12 are performed to obtain the device shown in FIG. 32 and FIG. 33.

Figure 38:
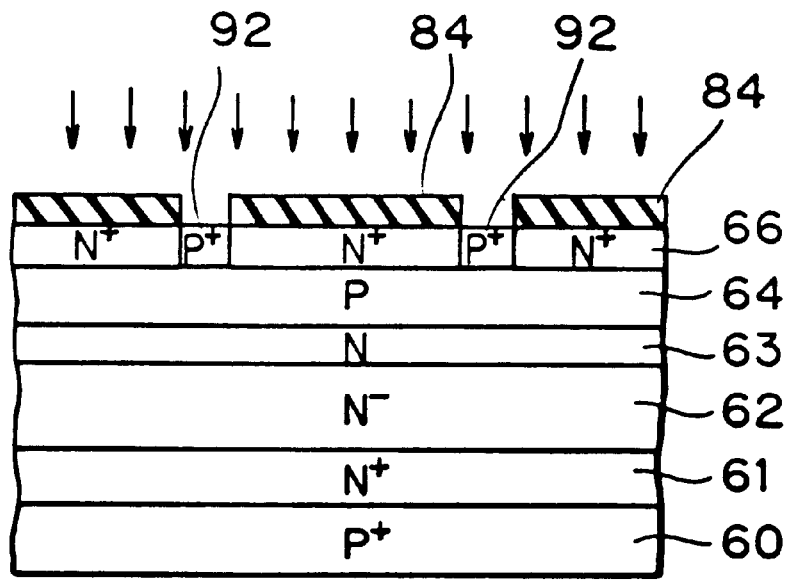
FIG. 38 is a manufacturing process diagram of the device of FIG. 32.

FIG. 38 is a process diagram showing still another example of the method of manufacturing the device of this preferred embodiment. In this example of the manufacturing method, first, the processes shown in FIG. 5 and FIG. 6 are performed. Then, as shown in FIG. 38, a resist pattern 84 selectively covering the N+ emitter regions 66 exposed except in the zonal regions arranged in parallel is formed on the surface of the P base layer 64. The resist pattern 84 selectively opens in the region except the exposed surface of the N+ emitter regions 66, in the zonal exposed surfaces of the P base layer 64 arranged in parallel. The formation of the resist pattern 84 is achieved by the same procedure as that for the resist pattern 65.

Next, using the resist pattern 84 as a mask, P-type impurities are selectively implanted into the exposed surfaces of the P base layer 64 to form the P+ layers 92. Then, after removing the resist pattern 84, annealing is applied to diffuse the implanted P-type impurities. Subsequently, the processes in FIG. 7 to FIG. 12 are performed to obtain the device shown in FIG. 32 and FIG. 33.

Figure 39:
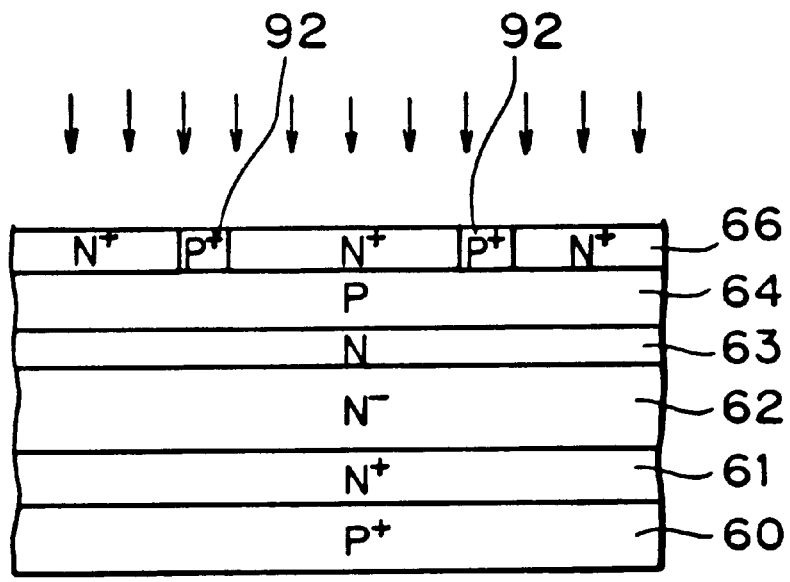
FIG. 39 is a manufacturing process diagram of the device of FIG. 32.

FIG. 39 is a process diagram showing still another example of a manufacturing method of the device of this preferred embodiment. In this example, first, the processes shown in FIG. 5 and FIG. 6 are performed. Next, as shown in FIG. 39, P-type impurities are implanted into the entire upper surface of the semiconductor substrate to form the P+ layers 92 in the exposed surface portion of the P base layer 64. Then, annealing is applied to diffuse the implanted P-type impurities. Next, the processes of FIG. 7 to FIG. 12 are performed to obtain the device shown in FIG. 32 and FIG. 33.

The manufacturing method including the process of FIG. 39 is effective when the concentration of P-type impurities in the P+ layer 92 to be formed is sufficiently lower than the concentration of N-type impurities in the N+ emitter region 66.

The process of implanting P-type impurities to form the P+ layer 92 can be properly performed in the series of processes shown in FIG. 5 to FIG. 12 not only in the above-described four manufacturing method examples.

Furthermore, although the P+ layers 92 are formed like belts in the four manufacturing method examples above, it is also generally possible to form the P+ layers 92 in the exposed surfaces of the P base layer 64 having arbitrary configuration by setting the configuration of openings of the resist pattern for forming the P+ layers 92 in correspondence with the configuration of the exposed surfaces of the P base layer 64.

The annealing process for diffusing the implanted impurities is not necessarily performed immediately after the implantation process such as the process of FIG. 36 or FIG. 37. That is to say, it may be properly performed in a later process suitable for annealing. Annealing for a plurality of semiconductor layers may be simultaneously achieved in one annealing process. This is the same also in the methods of manufacturing devices of other preferred embodiments.

<Ninth Preferred Embodiment>

Figure 40:
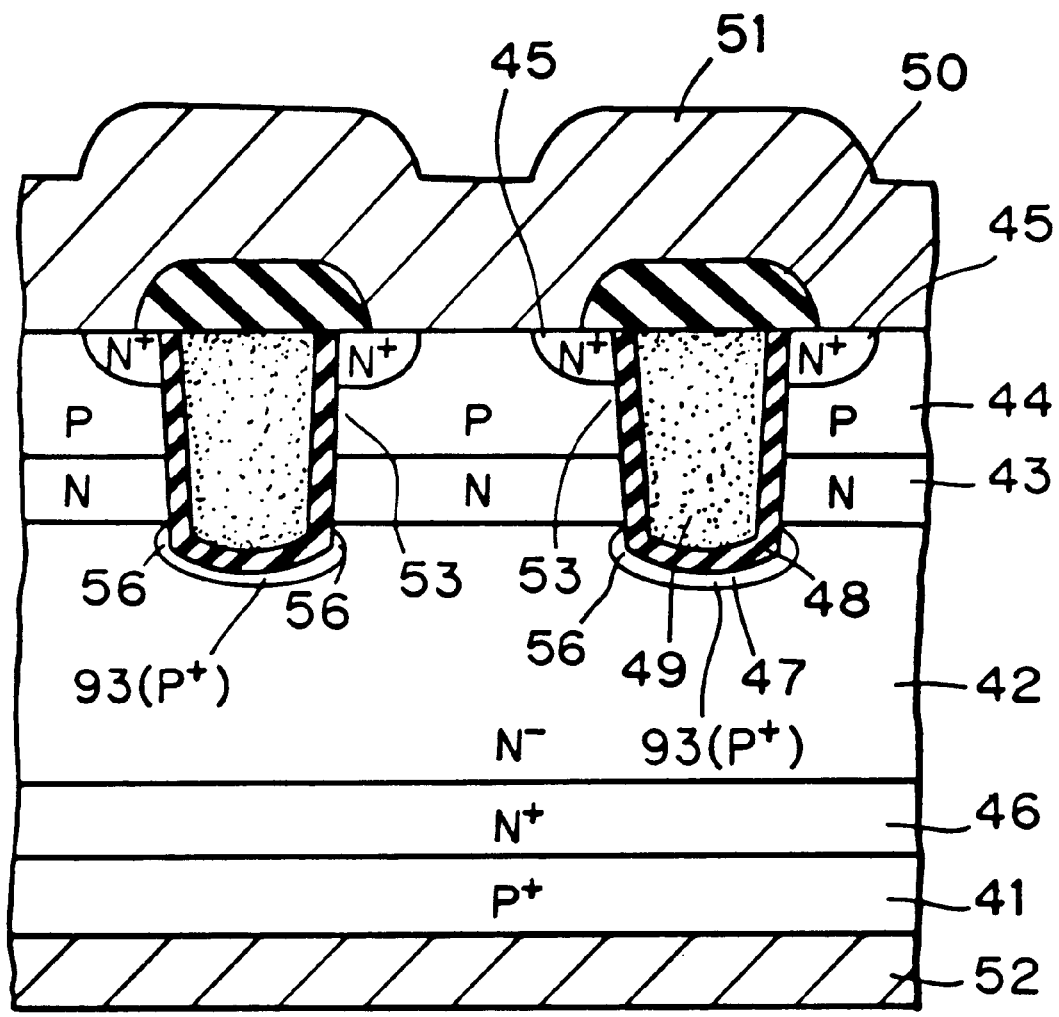
FIG. 40 is a fragmentary sectional view of an insulated gate semiconductor device of a ninth preferred embodiment.

FIG. 40 is a sectional view of a U-type IGBT of still another preferred embodiment. The structure of the top main surface of the semiconductor substrate forming this device is represented in the plan of FIG. 2. FIG. 40 corresponds to the sectional view along the section A—A in FIG. 2.

As shown in FIG. 40, this device is characteristically different from the device of the first preferred embodiment in that P+ layers 93 are formed on the bottom of the trenches 47. The concentration of P-type impurities in the P+ layer 93 is set to or higher than the concentration of N-type impurities in the N− layer 42 ($\approx 10^{13}$–$10^{14}$cm$^{-3}$), and it is preferably set to or higher than about $10^{16}$cm$^{-3}$. It is also preferred that it is set to or lower than the concentration of N-type impurities in the N+ emitter region 45 ($\approx 10^{19}$–$10^{20}$cm$^{-3}$).

Figure 41:
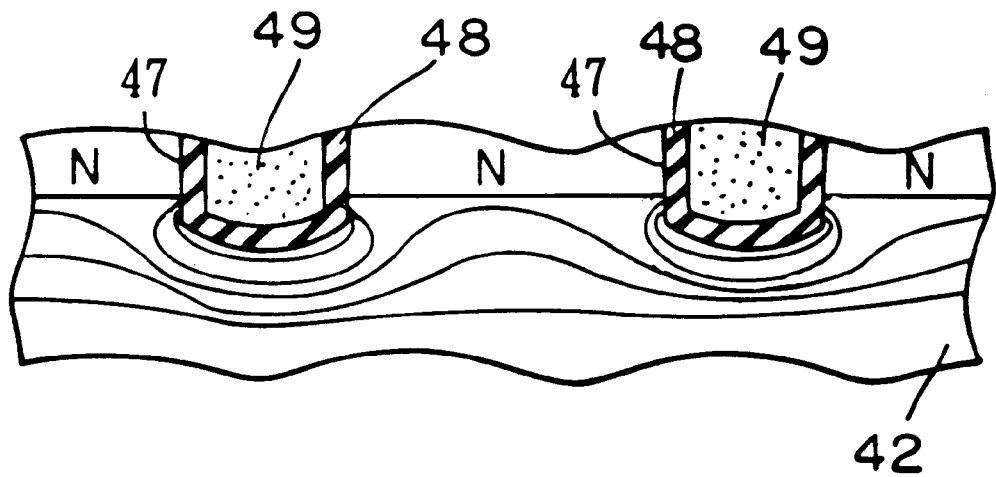
FIG. 41 is a schematic diagram for describing operation of a device to be compared with the device of FIG. 40.
Figure 42:
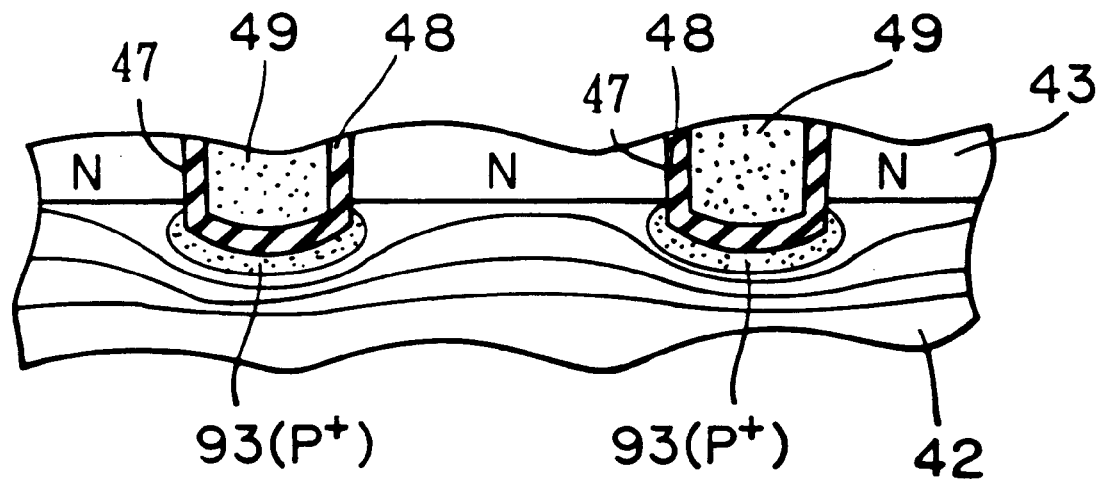
FIG. 42 is a schematic diagram for describing operation of the device of FIG. 40.

FIG. 41 and FIG. 42 are schematic diagrams for describing the effects of the P+ layer 93. FIG. 41 and FIG. 42 respectively show with equipotential surfaces the electric field distribution in the N− layer 42 with no P+ layer 93 provided and with the P+ layer 93 provided. As shown in FIG. 41, when there is no P+ layer 93 provided, the electric field concentration occurs around the bottom where the trench 47 curves relatively largely. The magnitude of the concentration of electric field defines the breakdown voltage of the device.

In contrast, as shown in FIG. 42, the formation of the P+ layer 93 functioning as a kind of conductor at the bottom of the trench 47 softens the concentration of electric field in the bottom. Accordingly, the breakdown voltage is improved in the device of FIG. 40 having the P+ layers 93 as compared with the device of the first preferred embodiment. Although FIG. 40 shows an example in which the P+ layers 93 are provided in the device of the first preferred embodiment, the effect of improving the breakdown voltage is similarly obtained by providing the P+ layers 93 in the devices of other preferred embodiments, e.g., in the device of the second preferred embodiment.

Figure 43:
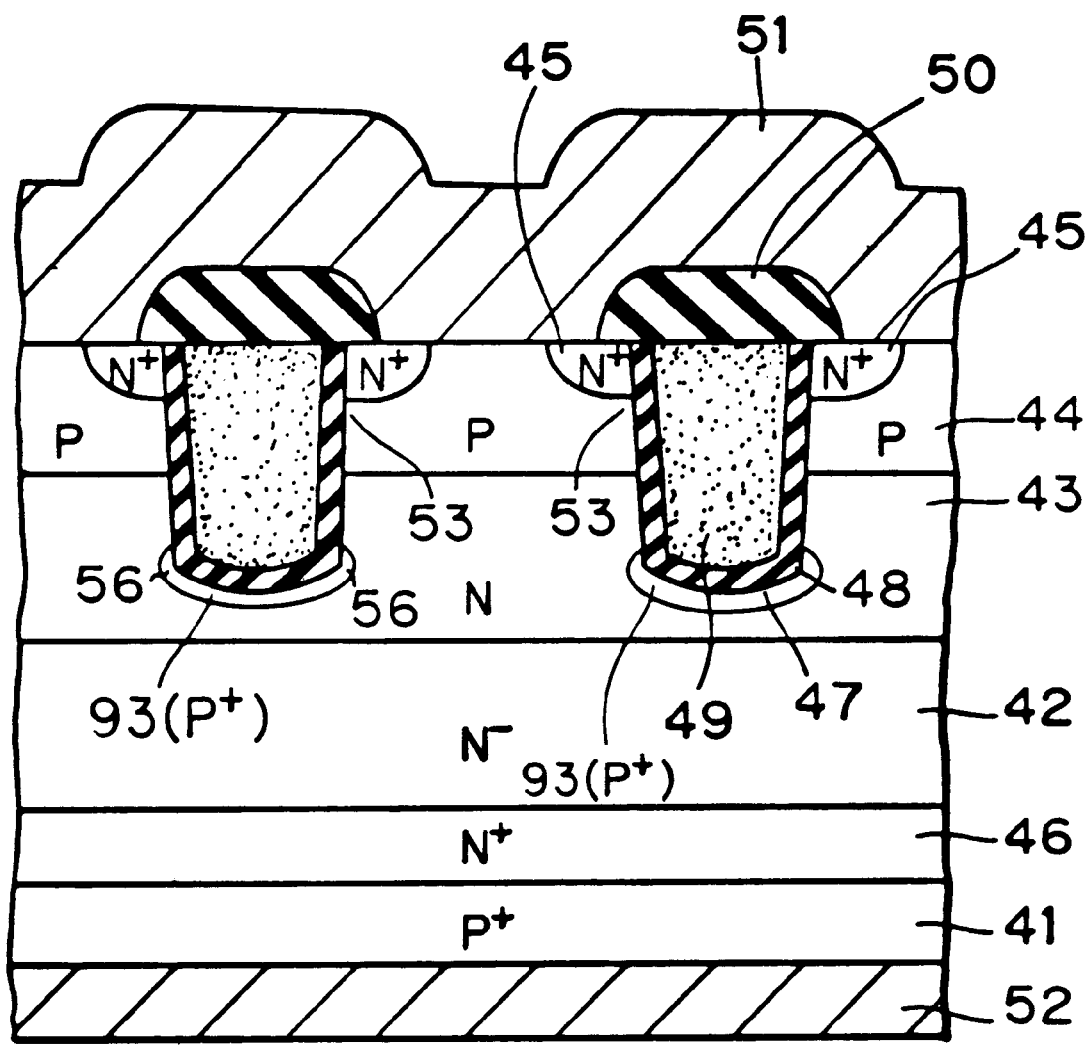
FIG. 43 is a fragmentary sectional view of a modified example of the device of FIG. 40.
Figure 44:
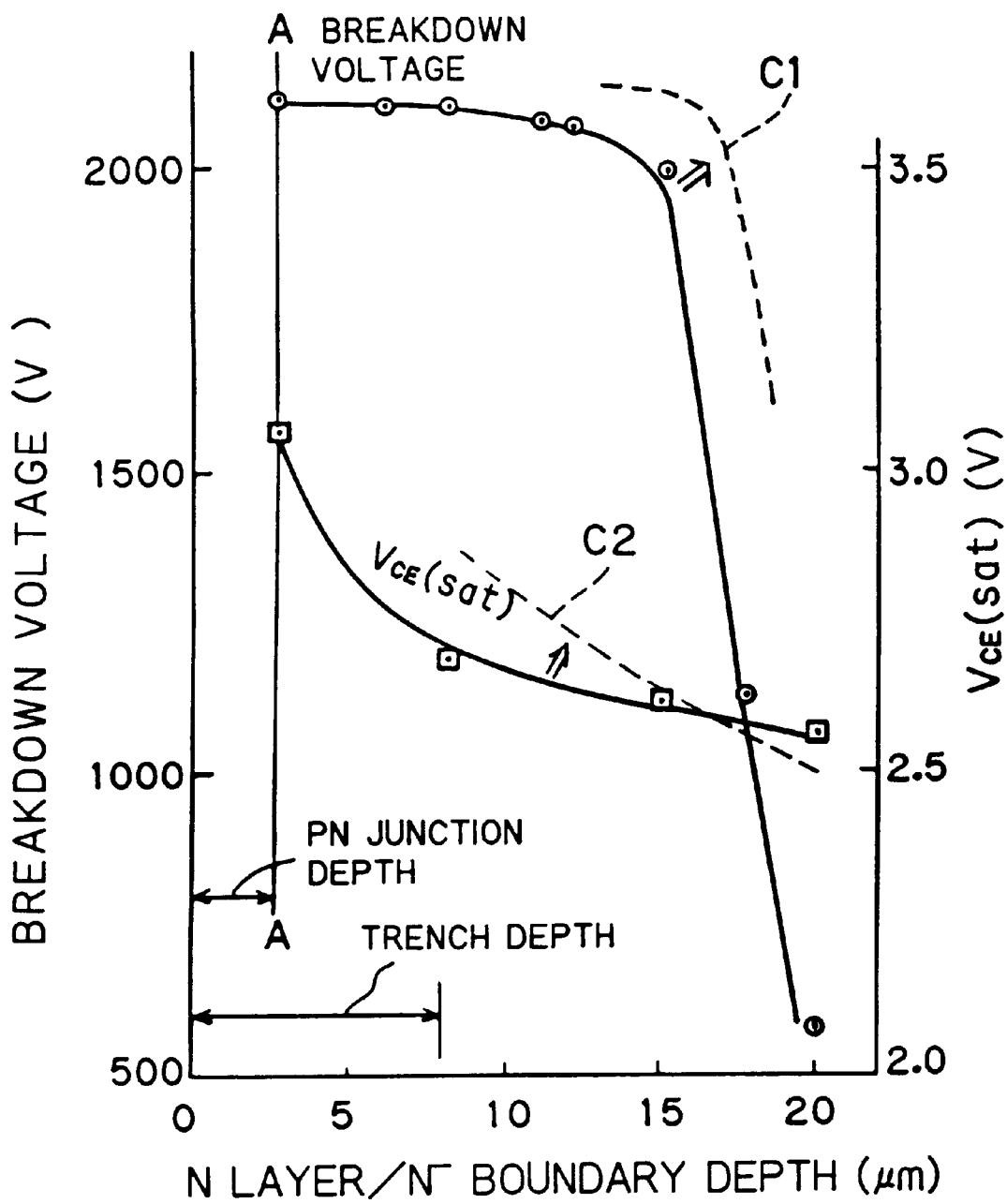
FIG. 44 is a graph schematically showing operation of the device of FIG. 43.

FIG. 43 is a sectional view showing an example in which the P+ layers 93 are provided in the device of the third preferred embodiment (FIG. 16.) Like the device of the third preferred embodiment, the boundary between the N layer 43 and the N⁻ layer 42 is formed in a position deeper than the bottom of the trench 47 in this device. The P+ layers 93 not only increase the breakdown voltage of the device, but also improves the relation between the depth of the boundary between the N layer 43 and the N⁻ layer 42 and the breakdown voltage. FIG. 44 is a graph showing this.

FIG. 44 is a graph showing the relation between the depth of the boundary between the N⁻ layer 42 and the N layer 43 and the breakdown voltage and the on-state voltage, in which the two curves C1 and C2 are added to the graph of FIG. 17. The curve C1 schematically shows the relation between the depth of the boundary between the N⁻ layer 42 and the N layer 43 and the breakdown voltage when the P+ layer 93 is provided in the device which is an object of the simulation of FIG. 17.

As shown by the curve C1, the formation of the P+ layer 93 not only enhances the breakdown voltage but also shifts the boundary depth at which the breakdown voltage starts deteriorating, i.e., the critical value of the boundary depth, to the higher value side. Accordingly, it is possible to make the N layer 43 still thicker without sacrificing the breakdown voltage, which further improves the on-state voltage $V_{CE(SAT)}$.

Furthermore, in a high breakdown voltage device with its breakdown voltage exceeding 2000 V, as schematically shown by the curve C2, the change of the $V_{CE(SAT)}$ with respect to the boundary depth becomes sharper. Hence, in the device with a high breakdown voltage, $V_{CE(SAT)}$ is considerably decreased by making the N layer 43 thicker. That is to say, the effect of improving the on-state voltage $V_{CE(SAT)}$ by providing the P+ layer 93 becomes more considerable as a device has a higher breakdown voltage.

Figure 7:
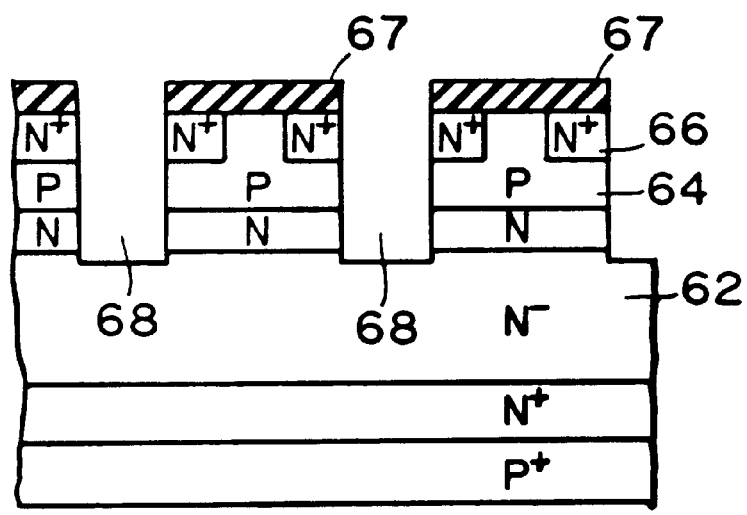
FIG. 7 is a manufacturing process diagram of the device of FIG. 1.
Figure 8:
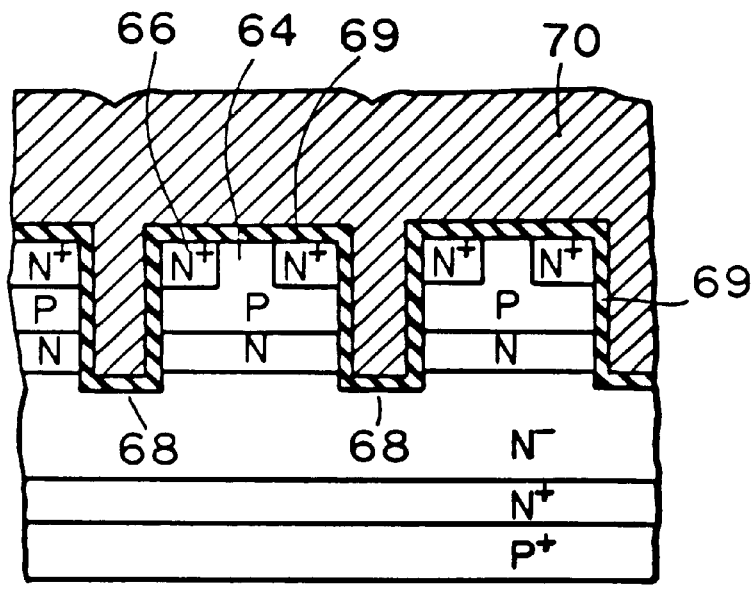
FIG. 8 is a manufacturing process diagram of the device of FIG. 1.
Figure 9:
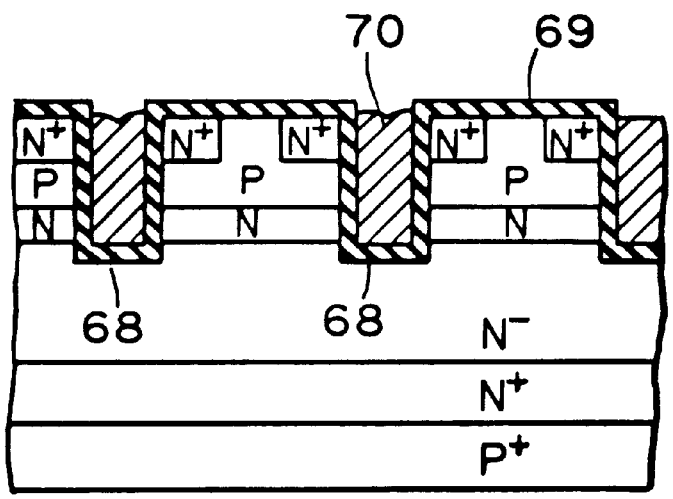
FIG. 9 is a manufacturing process diagram of the device of FIG. 1.
Figure 45:
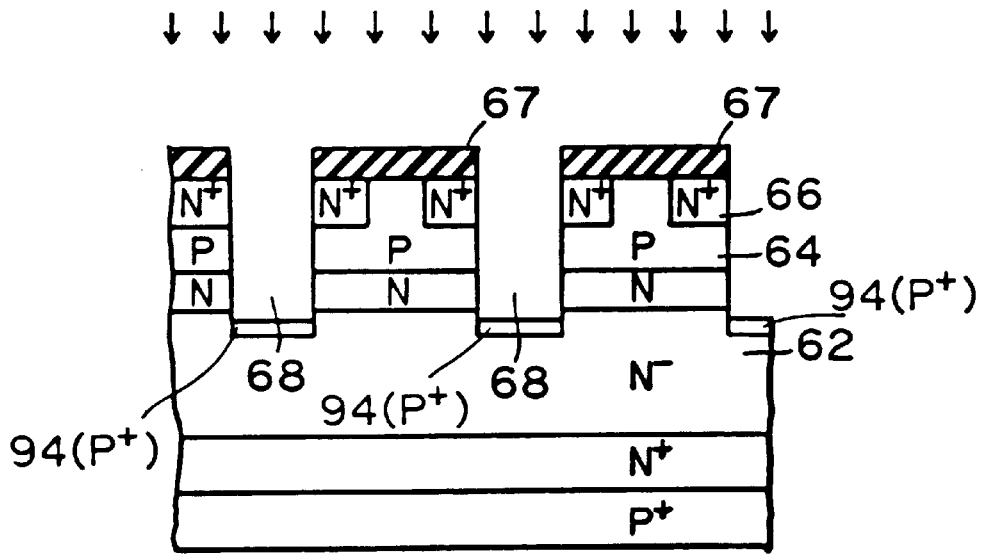
FIG. 45 is a manufacturing process diagram of the device of FIG. 40.

Next, a method of manufacturing the device of this preferred embodiment will be described. FIG. 45 is a process diagram showing an example of the method of manufacturing this device. In this example of the manufacturing method, first, the processes shown in FIG. 5 to FIG. 7 are performed.

Subsequently, as shown in FIG. 45, using the oxide film 67 as a mask, P-type impurities are selectively implanted into the trenches 68 to form the P+ layers 94 in the bottoms of the trenches 68. At this time, since the side walls of the oxide films 67 are not necessarily accurately vertical to the main surface of the semiconductor substrate, a P layer may be formed on the side walls, too.

Hence, a process of once forming a thermal oxide film similar to the oxide film 69 on the inner walls of the trenches 68 and removing the same is performed after the implantation of P-type impurities is finished. This process allows the P-type impurities to be locally applied in the thermal oxide film, which enables removal of the P layer on the side walls of the trenches 68. Annealing, which is performed for diffusion of the P+ layers 94, may be performed in combination with the process of forming the thermal oxide film.

Subsequently, the processes shown in FIG. 8 to FIG. 12 are performed to obtain the device shown in FIG. 40 or in FIG. 43, i.e., the device having the P+ layers 93 on he bottoms of the trenches 47.

Figure 46:
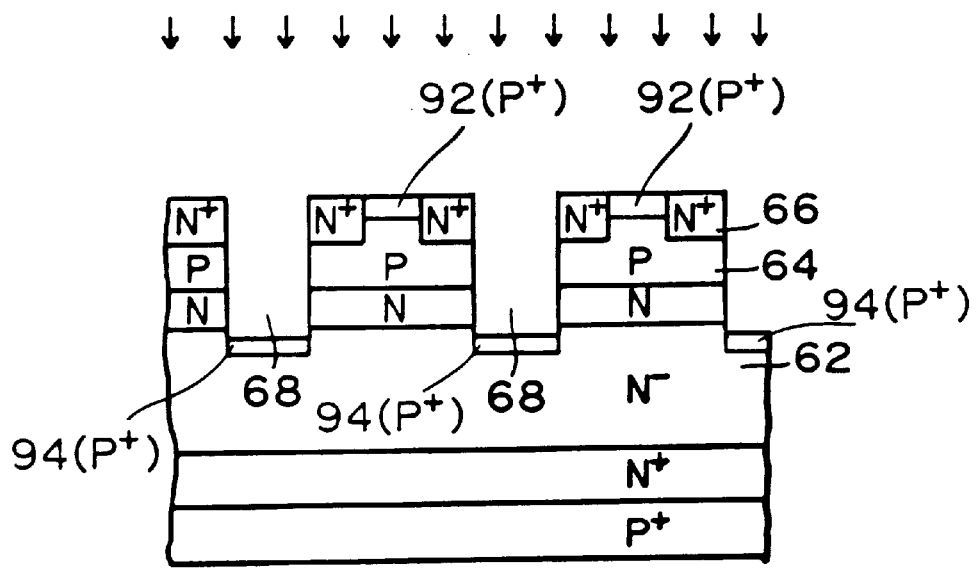
FIG. 46 is a manufacturing process diagram of the device of FIG. 40.
Figure 47:
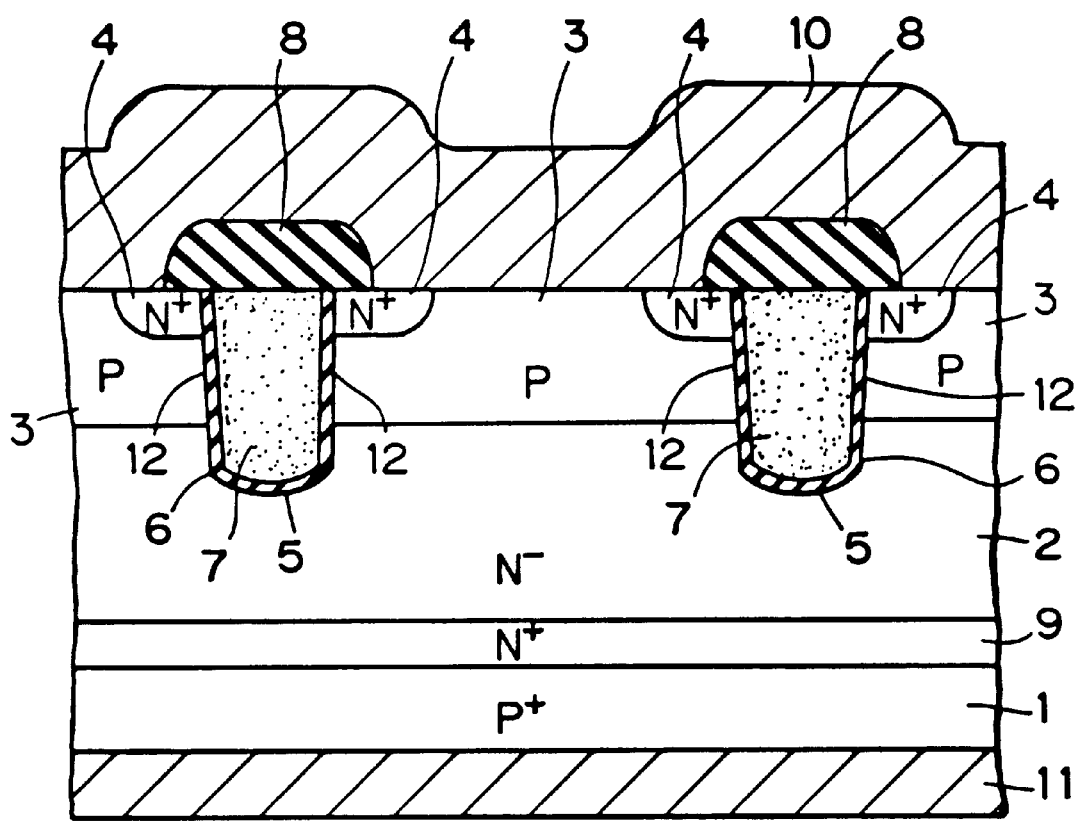
FIG. 47 is a fragmentary sectional view of a conventional IGBT.
Figure 48:
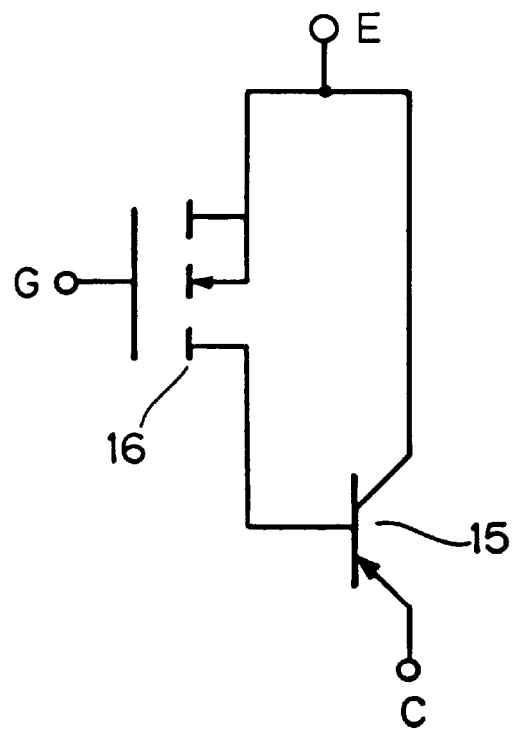
FIG. 48 is a circuit diagram showing an equivalent circuit of the IGBT.
Figure 49:
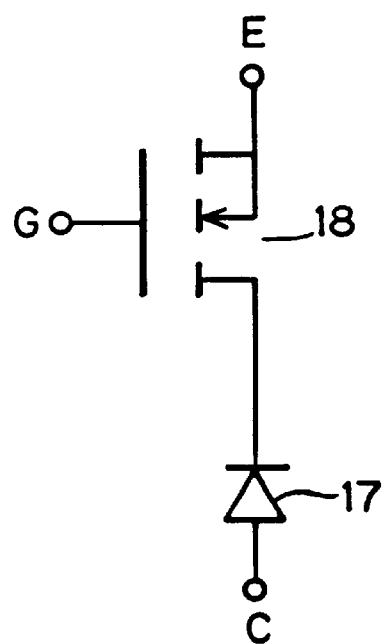
FIG. 49 is a circuit diagram showing an equivalent circuit of the IGBT.

Although the process of selectively introducing impurities into the trenches 68 using the oxide film 67 as a mask has been shown in FIG. 45, the process shown in the process diagram of FIG. 46 may be performed instead of this process if the concentration of P-type impurities in the P+ layers 94 to be formed is set sufficiently lower than the concentration of N-type impurities in the N+ emitter region 66. That is to say, without a mask, P-type impurities may be implanted not only into the trenches 68 but also into the upper surface of the P base layer 64 and the N+ emitter regions 66.

At this time, the P+ layers 94 are formed in the bottoms of the trenches 68 and the P+ layers 92 are also formed in the exposed surfaces of the P base layer 64. P-type impurities are implanted also into the N+ emitter regions 66, but effects upon the N⁻ emitter regions 66 is substantially avoided because the concentration of N-type impurities is sufficiently high. The completed device, in which the P+ layers 92 are formed in the exposed surfaces of the P base layer 64, provides the same effects as those of the device (FIG. 32 and FIG. 33) of the eighth preferred embodiment.

That is to say, by performing the process of FIG. 46, a device in which the P+ layers 94 are added to the device of the eighth preferred embodiment can be produced. Furthermore, since the process of forming the P+ layers 94 is performed at the same time with the process of forming the P+ layers 92, the production efficiency is good.

<Modified Example>

Although the preferred embodiments above have been described about U-type IGBTs of N channel as examples, it is a matter of course that the present invention is also applicable to U-type IGBTs of P channel.

While the invention has been described in detail, the foregoing description is in all aspects illustrative and not restrictive. It is understood that numerous other modifications and variations can be devised without departing from the scope of the invention.

I claim:

1. An insulated gate semiconductor device, comprising:
  a first semiconductor layer of a first conductivity type having first and second main surfaces
  a second semiconductor layer of a second conductivity type provided over the first main surface of said first semiconductor layer;
  a third semiconductor layer of the second conductivity type provided in close contact on a surface of said second semiconductor layer and having an impurity concentration higher than the impurity concentration of said second semiconductor layer;
  a fourth semiconductor layer of the first conductivity type provided in close contact on a surface of said third semiconductor layer;
  a fifth semiconductor layer of the second conductivity type selectively provided in a surface of said fourth semiconductor layer;
  a trench having an opening in a surface of said fifth semiconductor layer and having a depth extending through at least said fourth semiconductor layer from the surface of said fifth semiconductor layer;
  an insulating film provided on an inner entire wall of said trench;

a control electrode provided in said trench to face said fourth semiconductor layer through said insulating film;

a first main electrode provided on the surface of said fourth and fifth semiconductor layers; and a second main electrode provided on the second main surface of said first semiconductor layer, wherein said second semiconductor layer is thicker than said third semiconductor layer.

2. The insulated gate semiconductor device according to claim 1, wherein said trench has a depth extending also through said third semiconductor layer to reach said second semiconductor layer.

3. The insulated gate semiconductor device according to claim 1, wherein said trench has a depth limited in said third semiconductor layer.

4. The insulated gate semiconductor device according to claim 1, wherein said second semiconductor layer extends through said first semiconductor layer to be partially exposed in the second main surface of said first semiconductor layer.

5. The insulated gate semiconductor device according to claim 1, wherein a sixth semiconductor layer of the second conductivity type with an impurity concentration higher than the impurity concentration of said second semiconductor layer is provided between said first semiconductor layer and said second semiconductor layer.

6. The insulated gate semiconductor device according to claim 5, wherein said sixth semiconductor layer extends through said first semiconductor layer to be partially exposed in the second main surface of said first semiconductor layer.

7. The insulated gate semiconductor device according to claim 1, wherein said trench is divided into a plurality of unit trenches arranged side by side, and an exposed surface of said fourth semiconductor layer is interposed between adjacent ones of said unit trenches.

8. The insulated gate semiconductor device according to claim 7, wherein the exposed surface of said fourth semiconductor layer is divided into a plurality of unit exposed surfaces by a part of said fifth semiconductor layer, the plurality of unit exposed surfaces being alternated with said part of said fifth semiconductor layer along said trench.

9. The insulated gate semiconductor device according to claim 8, wherein said first main electrode is connected to said fifth semiconductor layer only in said part.

10. The insulated gate semiconductor device according to claim 7, wherein said fifth semiconductor layer is provided in the form of a plurality of belts parallel to each other in the surface of said fourth semiconductor layer, and said plurality of unit trenches are provided along a direction intersecting said plurality of belts.

11. The insulated gate semiconductor device according to claim 1, wherein said fourth semiconductor layer has a seventh semiconductor layer of the first conductivity type at least in an exposed surface portion of said fourth semiconductor layer, and an impurity concentration in said seventh semiconductor layer is higher than the impurity concentration in the portion in said fourth semiconductor layer outside of said seventh semiconductor layer.

12. The insulated gate semiconductor device according to claim 1, further comprising an eighth semiconductor layer of the first conductivity type formed to surround a bottom of said trench and having an impurity concentration higher than that in said second semiconductor layer.

13. An insulated gate semiconductor device, comprising:

a first semiconductor layer of a first conductivity type having first and second main surfaces;

a second semiconductor layer of a second conductivity type provided over the first main surface of said first semiconductor layer;

a third semiconductor layer of the second conductivity type provided in close contact on a surface of said second semiconductor layer and having an impurity concentration higher than the impurity concentration of said second semiconductor layer;

a fourth semiconductor layer of the first conductivity type provided in close contact on a surface of said third semiconductor layer;

a fifth semiconductor layer of the second conductivity type selectively provided in a surface of said fourth semiconductor layer;

a trench having an opening in a surface of said fifth semiconductor layer and having a trench depth extending through said fourth semiconductor layer and into said third semiconductor layer from the surface of said fifth semiconductor layer;

an insulating film provided on an inner wall of said trench;

a control electrode provided in said trench to face said fourth semiconductor layer through said insulating film;

a first main electrode provided on the surface of said fourth and fifth semiconductor layers;

a second main electrode provided on the second main surface of said first semiconductor layer; and wherein a depth of a boundary between said third semiconductor layer and said second semiconductor layer does not exceed a critical value at which a rapid decrease appears in a breakdown voltage of said insulated gate semiconductor device with an increase in said boundary depth.

14. An insulated gate semiconductor device, comprising:

a first semiconductor layer of a first conductivity type having first and second main surfaces;

a second semiconductor layer of a second conductivity type provided over the first main surface of said first semiconductor layer;

a third semiconductor layer of the second conductivity type provided in close contact on a surface of said second semiconductor layer and having an impurity concentration higher than the impurity concentration of said second semiconductor layer;

a fourth semiconductor layer of the first conductivity type provided in close contact on a surface of said third semiconductor layer;

a fifth semiconductor layer of the second conductivity type selectively provided in a surface of said fourth semiconductor layer;

a trench having an opening in a surface of said fifth semiconductor layer and having a trench depth extending through said fourth semiconductor layer into said third semiconductor layer from the surface of said fifth semiconductor layer;

an insulating film provided on an inner wall of said trench;

a control electrode provided in said trench to face said fourth semiconductor layer through said insulating film;

a first main electrode provided on the surface of said fourth and fifth semiconductor layers;

a second main electrode provided on the second main surface of said first semiconductor layer;

an eighth semiconductor layer of the first conductivity type formed to surround a bottom of said trench and having an impurity concentration higher than that in said second semiconductor layer; and wherein said eighth semiconductor layer is surrounded by said third semiconductor layer.

15. The insulated gate semiconductor device according to claim 14, wherein a depth of a boundary between said third semiconductor layer and said second semiconductor layer does not exceed a critical value at which a rapid decrease appears in a breakdown voltage of said insulated gate semiconductor device with an increase in said boundary depth.

* * * * *

UNITED STATES PATENT AND TRADEMARK OFFICE
CERTIFICATE OF CORRECTION

PATENT NO. : 6,040,599

DATED : March 21, 2000

INVENTOR(S): Hideki TAKAHASHI

It is certified that an error appears in the above-identified patent and that said Letters Patent is hereby corrected as shown below:

On the title page, item [54] and the top of Column 1, the Title is incorrectly listed. It should be:

--[54] INSULATED TRENCH GATE SEMICONDUCTOR DEVICE WITH PARTICULAR LAYER STRUCTURE--

Signed and Sealed this

Third Day of April, 2001

Attest:

NICHOLAS P. GODICI

Attesting Officer

Acting Director of the United States Patent and Trademark Office